(12) United States Patent
Oh et al.

(10) Patent No.: US 12,288,590 B2
(45) Date of Patent: Apr. 29, 2025

(54) STORAGE DEVICES AND METHODS OF OPERATING STORAGE DEVICES

(71) Applicant: SAMSUNG ELECTRONICS CO., LTD., Suwon-si (KR)

(72) Inventors: Eun Chu Oh, Hwaseong-si (KR); Junyeong Seok, Seoul (KR); Younggul Song, Hwaseong-si (KR); Wijik Lee, Suwon-si (KR); Byungchul Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 48 days.

(21) Appl. No.: 17/750,581

(22) Filed: May 23, 2022

(65) Prior Publication Data

US 2023/0112694 A1 Apr. 13, 2023

(30) Foreign Application Priority Data

Oct. 7, 2021 (KR) .................. 10-2021-0132925
Dec. 9, 2021 (KR) .................. 10-2021-0175369

(51) Int. Cl.
*G11C 29/42* (2006.01)
*G11C 7/10* (2006.01)
(Continued)

(52) U.S. Cl.
CPC ............ *G11C 29/42* (2013.01); *G11C 7/1039* (2013.01); *G11C 7/1069* (2013.01);
(Continued)

(58) Field of Classification Search
CPC ......... H03M 13/2945; H03M 13/2906; H03M 13/05; G06F 3/0679; G06F 12/0246;
(Continued)

(56) References Cited

U.S. PATENT DOCUMENTS 8,281,217 B2  10/2012  Kim et al.
8,607,120 B2  12/2013  Song et al.
(Continued)

OTHER PUBLICATIONS

Communication dated Jan. 5, 2023 issued by the European Patent Office in application No. 22176450.9.

*Primary Examiner* — Mark D Featherstone
*Assistant Examiner* — Sazzad Hossain
(74) *Attorney, Agent, or Firm* — Sughrue Mion, PLLC

(57) ABSTRACT

A storage device includes a nonvolatile memory device including a memory cell array and a storage controller to control the nonvolatile memory device. The memory cell array includes word-lines, memory cells and word-line cut regions dividing the word-lines into memory blocks. The storage controller includes an error correction code (ECC) engine including an ECC encoder and a memory interface. The ECC encoder performs a first ECC encoding operation on each of sub data units in user data to generate parity bits and generate a plurality of ECC sectors, selects outer cell bits to be stored in outer cells to constitute an outer ECC sector including the outer cell bits and performs a second ECC encoding operation on the outer ECC sector to generate outer parity bits. The memory interface transmits, to the nonvolatile memory device, a codeword set including the ECC sectors and the outer parity bits.

19 Claims, 41 Drawing Sheets

(51) Int. Cl.
*G11C 29/44* (2006.01)
*G06F 3/06* (2006.01)
*G06F 11/10* (2006.01)
*G06F 12/02* (2006.01)
*G11C 29/12* (2006.01)
*G11C 29/52* (2006.01)
*H03M 13/05* (2006.01)
*H03M 13/29* (2006.01)

(52) U.S. Cl.
CPC ........ *G11C 7/1096* (2013.01); *G11C 29/4401* (2013.01); *G06F 3/0679* (2013.01); *G06F 11/1044* (2013.01); *G06F 12/0246* (2013.01); *G11C 2029/1202* (2013.01); *G11C 29/52* (2013.01); *H03M 13/05* (2013.01); *H03M 13/2906* (2013.01); *H03M 13/2945* (2013.01)

(58) Field of Classification Search
CPC ..... G06F 11/1044; G11C 29/52; G11C 29/42; G11C 7/1039; G11C 2029/1202
See application file for complete search history.

(56) References Cited

U.S. PATENT DOCUMENTS

| | | | |
|---|---|---|---|
| 9,009,574 | B2 | 4/2015 | Chilappagari et al. |
| 9,559,725 | B1* | 1/2017 | Shao ................. H03M 13/2936 |
| 9,984,768 | B2 | 5/2018 | Hyun et al. |
| 10,467,091 | B2 | 11/2019 | Park et al. |
| 10,684,914 | B2 | 6/2020 | Im et al. |
| 10,860,416 | B2 | 12/2020 | Kaynak et al. |
| 10,997,017 | B2 | 5/2021 | Cai et al. |
| 11,107,537 | B2 | 8/2021 | Jeon et al. |
| 11,126,497 | B2 | 9/2021 | Oh et al. |
| 2017/0075757 | A1* | 3/2017 | Im ...................... G06F 11/1068 |
| 2017/0249209 | A1* | 8/2017 | Yang ..................... G06F 3/0679 |
| 2018/0308555 | A1* | 10/2018 | Zhang ..................... G11C 16/26 |
| 2019/0377632 | A1 | 12/2019 | Oh et al. |
| 2021/0249098 | A1* | 8/2021 | Takubo .................. G11C 29/24 |

* cited by examiner

|     | E | P1 | P2 | P3 | P4 | P5 | P6 | P7 | P8 | P9 | P10 | P11 | P12 | P13 | P14 | P15 |
|-----|---|----|----|----|----|----|----|----|----|----|-----|-----|-----|-----|-----|-----|
| LSB | 1 | 0  | 0  | 0  | 1  | 1  | 0  | 0  | 0  | 0  | 0   | 1   | 1   | 1   | 1   | 1   |
| ESB | 1 | 1  | 1  | 0  | 0  | 0  | 0  | 1  | 1  | 0  | 0   | 0   | 0   | 1   | 1   | 1   |
| USB | 1 | 1  | 1  | 1  | 1  | 0  | 0  | 0  | 0  | 0  | 1   | 1   | 0   | 0   | 0   | 1   |
| MSB | 1 | 1  | 0  | 0  | 0  | 0  | 0  | 0  | 1  | 1  | 1   | 1   | 1   | 1   | 0   | 0   |

STORAGE DEVICES AND METHODS OF OPERATING STORAGE DEVICES

CROSS-REFERENCE TO RELATED APPLICATIONS

This US non-provisional application claims priority under 35 USC § 119 from Korean Patent Application No. 10-2021-0132925, filed on Oct. 7, 2021 and to Korean Patent Application No. 10-2021-0175369, filed on Dec. 9, 2021 in the Korean Intellectual Property Office, the disclosures of each of which are incorporated by reference herein in their entireties.

BACKGROUND

Example embodiments generally relate to semiconductor integrated circuits, and more particularly to storage devices and methods of operating storage devices.

Semiconductor memory devices are classified into a volatile memory and a nonvolatile memory.

The volatile memory may lose contents stored therein at power-off. The nonvolatile memory may retain stored contents even at power-off. A flash memory, one of the nonvolatile memory devices, may have following advantages: mass storage capability, relatively high noise immunity, and low power operation. Therefore, the flash memory devices are employed in various fields. For example, a mobile system such as a smart-phone, or a tablet PC employs the flash memory as storage medium.

As a fabrication process of a flash memory device is scaled-down and memory cells of the flash memory device are stacked, the memory cells are degraded and data retention characteristics of the memory cells are degraded.

SUMMARY

It is an aspect to provide a storage device capable of enhancing error correction capability.

It is another aspect to provide a method of operating a storage device, capable of enhancing error correction capability.

According to an aspect of one or more example embodiments, a storage device includes a nonvolatile memory device including a memory cell array and a storage controller to control the nonvolatile memory device. The memory cell array includes a plurality of word-lines stacked on a substrate, a plurality of memory cells provided in a plurality of channel holes extending in a vertical direction with respect to the substrate and word-line cut regions extending in a first horizontal direction and dividing the plurality of word-lines into a plurality of memory blocks. The storage controller includes an error correction code (ECC) engine including an ECC encoder and a memory interface. The ECC encoder, in a write operation on target memory cells in a target page coupled to a target word-line from among the plurality of word-lines, performs a first ECC encoding operation on each of a plurality of sub data units in a user data to generate parity bits associated with each of the plurality of sub data units and generates a plurality of ECC sectors based on the plurality of sub data units and the parity bits, selects outer cell bits to be stored in outer cells from among the target memory cells, from among the plurality of ECC sectors, based on an error correction mode signal to constitute an outer ECC sector including the outer cell bits and performs a second ECC encoding operation on the outer ECC sector to generate outer parity bits. The memory interface transmits, to the nonvolatile memory device, a codeword set including the plurality of ECC sectors and the outer parity bits.

According to another aspect of one or more example embodiments, a storage device includes a nonvolatile memory device including a memory cell array and a storage controller to control the nonvolatile memory device. The memory cell array includes a plurality of word-lines stacked on a substrate, a plurality of memory cells provided in a plurality of channel holes extending in a vertical direction with respect to the substrate and word-line cut regions extending in a first horizontal direction and dividing the plurality of word-lines into a plurality of memory blocks. The storage controller includes an error correction code (ECC) engine including an ECC encoder and a memory interface. The ECC encoder, in a write operation on target memory cells in a target page coupled to a target word-line from among the plurality of word-lines, selects outer cell bits to be stored in outer cells from among a plurality of sub data units in a user data, based on a location index and an error correction mode signal to constitute an outer ECC sector including the outer cell bits, performs a first ECC encoding operation on the outer ECC sector to generate outer parity bits, and performs a second ECC encoding operation on each of the plurality of sub data units to generate parity bits associated with each of the plurality of sub data units and generates a plurality of ECC sectors based on the plurality of sub data units and the parity bits. The memory interface transmits, to the nonvolatile memory device, a codeword set including the plurality of ECC sectors and the outer ECC parity bits. The storage controller groups the plurality of memory cells coupled to each of the plurality of word-lines into the outer cells and inner cells according to a distance from the word-line cut region based on the location index of each of the plurality of memory cells.

According to yet another aspect of one or more example embodiments, there is provided a method of operating a storage device which includes a memory cell array and a storage controller to control the nonvolatile memory device. The memory cell array includes a plurality of word-lines stacked on a substrate, a plurality of memory cells provided in a plurality of channel holes extending in a vertical direction with respect to the substrate and word-line cut regions extending in a first horizontal direction and dividing the plurality of word-lines into a plurality of memory blocks. According to the method, a first error correction code (ECC) encoding operation is performed, by an ECC encoder in the storage controller in a write operation on target memory cells in a target page coupled to a target word-line from among the plurality of word-lines, on each of a plurality of sub data units in a user data to generate a plurality of ECC sectors based on the plurality of sub data units and based on parity bits generated based on the first ECC decoding operation and associated with each of the plurality of sub data units, outer cell bits to be stored in outer cells from among the target memory cells are selected from among the plurality of ECC sectors to constitute an outer ECC sector including the outer cell bits, a second ECC encoding operation is performed by the ECC encoder on the outer ECC sector to generate outer parity bits and a codeword set including the plurality of ECC sectors and the outer parity bits is transmitted to the nonvolatile memory device.

According to yet another aspect of one or more example embodiments, a storage device includes a nonvolatile memory device including a memory cell array and a storage controller to control the nonvolatile memory device. The memory cell array includes a plurality of word-lines stacked on a substrate, a plurality of memory cells provided in a plurality of channel holes extending in a vertical direction with respect to the substrate and word-line cut regions extending in a first horizontal direction and dividing the plurality of word-lines into a plurality of memory blocks. The storage controller includes an error correction code (ECC) engine including an ECC encoder and a memory interface. The ECC encoder, in a write operation on target memory cells in a target page coupled to a target word-line from among the plurality of word-lines, performs a first ECC encoding operation on each of a plurality of sub data units in a user data to generate parity bits associated with each of the plurality of sub data units and generate a plurality of ECC sectors based on the plurality of sub data units and the parity bits, selects a portion of inner cell bits from inner cell bits to be stored in inner cells from among the target memory cells, from among the plurality of ECC sectors, based on an error correction mode signal to constitute an inner ECC sector including the portion of cell bits, and performs a second ECC encoding operation on the inner ECC sector to generate inner parity bits. The memory interface transmits, to the nonvolatile memory device, a codeword set including the plurality of ECC sectors and the inner parity bits.

According to yet another aspect of one or more example embodiments, there is provided a method of operating a storage device which includes a memory cell array and a storage controller to control the nonvolatile memory device. The memory cell array includes a plurality of word-lines stacked on a substrate, a plurality of memory cells provided in a plurality of channel holes extending in a vertical direction with respect to the substrate and word-line cut regions extending in a first horizontal direction and dividing the plurality of word-lines into a plurality of memory blocks. According to the method, a first error correction code (ECC) encoding operation is performed, by an ECC encoder in the storage controller in a write operation on target memory cells in a target page coupled to a target word-line from among the plurality of word-lines, on each of a plurality of sub data units in a user data to generate a plurality of ECC sectors based on the plurality of sub data units and based on parity bits generated based on the first ECC decoding operation and associated with each of the plurality of sub data units, a portion of inner cell bits from inner cell bits to be stored in inner cells from among the target memory cells are selected from among the plurality of ECC sectors to constitute an inner ECC sector including the portion of cell bits, a second ECC encoding operation on the inner ECC sector is performed by the ECC encoder to generate inner parity bits and a codeword set including the plurality of ECC sectors and the inner parity bits is transmitted to the nonvolatile memory device.

BRIEF DESCRIPTION OF THE DRAWINGS

Illustrative, non-limiting example embodiments will be more clearly understood from the following detailed description in conjunction with the accompanying drawings, in which.

DETAILED DESCRIPTION

In a storage device and a method of operating the storage device according to various example embodiments, a storage controller groups memory cells in a target page into outer cells and inner cells based on a relative distance from a word-line cut region, and an error correction code (ECC) engine, in a first error correction mode, performs a first ECC encoding operation and a first ECC decoding operation on each of a plurality of sub data units in a user data, generates an outer ECC sector including outer cell bits to be stored in (or read from) the outer cells whose error occurrence probability is relatively high and performs a second ECC encoding operation and a second ECC decoding operation on the outer ECC sector to correct an error by the second ECC decoding operation, which is not correctable by the first ECC decoding operation. In addition, the ECC engine, in a second error correction mode, generates an inner ECC sector including inner cell bits to be stored in (or read from) the inner cells whose error occurrence probability is relatively small and performs a first ECC decoding operation in the inner ECC sector and performs a second ECC decoding operation on each of the plurality of sub data units to correct an error in each of the sub data units. Therefore, the ECC engine according to various example embodiments may enhance error correction capability. In addition, because the ECC engine uses the same ECC in the first ECC encoding operation and the second ECC encoding operation and uses the same ECC in the first ECC decoding operation and the second ECC decoding operation, the ECC engine may not increase occupied area.

Various example embodiments will be described more fully hereinafter with reference to the accompanying drawings, in which some example embodiments are shown.

Figure 1:
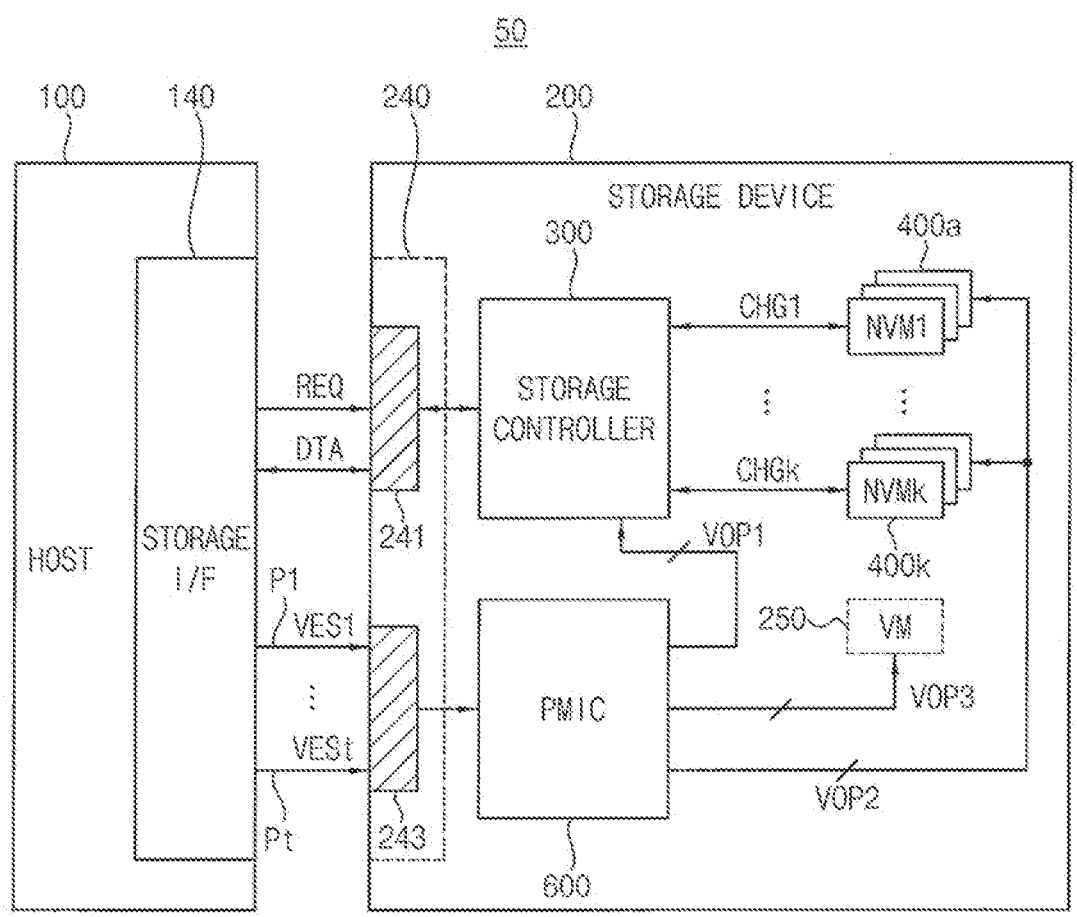
FIG. 1 is a block diagram illustrating a storage system according to example embodiments.

FIG. 1 is a block diagram illustrating a storage system according to example embodiments.

Referring to FIG. 1, a storage system 50 may include a host 100 and a storage device 200. The host 100 may include a storage interface (I/F) 140.

The storage device 200 may be any kind of storage devices capable of storing data.

The storage device 200 may include a storage controller 300, a plurality of nonvolatile memory devices 400a-400k (where k is an integer greater than two), a power management integrated circuit (PMIC) 600 and a host interface 240. The host interface 240 may include a signal connector 241 and a power connector 243. In some example embodiments, the storage device 200 may further include a volatile memory device 250. However, in other example embodiments, the volatile memory device 250 may be omitted.

The plurality of nonvolatile memory devices 400a-400k may be used as a storage medium of the storage device 200. In some example embodiments, each of the plurality of nonvolatile memory devices 400a-400k may include a flash memory or a vertical NAND memory device. The storage controller 300 may be coupled to the plurality of nonvolatile memory devices 400a-400k through a plurality of channels CHG1~CHGk, respectively.

The storage controller 300 may be configured to receive a request REQ from the host 100 and communicate data DTA with the host 100 through the signal connector 241. The storage controller 300 may write the data DTA to the plurality of nonvolatile memory devices 400a-400k or read the data DTA from plurality of nonvolatile memory devices 400a-400k based on the request REQ.

The storage controller 300 may communicate the data DTA with the host 100 using the volatile memory device 250 as an input/output buffer. In some example embodiments, the volatile memory device 250 may include a dynamic random access memory (DRAM).

The PMIC 600 may be configured to receive a plurality of power supply voltages (i.e., external supply voltages) VES1-VESt from the host 100 through the power connector 243. For example, the power connector 243 may include a plurality of power lines P1~Pt, and the PMIC 600 may be configured to receive the plurality of power supply voltages VES1~VESt from the host 100 through the plurality of power lines P~Pt, respectively, through the power connector 243. Here, t represents a positive integer greater than one.

The PMIC 600 may generate at least one first operating voltage VOP1 used by the storage controller 300, at least one second operating voltage VOP2 used by the plurality of nonvolatile memory devices 400a-400k, and at least one third operating voltage VOP3 used by the volatile memory device 250 based on the plurality of power supply voltages VES1~VESt.

For example, when the PMIC 600 receives all of the plurality of power supply voltages VES1~VESt from the host 100, the PMIC 600 may generate the at least one first operating voltage VOP1, the at least one second operating voltage VOP2, and the at least one third operating voltage VOP3 using all of the plurality of power supply voltages VES1~VESt. On the other hand, when the PMIC 600 receives less than all of the plurality of power supply voltages VES1~VESt from the host 100, the PMIC 600 may generate the at least one first operating voltage VOP1, the at least one second operating voltage VOP2, and the at least one third operating voltage VOP3 using all of the part of the plurality of power supply voltages VES1~VESt that is received from the host 100.

Figure 2:
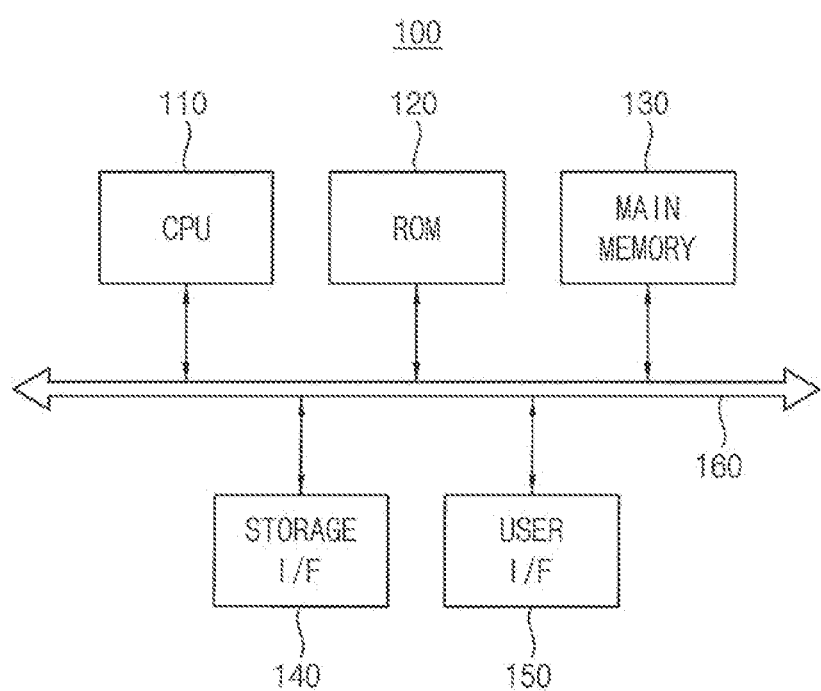
FIG. 2 is a block diagram illustrating a host of the storage system in FIG. 1 according to example embodiments.

FIG. 2 is a block diagram illustrating the host 100 in FIG. 1 according to example embodiments.

Referring to FIG. 2, the host 100 may include a central processing unit (CPU) 110, a read-only memory (ROM) 120, a main memory 130, a storage interface (I/F) 140, a user interface (I/F) 150 and a bus 160.

The bus 160 may refer to a transmission channel via which data is transmitted between the CPU 110, the ROM 120, the main memory 130, the storage interface 140 and the user interface 150 of the host 100. The ROM 120 may store various application programs. For example, application programs supporting storage protocols such as Advanced Technology Attachment (ATA), Small Computer System Interface (SCSI), embedded Multi Media Card (eMMC), and/or Universal flash storage (UFS) protocols may be stored in the ROM 120.

The main memory 130 may temporarily store data or programs. The user interface 150 may be a physical or virtual medium for exchanging information between a user and the host device 100, a computer program, etc., and may include physical hardware and logical software. For example, the user interface 150 may include an input device (e.g., a keyboard, mouse, touch screen, etc.) for allowing the user to manipulate the host 100, and an output device (e.g., a display, touch screen, etc.) for outputting a result of processing an input of the user.

The CPU 110 may control overall operations of the host 100. The CPU 110 may generate a command for storing data in the storage device 200, or a request (or a command) and the power supply voltages VES1~VESt for reading data from the storage device 200 by using an application stored in the ROM 120, and transmit the request to the storage device 200 via the storage interface 140. In some example embodiments, the application may be read from the ROM 120 and stored in the main memory 130 prior to executing the application to generate the command for storing data in the storage device 200, or the request (or the command) and the power supply voltages VES1~VESt for reading data from the storage device 200.

Figure 3:
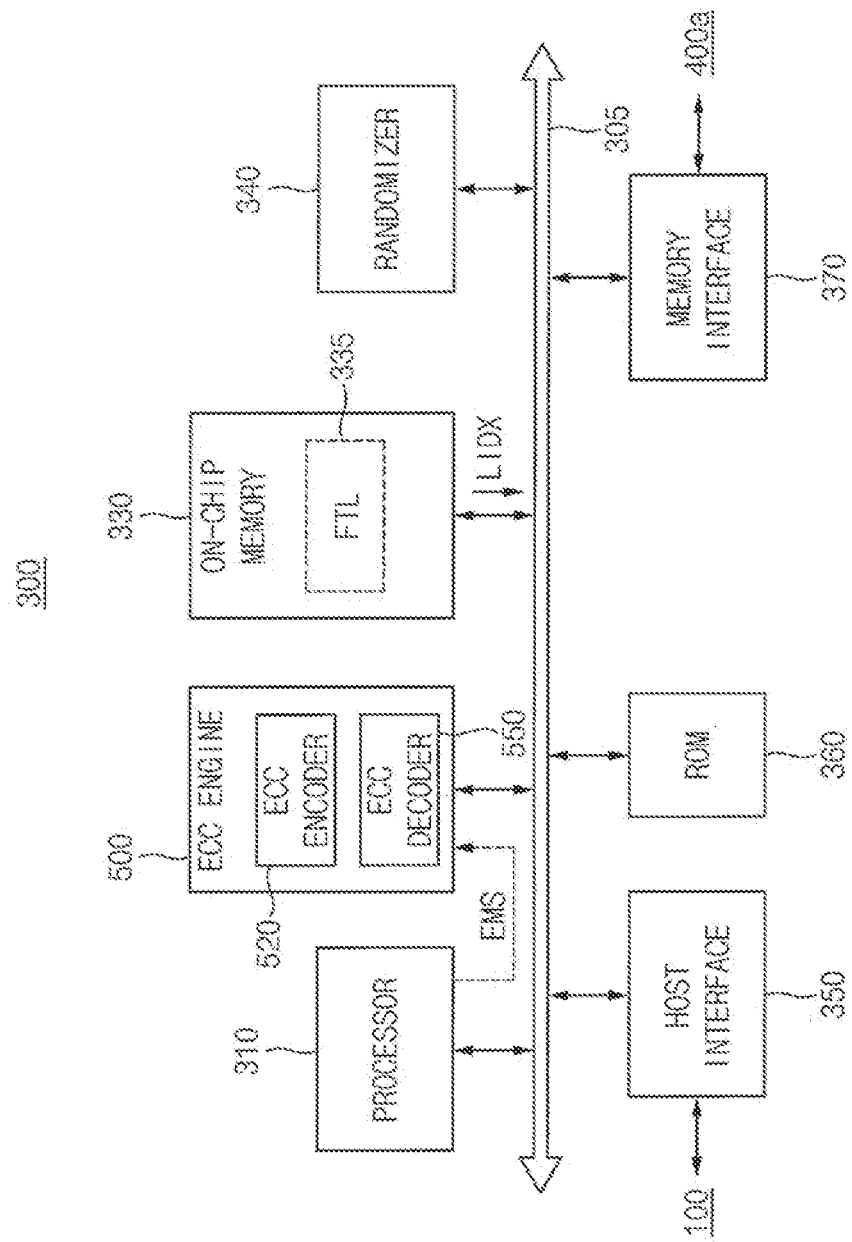
FIG. 3 is a block diagram illustrating an example of a storage controller in a storage device of the storage system in FIG. 1 according to example embodiments.

FIG. 3 is a block diagram illustrating an example of the storage controller 300 in the storage device in FIG. 1 according to example embodiments.

Referring to FIG. 3, the storage controller 300 may include a processor 310, an error correction code (ECC) engine 500, an on-chip memory 330, randomizer 340, a host interface 350, a ROM 360 and a memory interface 370 which are connected via a bus 305.

The processor 310 controls an overall operation of the storage controller 300. The processor 310 may control the ECC engine 500, the on-chip memory 330, the randomizer 340, the host interface 350, the ROM 360 and the nonvolatile memory interface 370. The processor 310 may include one or more cores (e.g., a homogeneous multi-core or a heterogeneous multi-core). The processor 310 may be or include, for example, at least one of a central processing unit (CPU), an image signal processing unit (ISP), a digital signal processing unit (DSP), a graphics processing unit (GPU), a vision processing unit (VPU), or a neural processing unit (NPU). The processor 310 may execute various application programs (e.g., a flash translation layer (FTL) 335 and firmware) loaded onto the on-chip memory 330.

The on-chip memory 330 may store various application programs that are executable by the processor 310. The on-chip memory 330 may operate as a cache memory adjacent to the processor 310. The on-chip memory 330 may store a command, an address, and data to be processed by the processor 310 or may store a processing result of the processor 310. The on-chip memory 330 may be, for example, a storage medium or a working memory including a latch, a register, a static random access memory (SRAM), a dynamic random access memory (DRAM), a thyristor random access memory (TRAM), a tightly coupled memory (TCM), etc.

The processor 310 may execute the FTL 335 loaded onto the on-chip memory 330. The FTL 335 may be loaded onto the on-chip memory 330 as firmware or a program stored in the one of the nonvolatile memory devices 400a-400k. The FTL 335 may manage mapping between a logical address provided from the host 100 and a physical address of the nonvolatile memory devices 400a-400k and may include an address mapping table manager managing and updating an address mapping table. The FTL 335 may further perform a garbage collection operation, a wear leveling operation, and the like, as well as the address mapping described above. The FTL 335 may be executed by the processor 310 for addressing one or more of the following aspects of the nonvolatile memory devices 400a~400k: overwrite- or in-place write-impossible, a life time of a memory cell, a limited number of program-erase (PE) cycles, and an erase speed slower than a write speed.

The FTL 335 may provide the ECC engine 500 with a location index LIDX for grouping a plurality of memory cells included in each of a page of each of the nonvolatile memory devices 400a~400k into outer cells and inner cells. A distance between the outer cell and a word-line cut region is smaller than a distance between the inner cell and the word-line cut region.

The ECC engine 500 may include an ECC encoder 510 and an ECC decoder 550.

The ECC encoder 510, in a write operation on target memory cells in a target page coupled to a target word-line from among the plurality of word-lines and in a first error correction mode, may perform a first ECC encoding operation on each of a plurality of sub data units in user data to generate parity bits associated with each of the plurality of sub data units and generate a plurality of ECC sectors based on the plurality of sub data units and the parity bits, may select outer cell bits to be stored in outer cells from among the target memory cells, from among the plurality of ECC sectors, based on the location index LIDX or location information on the target memory cells to constitute an outer ECC sector including the outer cell bits, and may perform a second ECC encoding operation on the outer ECC sector to generate outer parity bits. The ECC encoder 510 may transmit, to one of the plurality of nonvolatile memory devices 400a~400k, a codeword set including the plurality of ECC sectors and the outer parity bits through the memory interface 370.

The ECC decoder 550, in a read operation on the target memory cells in the target page and in the first error correction mode, may receive the codeword set including the plurality of ECC sectors and the outer parity bits from one of the plurality of nonvolatile memory devices 400a-

400*k*, may constitute the outer ECC sector from among the plurality of ECC sectors based on the location index LIDX, may perform a first ECC decoding operation on each of the plurality of ECC sectors and may perform selectively a second ECC decoding operation on the outer ECC sector using the outer parity bits, based on a result of the first ECC decoding operation. The ECC decoder 550 may perform the second ECC decoding operation on the outer ECC sector using the outer parity bits in response to detecting at least one uncorrectable error in at least one of the plurality of ECC sectors.

The ECC encoder 510, in a write operation on the target memory cells in the target page, may perform a first ECC encoding operation on each of a plurality of sub data units in user data to generate parity bits associated with each of the plurality of sub data units and generate a plurality of ECC sectors based on the plurality of sub data units and the parity bits, may select a portion of inner cell bits from inner cell bits to be stored in inner cells from among the target memory cells, from among the plurality of ECC sectors, based on the location index or the location information to constitute an inner ECC sector including the portion of inner cell bits, and may perform a second ECC encoding operation on the inner ECC sector to generate inner parity bits. The ECC encoder 510 may transmit, to one of the plurality of nonvolatile memory devices 400*a*-400*k*, a codeword set including the plurality of ECC sectors and the inner parity bits through the memory interface 370.

The ECC decoder 550, in a read operation on the target memory cells in the target page, may receive the codeword set including the plurality of ECC sectors and the inner parity bits from the one of the plurality of nonvolatile memory devices 400*a*-400*k*, may constitute the inner ECC sector from among the plurality of ECC sectors based on the location index LIDX, may perform a first ECC decoding operation on the inner ECC sector based on the inner parity bits to correct an correctable error in the inner ECC sector, and may perform a second ECC decoding operation on each of the plurality of ECC sectors to correct an correctable error in each of the plurality of ECC sectors.

The ECC decoder 550 may perform a third ECC encoding operation on all of plurality of ECC sectors in response to detecting at least one uncorrectable error in a portion of the plurality of ECC sectors.

The processor 310 may provide an error correction mode signal EMS to the ECC engine 500 to control operation of the ECC engine 500. The error correction mode signal EMS may be associated with selecting the outer cell bits and the inner cell bits. The ECC engine 500 may operate in the first error correction mode in response to a first logic level of the error correction mode signal EMS to select the outer cell bits to constitute the outer ECC sector, and the ECC engine 500 may operate in the second error correction mode in response to a second logic level of the error correction mode signal EMS to select the inner cell bits to constitute the inner ECC sector.

The ROM 360 may store a variety of information, used for the storage controller 300 to operate, in firmware.

The randomizer 340 may randomize data to be stored in one of the nonvolatile memory devices 400*a*-400*k*. For example, the randomizer 340 may randomize data to be stored in one of the nonvolatile memory devices 400*a*-400*k* by a word-line.

Data randomizing is to process data such that program states of memory cells connected to a word-line have the same ratio. For example, if memory cells connected to one word-line are quad-level cells (QLC) each storing 4-bit data, each of the memory cells may have one of an erase state and first through fifteenth program states. In this case, the randomizer 340 may randomize data such that in memory cells connected to one word-line, the number of memory cells having the erase state, and each of the number of memory cells having the first through fifteenth program states may be substantially the same as one another. For example, memory cells in which randomized data is stored have program states of which the number is equal to one another.

The randomizer 340 may randomize page data. For the sake of easy understanding, an ideal operation of the randomizer 340 is described. However, the present disclosure is not limited thereto. For example, the randomizer 340 may randomize data such that in memory cells connected to one word-line, the number of memory cells having the erase state and each of the number of memory cells having the first through fifteenth program states are approximate to the same value. For example, memory cells in which randomized data is stored have program states of which the number may be similar to one another.

The storage controller 300 may communicate with the host 100 through the host interface 350. For example, the host interface 350 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Nonvolatile memory express (NVMe), Universal Flash Storage (UFS), of the like. The storage controller 300 may communicate with the nonvolatile memory devices 400*a*-400*k* through the memory interface 370.

Figure 4:
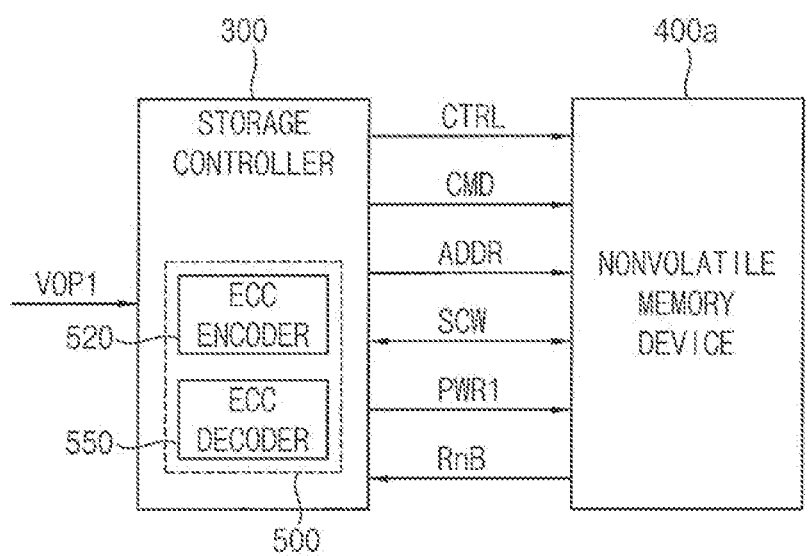
FIG. 4 is a block diagram illustrating a connection relationship between the storage controller and a nonvolatile memory device in the storage device of the storage system of FIG. 1 according to example embodiments.

FIG. 4 is a block diagram illustrating a connection relationship between the storage controller 300 and one nonvolatile memory device 400*a* in the storage device of FIG. 1.

Referring to FIG. 4, the storage controller 300 may operate based on the first operating voltage VOP1. The nonvolatile memory device 400*a* may perform an erase operation, a program operation, and/or a write operation under control of the storage controller 300. The nonvolatile memory device 400*a* may receive a command CMD, an address ADDR, and a codeword set SCW through input/output lines from the storage controller 300 for performing such operations. In addition, the nonvolatile memory device 400*a* may receive a control signal CTRL through a control line and may receive a power PWR1 through a power line from the storage controller 300. In addition, the nonvolatile memory device 400*a* may provide a status signal RnB to the storage controller 300 through the control line. The nonvolatile memory device 400*a* may provide the codeword set SCW to the storage controller 300 through the input/output lines.

The storage controller 300 may include the ECC engine 500, and the ECC engine 500 may include the ECC encoder 510 and the ECC decoder 550. The ECC encoder 510 may perform an ECC encoding operation on data to be stored in the nonvolatile memory device 400*a*. The ECC decoder 550 may perform an ECC decoding operation on data read from the nonvolatile memory device 400*a*.

Figure 5:
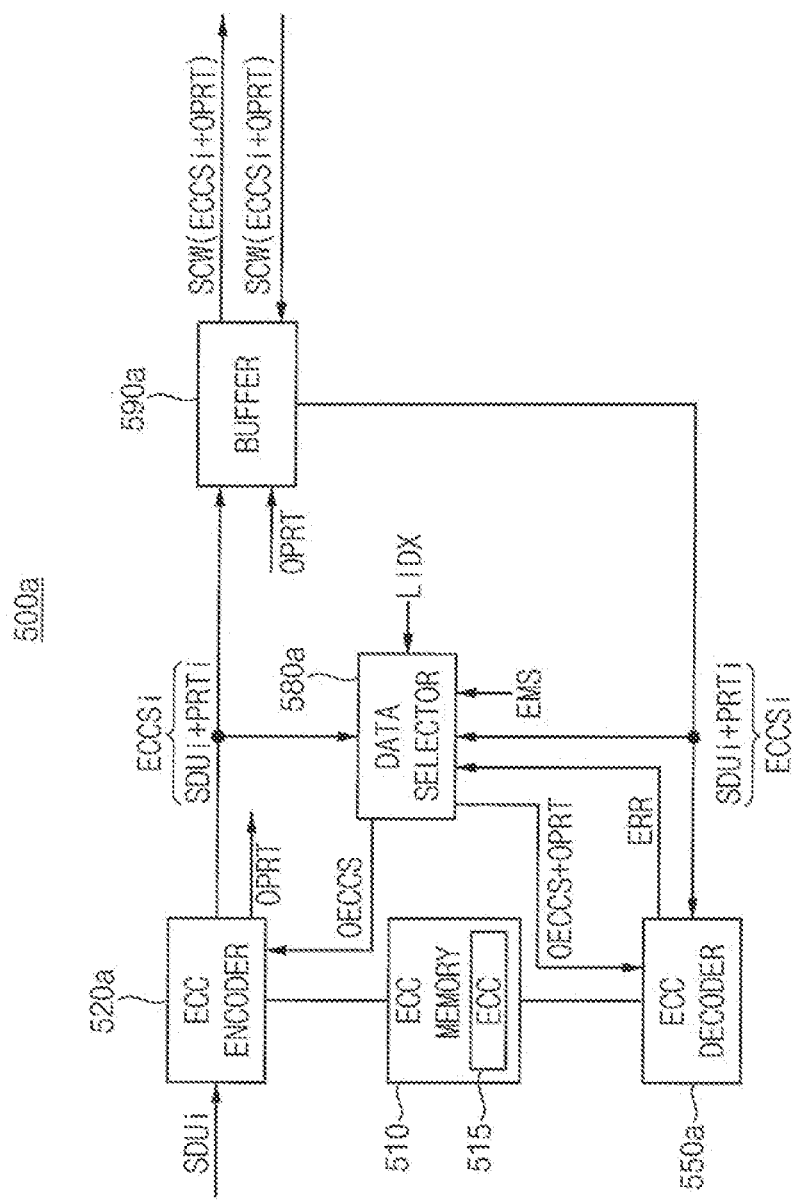
FIG. 5 is a block diagram illustrating an example of an error correction code (ECC) engine in the storage controller of FIGS. 3-4 according to example embodiments.

FIG. 5 is a block diagram illustrating an example of an ECC engine in the storage controller 300 of FIG. 4 according to example embodiments.

Referring to FIG. 5, an ECC engine 500a may include an ECC memory 510 that stores an ECC 515, an ECC encoder 520a, an ECC decoder 550a, a data selector 580a and a buffer 590a.

The ECC encoder 520a is connected to the ECC memory 510. The ECC encoder 520a, in a write operation on target memory cells in a target page coupled to a target word-line, may perform a first ECC encoding operation on each of a plurality sub data units SDUi (where i is a natural number from one to a number greater than one) in user data that is received by the ECC encoder 520a to generate parity bits PRTi associated with each of the sub data units SDUi by using the ECC 515 and generate a plurality of ECC sectors ECCSi based on the plurality of sub data units SDUi and the parity bits PRTi, and may provide the plurality of ECC sectors ECCSi to the data selector 580a and the buffer 590a. Each of the ECC sectors ECCSi may include a respective one of the sub data units SDUi and respective one of the parity bits PRTi. In some example embodiments, the respective one of the parity bits PRTi may itself include plural bits (see, e.g., the example illustrated in FIG. 6).

The data selector 580a, based on the error correction mode signal EMS and the location index LIDX, may select outer cell bits in each of sub data units SDUi to constitute an outer ECC sector OECCS and provide the outer ECC sector OECCS to the ECC encoder 520a in the first error correction mode.

The ECC encoder 520a may perform a second ECC encoding operation on the outer ECC sector OECCS to generate outer parity bits OPRT and may provide the outer parity bits OPRT to the buffer 590a.

The buffer 590a may provide the nonvolatile memory device 400a with the codeword set SCW including the outer parity bits OPRT and the ECC sectors ECCSi including the sub data units SDUi and the parity bits PRTi through the memory interface 370.

The buffer 590a, in a read operation on the target memory cells, may receive the codeword set SCW including the outer parity bits OPRT and the ECC sectors ECCSi including the sub data units SDUi and the parity bits PRTi through the memory interface 370 from the nonvolatile memory device 400a, may provide the ECC sectors ECCSi to the ECC decoder 550a and may provide the ECC sectors ECCSi to the data selector 580a.

The ECC decoder 550a is connected to the ECC memory 510. The ECC decoder 550a, in a read operation on the target memory cells, performs a first ECC decoding operation on each of the plurality of ECC sectors ECCSi by using the ECC 515 to correct a correctable error in each of the plurality of ECC sectors ECCSi. The ECC decoder 550a may provide the data selector 580a with an error flag ERR indicating that at least one uncorrectable error is detected in at least one of plurality of ECC sectors ECCSi based on a result of the first ECC decoding operation.

The data selector 580a, in response to the error flag ERR, may selectively select outer cell bits from each of the plurality of ECC sectors ECCSi to constitute the outer ECC sector OECCS and may provide the outer ECC sector OECCS and the outer parity bits OPRT to the ECC decoder 550a.

The ECC decoder 550a may perform a second ECC decoding operation on the outer ECC sector OECCS based on the outer parity bits OPRT to correct at least one uncorrectable error in the outer ECC sector OECCS.

Figure 6:
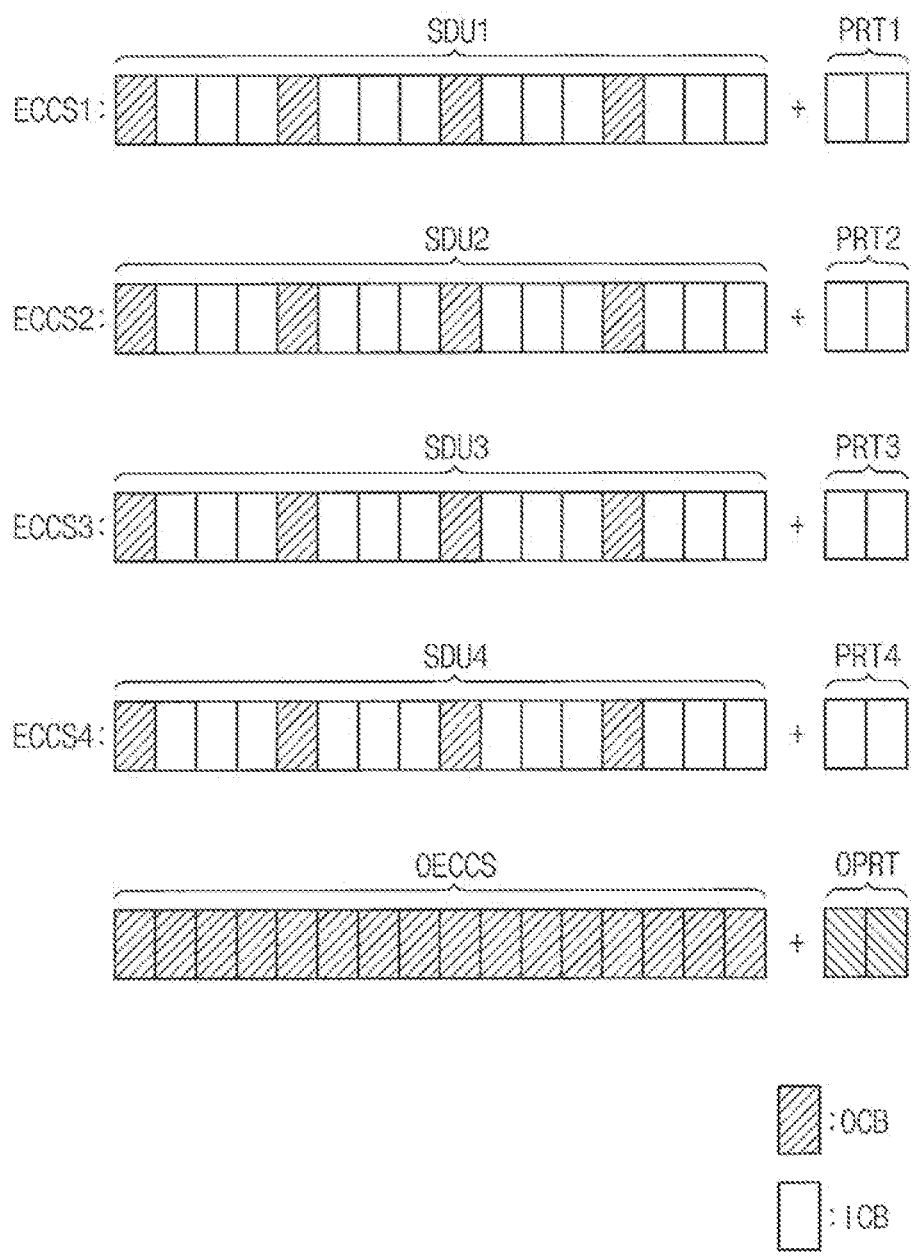
FIG. 6 illustrates an example operation of the ECC encoder in FIG. 5 according to example embodiments.

FIG. 6 illustrates an example operation of the ECC encoder 520a in FIG. 5 according to example embodiments.

In FIG. 6, it is assumed that the user data DTA in FIG. 1 includes a first sub data unit SDU1, a second sub data unit SDU2, a third sub data unit SDU3, and a fourth sub data unit SDU4. Each of the first, second, third and fourth sub data units SDU1, SDU2, SDU3 and SDU4 may include outer cell bits OCB and inner cell bits ICB.

Referring to FIGS. 5 and 6, the ECC encoder 520a, using the ECC 515, may perform a first ECC encoding operation on the first sub data unit SDU1 to generate first parity bits PRT1 and may constitute a first ECC sector ECCS1 including the first sub data unit SDU1 and the first parity bits PRT1.

The ECC encoder 520a, using the ECC 515, may perform a first ECC encoding operation on the second sub data unit SDU2 to generate second parity bits PRT2 and may constitute a second ECC sector ECCS2 including the second sub data unit SDU2 and the second parity bits PRT2.

The ECC encoder 520a, using the ECC 515, may perform a first ECC encoding operation on the third sub data unit SDU3 to generate third parity bits PRT3 and may constitute a third ECC sector ECCS3 including the third sub data unit SDU3 and the third parity bits PRT3.

The ECC encoder 520a, using the ECC 515, may perform a first ECC encoding operation on the fourth sub data unit SDU4 to generate fourth parity bits PRT4 and may constitute a fourth ECC sector ECCS4 including the fourth sub data unit SDU4 and the fourth parity bits PRT4.

The ECC encoder 520a may perform the first ECC encoding operation on the first, second, third and fourth sub data units SDU1, SDU2, SDU3 and SDU4 sequentially or in parallel.

The ECC encoder 520a may select the outer cell bits OCB in each of the first through fourth sub data units SDU1, SDU2, SDU3 and SDU4 to constitute an outer ECC sector OECCS and may perform a second ECC operation on the outer ECC sector OECCS to generate the outer parity bits OPRT. For example, in some example embodiments, the outer cell bits OCB of the first sub data unit SDU1 (i.e., bits 0, 4, 8, 12) may form bits 0-4 of the outer ECC sector OECCS, and the outer cell bits OCB of the second sub data unit SDU2 (i.e., bits 0, 4, 8, 12) may form bits 5-8 of the outer cell sector OECCS, and so on. However, example embodiments are not limited to this and in some embodiments, the order of bits in the outer ECC sector OECCS may be different.

Figure 7:
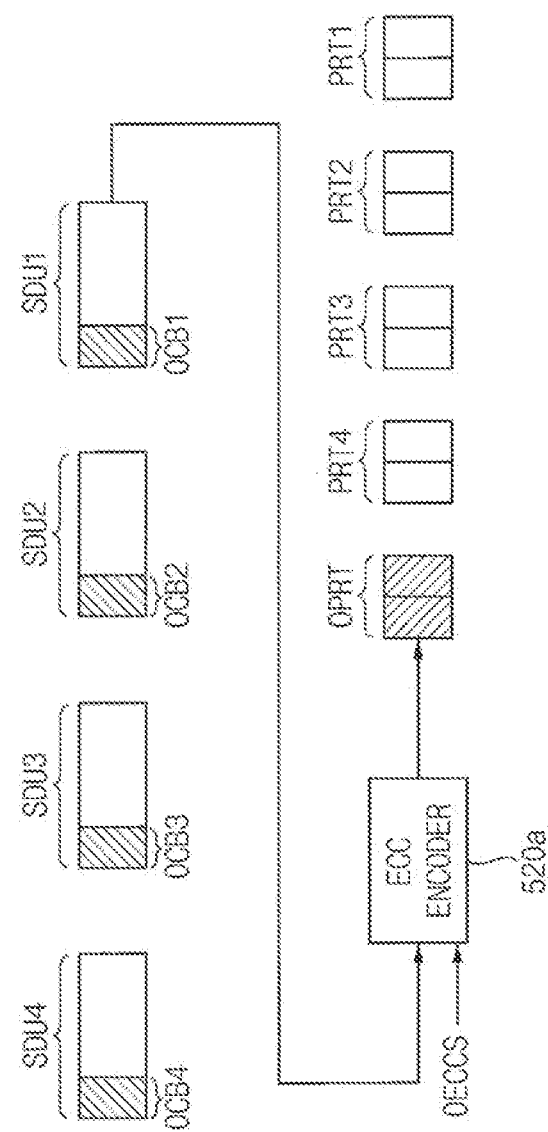
FIG. 7 illustrates an example in which an ECC encoder of the ECC engine in FIG. 5 performs a first ECC encoding operation on a plurality of sub data units sequentially.

FIG. 7 illustrates an example in which the ECC encoder 520a in FIG. 5 performs the first ECC encoding operation on the plurality of sub data units sequentially.

Referring to FIG. 7, the ECC encoder 520a may perform the first ECC encoding operation on each of the first through fourth sub data units SDU1, SDU2, SDU3 and SDU4 including the outer cell bits OCB respectively, to generate the first through fourth parity bits PRT1, PRT2, PRT3 and PRT4 sequentially. In addition, the ECC encoder 520a may constitute the outer ECC sector OECCS based on the outer cell bits OCB in each of the first through fourth sub data units SDU1, SDU2, SDU3 and SDU4 and may perform the second ECC operation on the outer ECC sector OECCS to generate the outer parity bits OPRT.

Figure 8A:
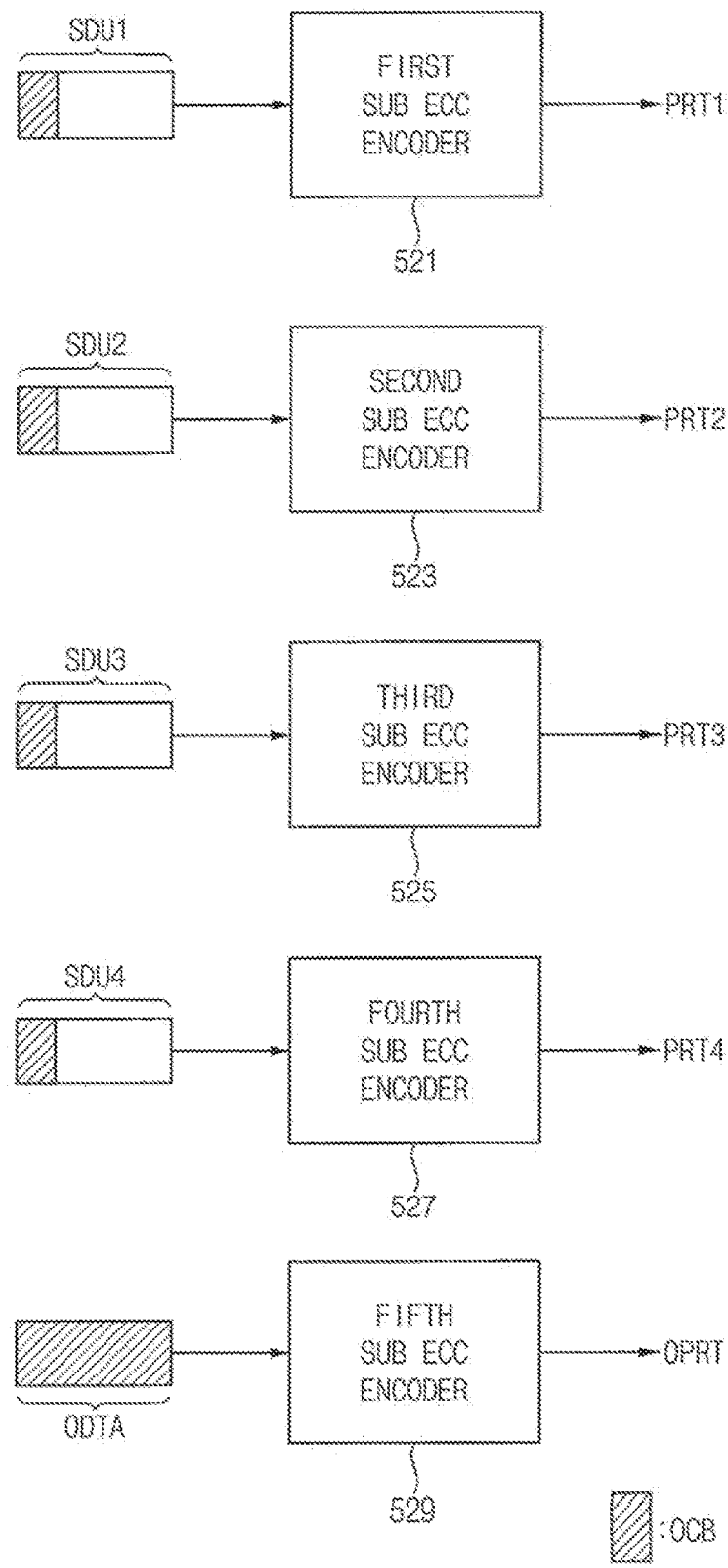
FIGS. 8A and 8B illustrate examples in which an ECC encoder of the ECC engine in FIG. 5 performs the first ECC encoding operation on the plurality of sub data units in parallel, respectively.
Figure 8B:
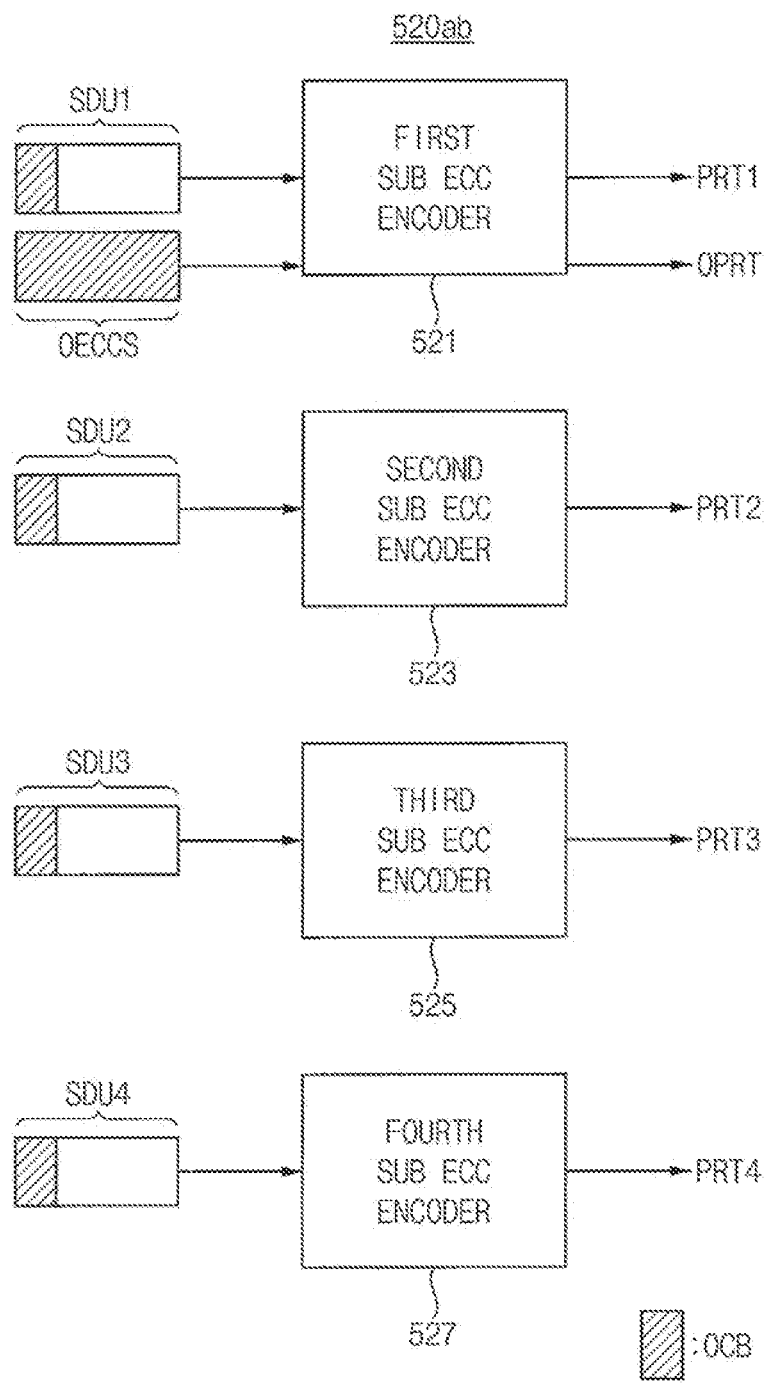

FIGS. 8A and 8B illustrate examples in which the ECC encoder 520a in FIG. 5 performs the first ECC encoding operation on the plurality of sub data units in parallel, respectively.

Referring to FIG. 8A, in some example embodiments, the ECC encoder 520a may include an ECC encoder 520aa. The ECC encoder 520aa may include a first sub ECC encoder 521, a second sub ECC encoder 523, a third sub ECC encoder 525, a fourth sub ECC encoder 527, a fifth sub ECC encoder 529.

Each of the first through fifth sub ECC encoders 521, 523, 525, 527 and 529 may be connected to the ECC 515 in FIG. 5. Each of the first through fourth sub ECC encoders 521, 523, 525 and 527 may perform the first ECC encoding operation on a respective one of the first through fourth sub data units SDU1, SDU2, SDU3 and SDU4 including the outer cell bits OCB respectively, in parallel to generate the first through fourth parity bits PRT1, PRT2, PRT3 and PRT4 in parallel. The fifth sub ECC encoder 529 may perform the second ECC encoding operation on the outer ECC sector OECCS including the outer cell bits OCB in each of the first through fourth sub data units SDU1, SDU2, SDU3 and SDU4 in parallel with the first ECC encoding operation to generate the outer parity bits OPRT.

Referring to FIG. 8B, in some example embodiments, the ECC encoder 520a may include an ECC encoder 520ab. The ECC encoder 520ab may include the first sub ECC encoder 521, the second sub ECC encoder 523, the third sub ECC encoder 525, and the fourth sub ECC encoder 527.

Each of the fourth sub ECC encoders 521, 523, 525 and 527 may be connected to the ECC 515 in FIG. 5. Each of the first through fourth sub ECC encoders 521, 523, 525 and 527 may perform the first ECC encoding operation on a respective one of the first through fourth sub data units SDU1, SDU2, SDU3 and SDU4 including the outer cell bits OCB respectively, in parallel to generate the first through fourth parity bits PRT1, PRT2, PRT3 and PRT4 in parallel. In the example embodiment illustrated in FIG. 8B, the first sub ECC encoder 521 may perform the second ECC encoding operation on the outer ECC sector OECCS including the outer cell bits OCB in each of the first through fourth sub data units SDU1, SDU2, SDU3 and SDU4 to generate the outer parity bits OPRT. In other words, in the example embodiment of FIG. 8B, the fifth sub ECC encoder 529 may be omitted as compared with the example embodiment of FIG. 8A.

Figure 9:
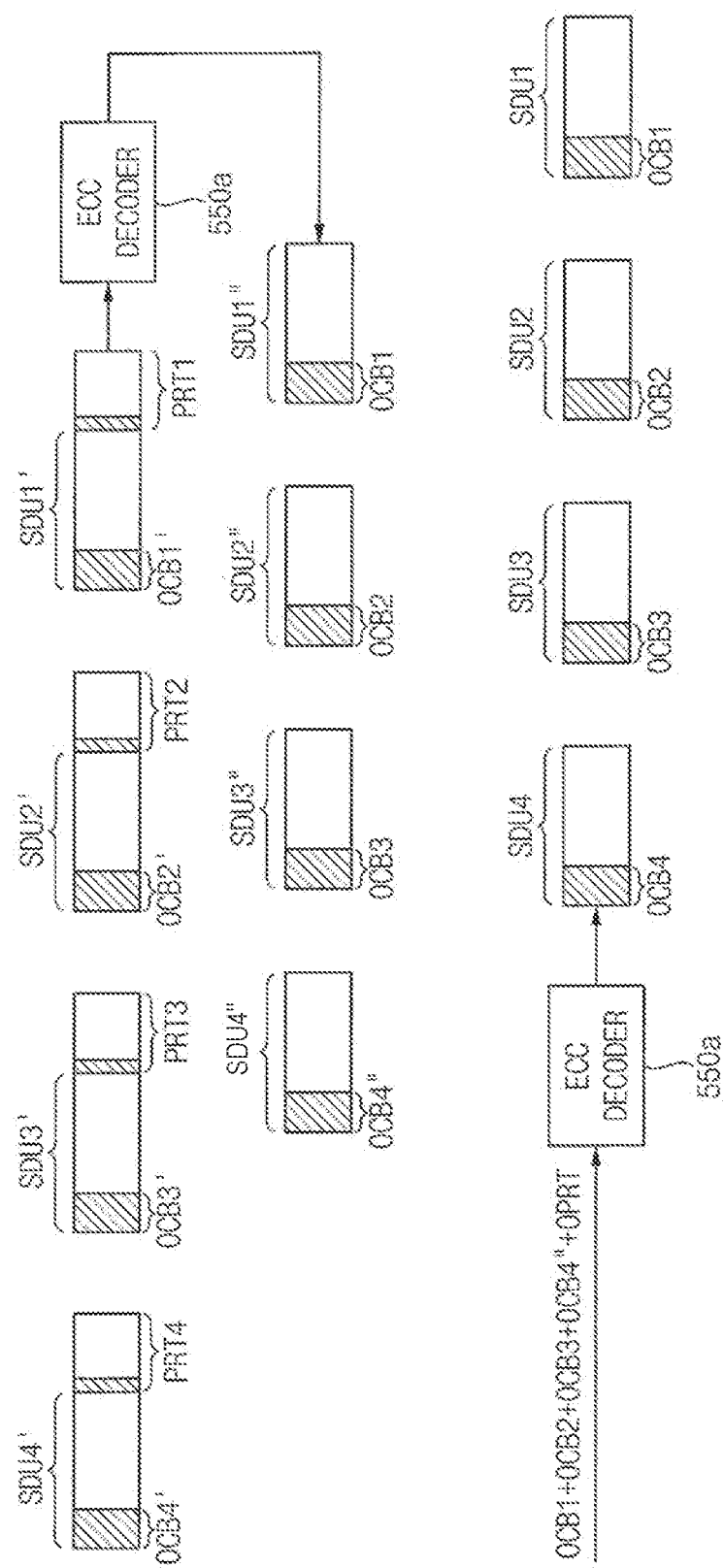
FIG. 9 illustrates an example operation of an ECC decoder of the ECC engine in FIG. 5 according to example embodiments.

FIG. 9 illustrates an example operation of the ECC decoder 550a in FIG. 5 according to example embodiments.

Referring to FIGS. 5 and 9, the ECC decoder 550a, using the ECC 515, may perform a first ECC decoding operation on each of a first ECC sector including the first parity bits PRT1 and a first sub data unit SDU1' including first outer cell bits OCB1', a second ECC sector including the second parity bits PRT2 and a second sub data unit SDU2' including second outer cell bits OCB2', a third ECC sector including the third parity bits PRT3 and a third sub data unit SDU3' including third outer cell bits OCB3' and a fourth ECC sector including the fourth parity bits PRT4 and a fourth sub data unit SDU4' including fourth outer cell bits OCB4' which are read from a target page of the nonvolatile memory device 400a to correct an correctable error in each of the first sub data unit SDU1', the second sub data unit SDU2', the third sub data unit SDU3' and the fourth sub data unit SDU4', and may output a first sub data unit SDU1", a second sub data unit SDU2", a third sub data unit SDU3" and a fourth sub data unit SDU4".

Each of the first parity bits PRT1, the second parity bits PRT2, the third parity bits PRT3 and the fourth parity bits PRT4 may include outer cell bits read from the outer cells.

After the first ECC decoding operation is performed, an error in each of the outer cell bits OCB1, OCB2, OCB3 in a respective one of the first sub data unit SDU1, the second sub data unit SDU2 and the third sub data unit SDU3 is corrected and un uncorrectable error is detected in outer cell bits OCB4" in the fourth sub data unit SDU4". The ECC decoder 550a may perform the second ECC decoding operation on an outer ECC sector including the outer cell bits OCB1, OCB2 and OCB3 and the outer cell bits OCB4" based on the outer parity bits OPRT to correct the uncorrectable error in the outer cell bits OCB4" and may output outer cell bits OCB4 (i.e., the fourth sub data unit SDU4) and the first to third sub data units SDU1 to SDU3.

Figure 10:
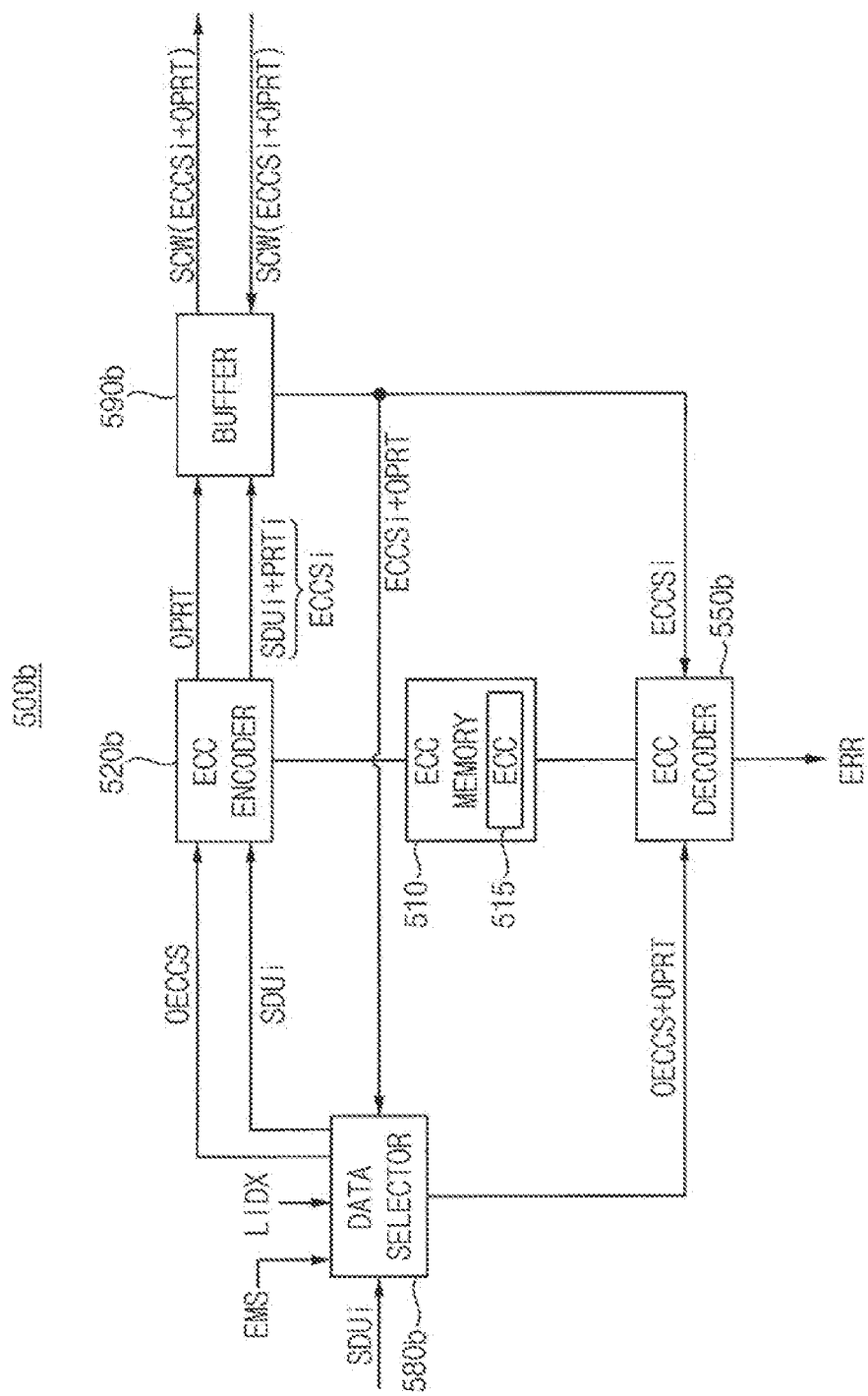
FIG. 10 is a block diagram illustrating an example of an ECC engine in the storage controller of FIGS. 3-4 according to example embodiments.

FIG. 10 is a block diagram illustrating an example of an ECC engine 500 in the storage controller 300 of FIG. 4 according to example embodiments.

Referring to FIGS. 4 and 10, the ECC engine 500 may be an ECC engine 500b. The ECC engine 500b may include an ECC memory 510 that stores an ECC 515, an ECC encoder 520b, an ECC decoder 550b, a data selector 580b and a buffer 590b.

The data selector 580b, based on the error correction mode signal EMS and the location index LIDX, may select outer cell bits in each of a plurality of sub data units SDUi to constitute an outer ECC sector OECCS and may provide the outer ECC sector OECCS to the ECC encoder 520b in the second error correction mode.

The ECC encoder 520b is connected to the ECC memory 510. The ECC encoder 520b, in a write operation on target memory cells in the target page may perform a first ECC encoding operation on the outer ECC sector OECCS to generate outer parity bits OPRT, may provide outer parity bits OPRT to the buffer 590b, may perform a second ECC encoding operation on each of the plurality sub data unit SDUi in user data to generate parity bits PRTi associated with each of the sub data units SDUi by using the ECC 515, may generate a plurality of ECC sectors ECCSi based on the plurality of sub data units SDUi and the parity bits PRTi, and may provide the plurality of ECC sectors ECCSi to the buffer 590b. Each of the ECC sectors ECCSi may include a respective one of the sub data units SDUi and a respective one of the parity bits PRTi. In some example embodiments, the respective one of the parity bits PRTi may itself include plural bits.

The buffer 590b may provide the nonvolatile memory device 400a with the codeword set SCW including the outer parity bits OPRT and the ECC sectors ECCSi including the sub data units SDUi and the parity bits PRTi through the memory interface 370.

The buffer 590b, in a read operation on the target memory cells, may receive the codeword set SCW including the outer parity bits OPRT and the ECC sectors ECCSi including the sub data units SDUi and the parity bits PRTi through the memory interface 370 from the nonvolatile memory device 400a, may provide the ECC sectors ECCSi to the ECC decoder 550b and may provide the ECC sectors ECCSi and the outer parity bits OPRT to the data selector 580b.

The ECC decoder 550b is connected to the ECC memory 510. The ECC decoder 550b, in a read operation on the target memory cells, perform a first ECC decoding operation on each of the plurality of ECC sectors ECCSi by using the ECC 515 to correct a correctable error in each of the plurality of ECC sectors ECCSi.

The data selector 580b, based on the error correction mode signal EMS and the location index LIDX, may select outer cell bits in each of the sub data units SDUi to constitute the outer ECC sector OECCS and may provide the outer ECC sector OECCS and the outer parity bits OPRT to the ECC encoder 520b.

The ECC decoder 550b may perform a second ECC decoding operation on the outer ECC sector OECCS based on the outer parity bits OPRT to correct at least one uncorrectable error in the outer ECC sector OECCS.

Figure 11:
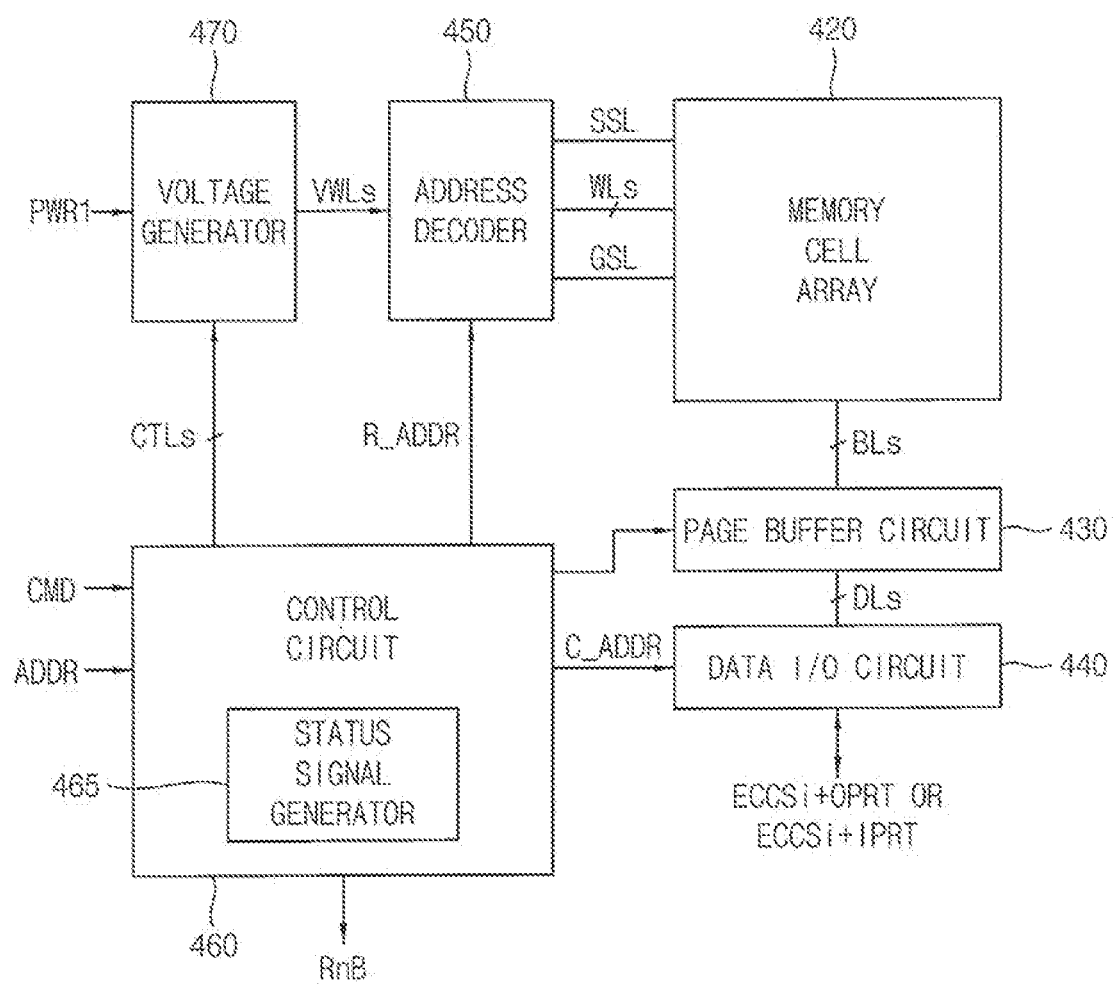
FIG. 11 is a block diagram illustrating the nonvolatile memory device in FIG. 4 according to some example embodiments.

FIG. 11 is a block diagram illustrating the nonvolatile memory device 400a in FIG. 4 according to some example embodiments.

Referring to FIG. 11, the nonvolatile memory device 400a may include a memory cell array 420, an address decoder 450, a page buffer circuit 430, a data input/output (I/O) circuit 440, a control circuit 460, and a voltage generator 470.

The memory cell array 420 may be coupled to the address decoder 450 through a string selection line SSL, a plurality of word-lines WLs, and a ground selection line GSL. In addition, the memory cell array 420 may be coupled to the page buffer circuit 430 through a plurality of bit-lines BLs.

The memory cell array 420 may include a plurality of memory cells coupled to the plurality of word-lines WLs and the plurality of bit-lines BLs.

In some example embodiments, the memory cell array 420 may be or include a three-dimensional memory cell array, which is formed on a substrate in a three-dimensional structure (e.g., a vertical structure). In this case, the memory cell array 420 may include vertical cell strings (i.e., NAND strings) that are vertically oriented such that at least one memory cell is located over another memory cell.

Figure 12:
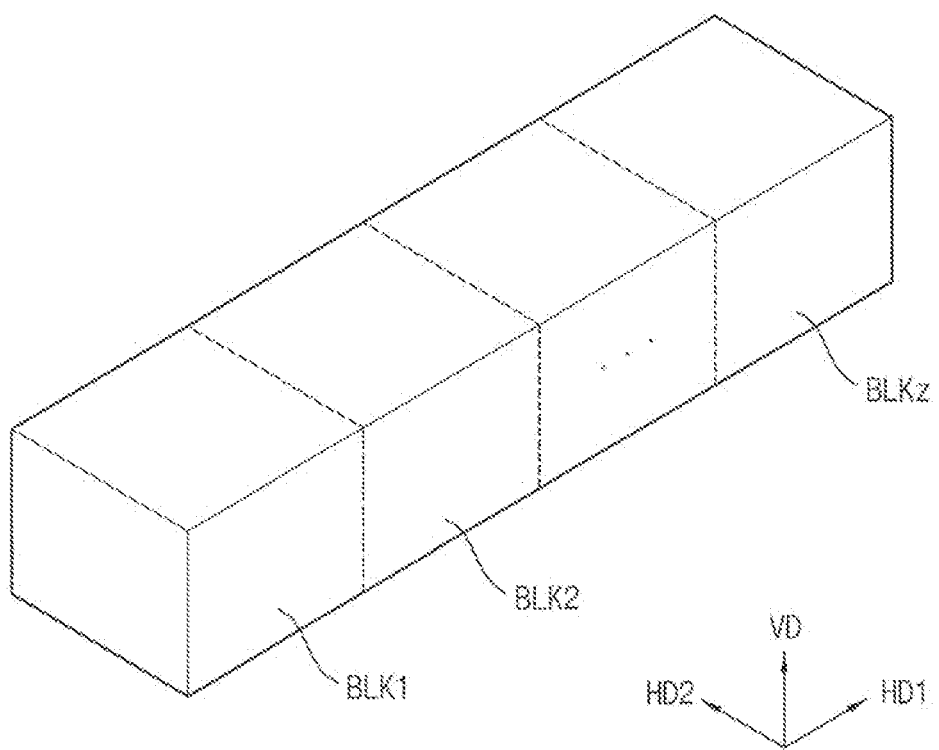
FIG. 12 is a block diagram illustrating an example of a memory cell array in the nonvolatile memory device of FIG. 11.

FIG. 12 is a block diagram illustrating the memory cell array 420 in the nonvolatile memory device 400a of FIG. 11.

Referring to FIG. 12, the memory cell array 420 may include a plurality of memory blocks BLK1 to BLKz. Here, z is an integer greater than two. The memory blocks BLK1 to BLKz extend along a first horizontal direction HD1, a second horizontal direction HD2 and a vertical direction VD. In some example embodiments, the memory blocks BLK1 to BLKz are selected by the address decoder 450 in FIG. 11. For example, the address decoder 450 may select a memory block BLK corresponding to a block address among the memory blocks BLK1 to BLKz.

Figure 13:
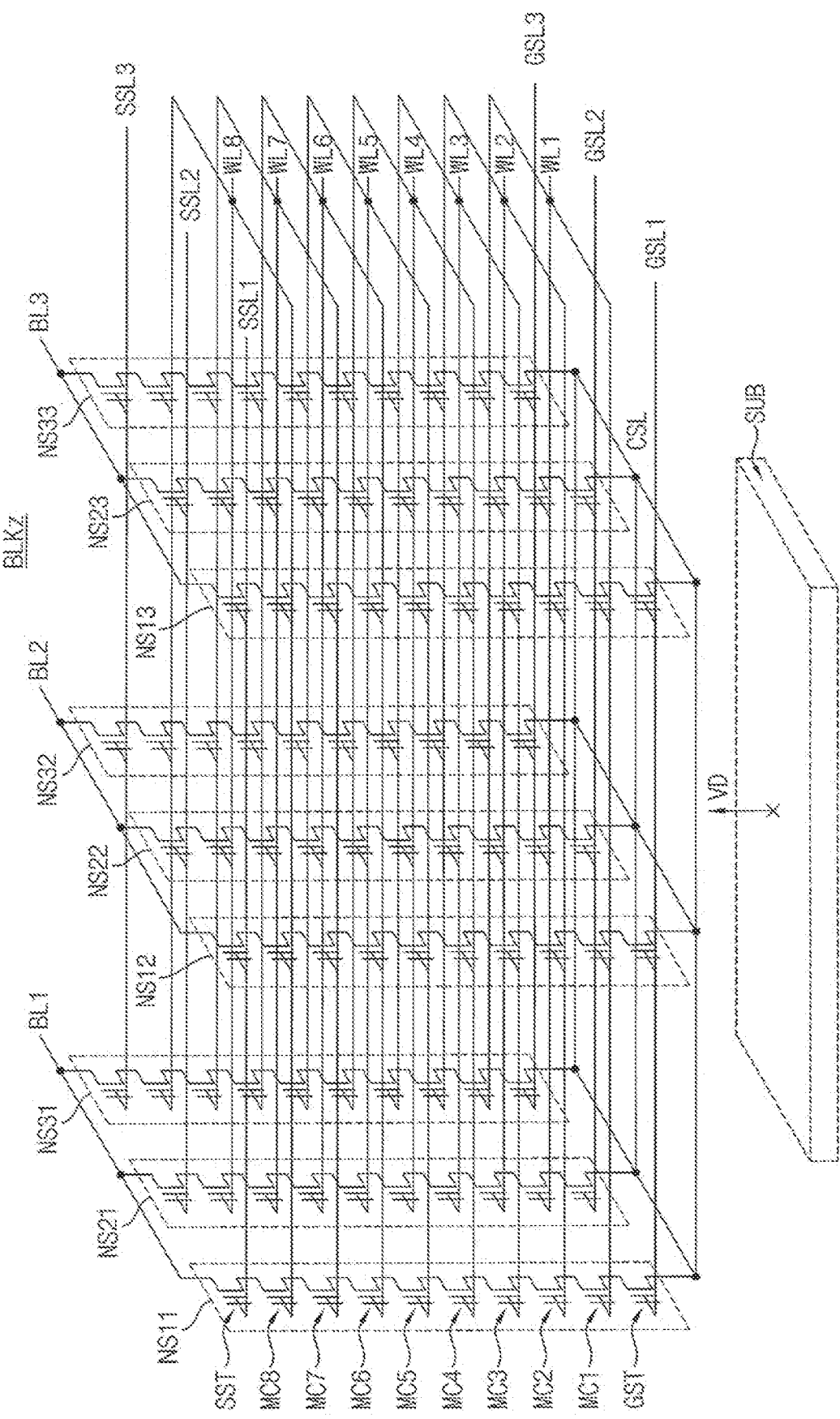
FIG. 13 is a circuit diagram illustrating a memory block of the memory cell array of FIG. 12.

FIG. 13 is a circuit diagram illustrating a memory block BLKz of FIG. 12.

The memory block BLKz of FIG. 13 may be formed on a substrate SUB in a three-dimensional structure (or a vertical structure). For example, a plurality of memory cell strings included in the memory block BLKz may be formed in the direction VD perpendicular to the substrate SUB.

Referring to FIG. 13, the memory block BLKz may include NAND strings NS11 to NS33 coupled between bit-lines BL1, BL2 and BL3 and a common source line CSL. Each of the NAND strings NS11 to NS33 may include a string selection transistor SST, a plurality of memory cells MC1 to MC8, and a ground selection transistor GST. In FIG. 13, each of the NAND strings NS11 to NS33 is illustrated to include eight memory cells MC1 to MC8. However, inventive concepts are not limited thereto. In some example embodiments, each of the NAND strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated.

Figure 14:
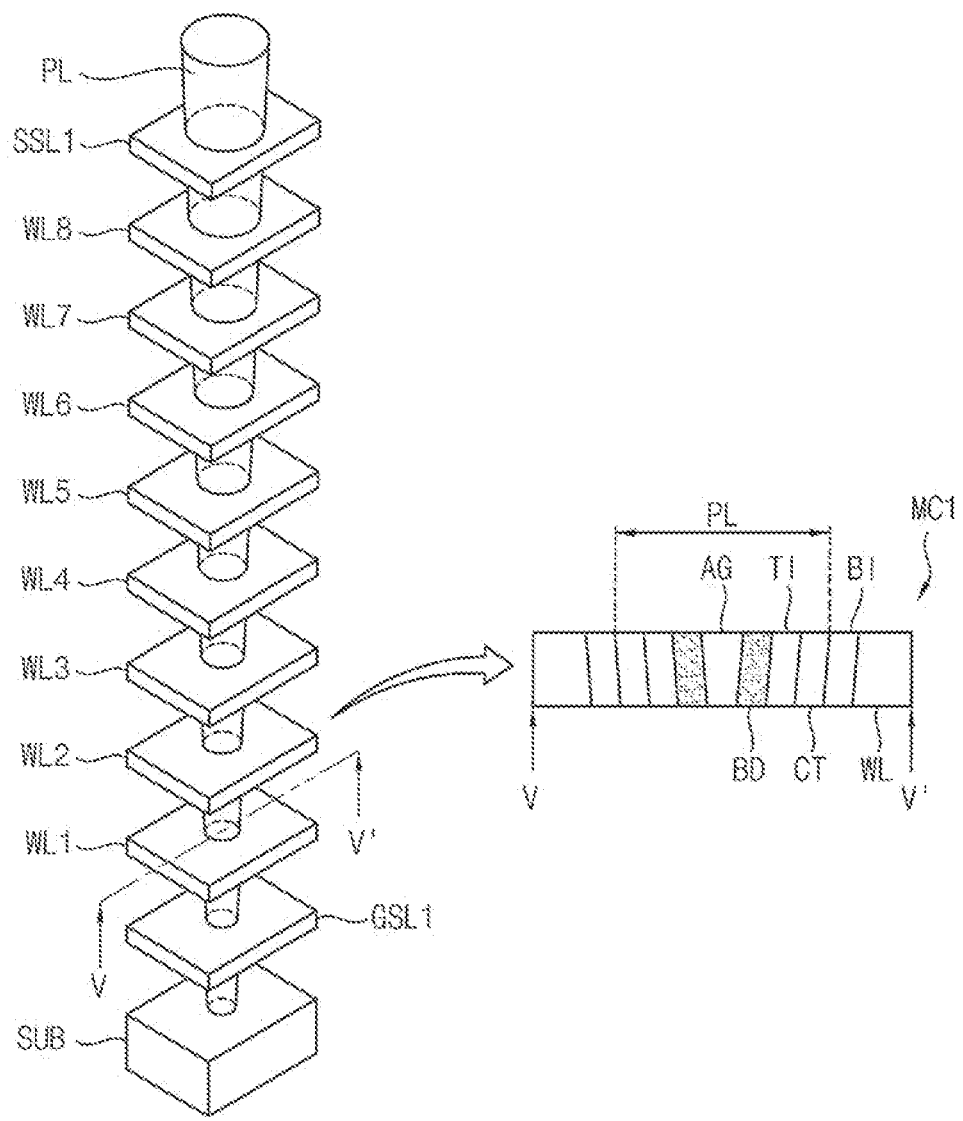
FIG. 14 illustrates an example of a structure of a NAND string in the memory block of FIG. 13.

FIG. 14 illustrates an example of a structure of a NAND string CS in the memory block of FIG. 13.

Referring to FIGS. 13 and 14, a pillar PL is provided on the substrate SUB such that the pillar PL extends in a direction perpendicular to the substrate SUB to make contact with the substrate SUB. Each of the ground selection line GSL, the word lines WL1 to WL8, and the string selection lines SSL illustrated in FIG. 14 may be formed of a conductive material parallel with the substrate SUB, for example, a metallic material. The pillar PL may be in contact with the substrate SUB through the conductive materials forming the string selection lines SSL, the word lines WL1 to WL8, and the ground selection line GSL.

A sectional view taken along a line V-V' is also illustrated in FIG. 14. In some example embodiments, a sectional view of a first memory cell MC1 corresponding to a first word line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word line WL and the pillar PL. The body BD, the tunnel insulating layer TI, the charge trap layer CT, the blocking insulating layer BI, and the first word line WL may constitute or be included in a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

Referring back to FIGS. 4 and 11, the control circuit 460 may receive the command (signal) CMD and the address (signal) ADDR from the storage controller 300, and may control an erase loop, a program loop and/or a read operation of the nonvolatile memory device 400a based on the command signal CMD and the address signal ADDR. The program loop may include a program operation and a program verification operation. The erase loop may include an erase operation and an erase verification operation.

For example, the control circuit 460 may generate control signals CTLs, which are used for controlling the voltage generator 470, based on the command signal CMD, and generate a row address R_ADDR and a column address C_ADDR based on the address signal ADDR. The control circuit 460 may provide the row address R_ADDR to the address decoder 450 and may provide the column address C_ADDR to the data I/O circuit 440.

The address decoder 450 may be coupled to the memory cell array 420 through the string selection line SSL, the plurality of word-lines WLs, and the ground selection line GSL. During the program operation or the read operation, the address decoder 450 may determine one of the plurality of word-lines WLs as a first word-line (e.g., a selected word-line) and determine rest of the plurality of word-lines WLs except for the first word-line as unselected word-lines based on the row address R_ADDR.

The voltage generator 470 may generate word-line voltages VWLs, which are required for the operation of the nonvolatile memory device 400a, based on the control signals CTLs. The voltage generator 470 may receive the power PWR1 from the storage controller 300. The word-line voltages VWLs may be applied to the plurality of word-lines WLs through the address decoder 450.

For example, during the erase operation, the voltage generator 470 may apply an erase voltage to a well of the memory block and may apply a ground voltage to entire word-lines of the memory block. During the erase verification operation, the voltage generator 470 may apply an erase verification voltage to the entire word-lines of the memory block or sequentially apply the erase verification voltage to word-lines in a word-line basis.

For example, during the program operation, the voltage generator 470 may apply a program voltage to the first word-line and may apply a program pass voltage to the unselected word-lines. In addition, during the program verification operation, the voltage generator 470 may apply a program verification voltage to the first word-line and may apply a verification pass voltage to the unselected word-lines.

Furthermore, during the read operation, the voltage generator 470 may apply a read voltage to the first word-line and may apply a read pass voltage to the unselected word-lines.

The page buffer circuit 430 may be coupled to the memory cell array 420 through the plurality of bit-lines BLs. The page buffer circuit 430 may include a plurality of page buffers. In some example embodiments, one page buffer may be connected to one bit-line. In some example embodiments, one page buffer may be connected to two or more bit-lines.

The page buffer circuit 430 may temporarily store data to be programmed in a selected page or data read out from the selected page.

The data I/O circuit 440 may be coupled to the page buffer circuit 430 through data lines DLs. During the program operation, the data input/output circuit 440 may receive the ECC sectors ECCSi and the outer parity bits OPRT or the ECC sectors ECCSi and inner parity bits IPRT from the storage controller 300 and may provide the ECC sectors ECCSi and the outer parity bits OPRT or the ECC sectors ECCSi and the inner parity bits IPRT to the page buffer circuit 430 based on the column address C_ADDR received from the control circuit 460.

During the read operation, the data I/O circuit 440 may provide the ECC sectors ECCSi and the outer parity bits OPRT or the ECC sectors ECCSi and the inner parity bits IPRT which are stored in the page buffer circuit 430, to the storage controller 300 based on the column address C_ADDR received from the control circuit 460.

The control circuit 460 may control the page buffer circuit 430 and data I/O circuit 440.

The control circuit 460 may include a status signal generator 465 and the status signal generator 465 may generate a status signal RnB indicating whether each of the program operation, the erase operation and the read operation is completed and/or is in progress.

The storage controller 300 may determine idle state or busy state of each of the nonvolatile memory devices 400a-400k based on the status signal RnB.

Figure 15:
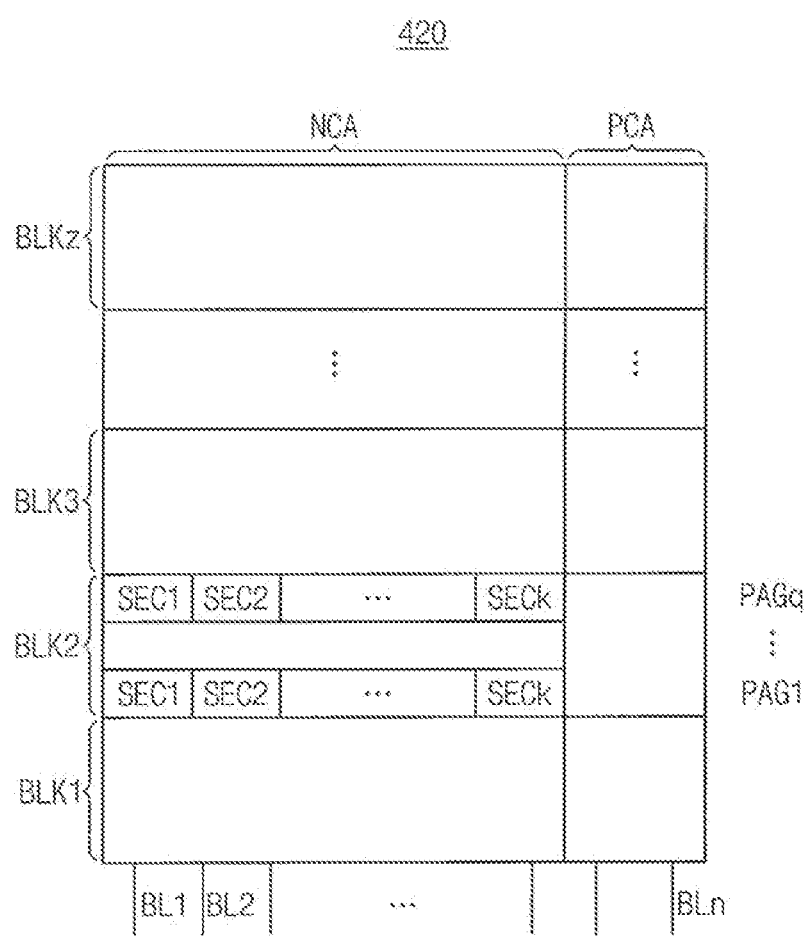
FIG. 15 is a block diagram illustrating an example of a memory cell array in the nonvolatile memory device of FIG. 11 according to example embodiments.

FIG. 15 is a block diagram illustrating an example of the memory cell array 420 in the nonvolatile memory device 400a of FIG. 11 according to example embodiments.

Referring to FIG. 15, the memory cell array 420 may include the plurality of memory blocks BLK1~BLKz. Each of the plurality of memory blocks BLK1~BLKz may include a plurality of pages PAG1~PAGq (q is an integer equal to or greater than 2).

The memory cell array 420 may include a normal cell region NCA to store the user data DTA and a parity cell region PCA to store the parity bits PRTi and the outer parity bits OPRT or the inner parity bits IPRT.

Memory cells of the normal cell region NCA and the parity cell region PCA may be coupled to first bit-lines BL1~BLn (n is an integer equal to or greater than 4). Each of the pages in the normal cell region NCA and the parity cell region PCA may include a plurality of sectors SEC1 through SECk (k is an integer equal to or greater than 3).

Figure 16:
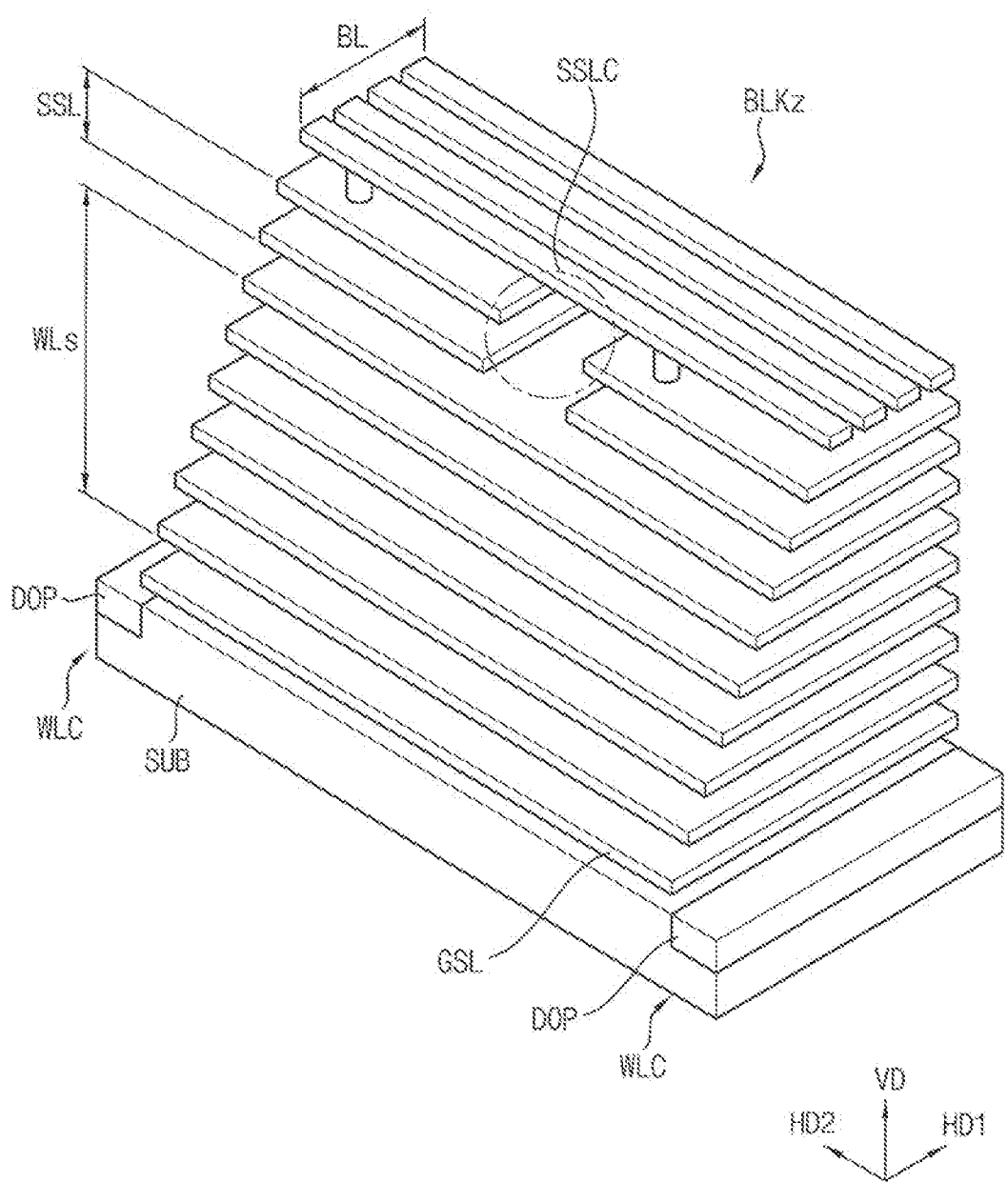
FIG. 16 is a perspective view illustrating a memory block of the memory cell array in FIG. 12.

FIG. 16 is a perspective view illustrating one of the memory blocks in FIG. 12.

Referring to FIG. 16, the memory block BLKz may be implemented such that at least one ground selection line GSL, a plurality of word-lines WLs and at least one string selection line SSL are stacked on a substrate between word-line cut regions WLC. Doping regions DOP may be formed in top portions of the substrate of the word-line cut regions WLC. The doping region may be used as common source lines CSL or common source nodes CSN to which a common source voltage is applied. The at least one string selection line SSL may be divided by a string selection line cut region SSLC extending in the first horizontal direction HD1.

A plurality of vertical channels or channel holes penetrate the at least one ground selection lines GSL, the plurality of word-lines WLs and the at least one string selection lines SSL. The at least one ground selection lines GSL, the plurality of word-lines WL and the at least one string selection lines SSL may be formed in the shape of planks. Bit-lines BL are connected to top surfaces of the channel holes.

Figure 17:
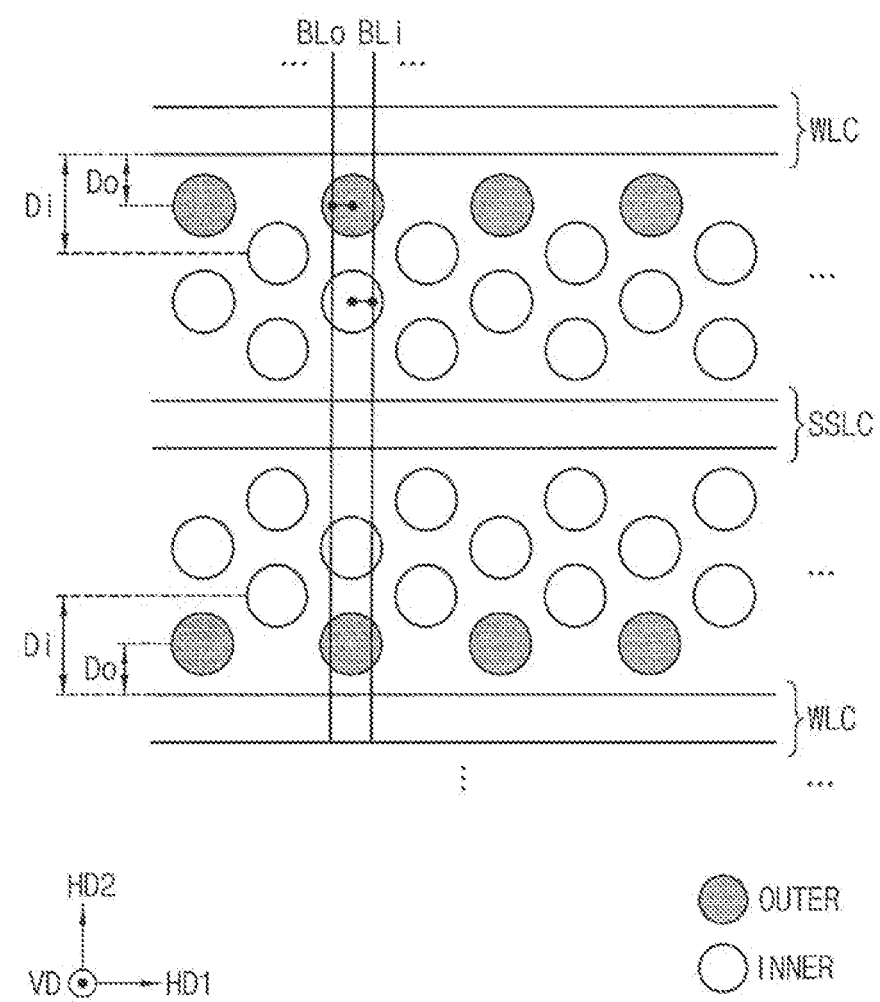
FIG. 17 is a top view of examples of the memory block of the memory cell array of FIG. 12.
Figure 18:
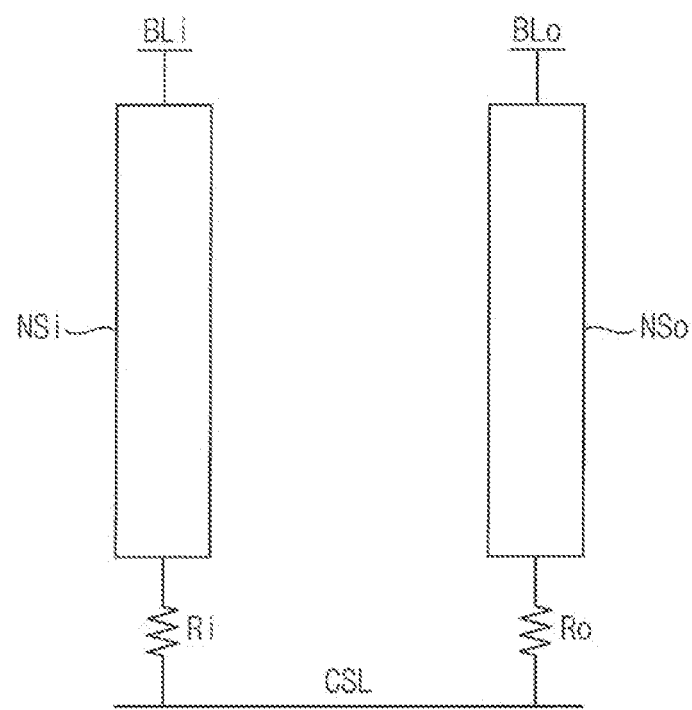
FIG. 18 is a circuit diagram illustrating connection relationship of NAND strings in the memory block in FIG. 17.

FIG. 17 is top views of examples of the memory block BLKz of FIG. 12 and FIG. 18 is a circuit diagram illustrating a connection relationship of NAND strings in the memory block BLKz in FIG. 17.

In FIG. 17, white circles represent inner cells or inner channel holes and dotted circles represent outer cells or outer channel holes. The common source lines corresponding to the doping region DOP in FIG. 16 are disposed in the word-line cut regions WLC.

Referring to FIG. 17, the channel holes may be formed in a zig-zag structure in the memory block BLKz. Through the zig-zag structure, the area of the memory block BLKz may be reduced. Outer channel holes and inner channel holes are disposed in the second horizontal direction HD2 between the adjacent two word-line cut regions WLC in the memory block BLKz. One of the inner channel holes and the outer channel hose may be connected to even-numbered bit-line and the other may be connected to odd-numbered bit-line. For convenience of illustration, only one bit-line pair BLo and BLi are illustrated and the other bit-lines are omitted in FIG. 17.

As illustrated in FIG. 17, the outer cells may be formed in the outer channel holes and the inner cells may be formed on the inner channel holes where a distance Do between the outer channel hole and the word-line cut region WLC is smaller than a distance Di between the inner channel hole and the word-line cut region WLC.

Referring to FIG. 18, an inner NAND string NSi is formed in the inner channel hole and an outer NAND string NSo is formed in the outer channel hole. One end of the inner NAND string NSi is connected to the inner bit-line BLi and the other end of the inner NAND string NSi is connected to the common source line CSL through an inner resistor Ri. One end of the outer NAND string NSo is connected to the outer bit-line BLo and the other end of the outer NAND string NSo is connected to the common source line CSL through an outer resistor Ro.

Since the distance Do between the outer channel hole and the word-line cut region WLC is smaller than a distance Di between the inner channel hole and the word-line cut region WLC as illustrated in FIG. 17, the resistance value of the inner resistor Ri is greater than the resistance value of the outer resistor Ro.

As such, the inner NAND string NSi and the outer NAND string NSo may be connected to the common source line CSL through the resistors Ri and Ro of the different resistance values. The inner cells in the inner NAND string NSi and the outer cells in the outer NAND string NSo may have different electrical characteristics due to the asymmetric connection structure of the inner NAND string NSi and the outer NAND string NSo. Such different electrical characteristics may result in the difference in the error bit levels. That is, a probability of error occurrence in the outer cells which are closer to the word-line cut region WLC than the inner cells is greater than a probability of error occurrence in the inner cells.

Figure 19A:
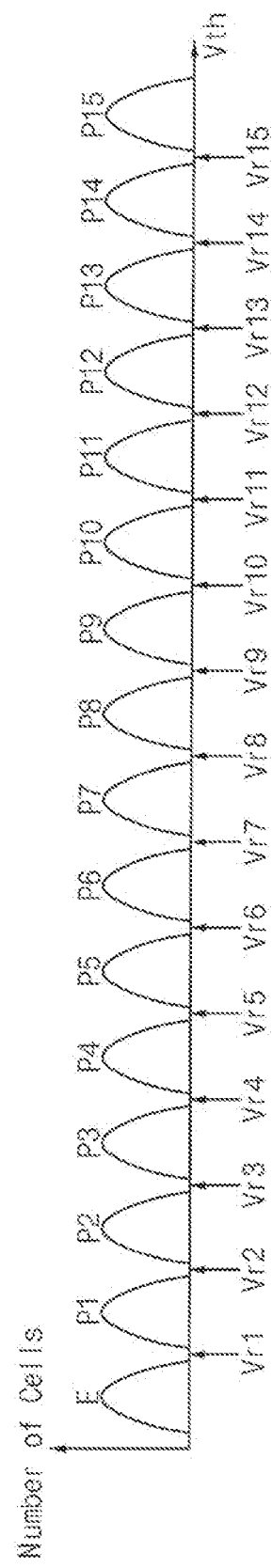
FIG. 19A is a graph showing a threshold voltage distribution of memory cells when a memory cell included in the memory cell array of the nonvolatile memory device in FIG. 11 is a 4-bit quadrature level cell.

FIG. 19A is a graph showing a threshold voltage distribution of memory cells when a memory cell included in the memory cell array in FIG. 11 is a 4-bit quadrature level cell (QLC).

Referring to FIG. 19A, a horizontal axis represents a threshold voltage Vth and the vertical axis represents the number of memory cells. When each of the memory cells is a 4-bit quadrature level cell programmed to store 4 bits, the memory cell may have one from among an erase state E and first through fifteenth program states P1 through P15. When a memory cell is a multi-level cell, unlike a single-level cell, since an interval between threshold voltages distributions is small, a small change in the threshold voltage Vth may cause a big problem.

A first read voltage Vr1 has a voltage level between a distribution of a memory cell having the erase state E and a distribution of a memory cell having the first program state P1. Each of second through fifteenth read voltages Vr2 through Vr15 have a voltage level between distributions of memory cells having adjacent program states.

In example embodiments, assuming that the first read voltage Vr1 is applied, when a memory cell is turned on, data '1' may be stored, and when the memory cell is turned off, data '0' may be stored. However, the present disclosures are not limited thereto, and other example embodiments, assuming that the first read voltage Vr1 is applied, when a memory cell is turned on, data '0' may be stored, and when the memory cell is turned off, data '1' may be stored. As such, a logic level of data may vary according to the present disclosures.

Figure 19B:
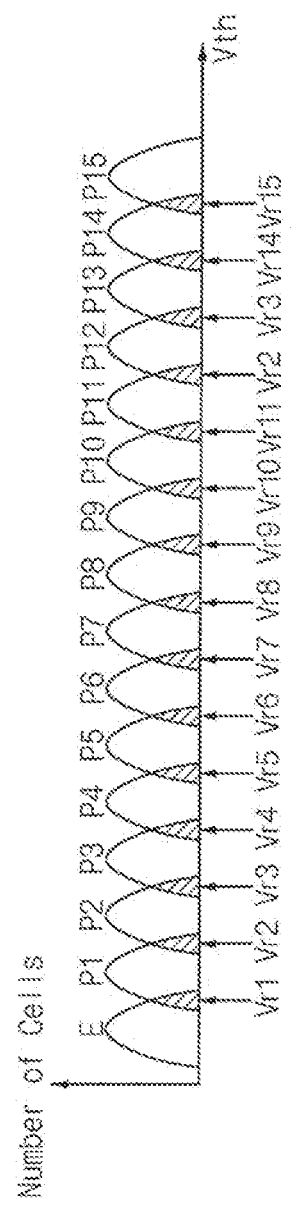
FIG. 19B and FIG. 19C are graphs showing cases where a threshold voltage of memory cells in the graph of FIG. 19A is changed, respectively.
Figure 19C:
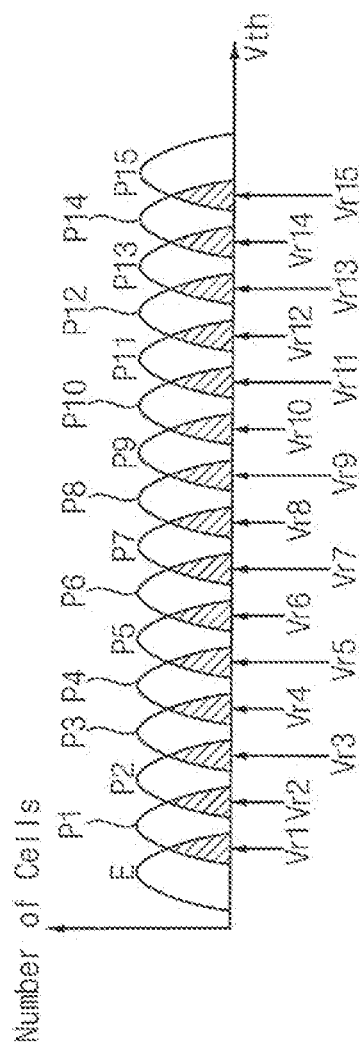

FIG. 19B and FIG. 19C are graphs showing cases where a threshold voltage of memory cells in the graph of FIG. 19A is changed, respectively.

FIG. 19B shows an example in which a threshold voltage of inner cells is changed and FIG. 19C shows an example in which a threshold voltage of outer cells is changed.

Referring to FIGS. 19B and 19C, memory cells respectively programmed to the erase state E and the first through fifteenth program states P1 through P15 may have a changed distribution as shown in FIGS. 19B and 19C according to a read environment. In FIGS. 19B and 19C, memory cells belonging to hatched portions may have read errors, thereby reducing the reliability of a nonvolatile memory device. Read errors in FIG. 19C may be more than read errors in FIG. 19B.

For example, when a read operation is performed on a memory device by using the first read voltage Vr1, although memory cells included in a hatched portion are programmed to the first program state P1, the memory cells may be determined to have the erase state E due to a decrease in the threshold voltage Vth. Accordingly, an error may occur in the read operation, thereby reducing the reliability of the nonvolatile memory device.

When data is read from the nonvolatile memory device 400a, a raw bit error rate (RBER) may vary according to a voltage level of a read voltage. An optimum or, alternatively, desirable voltage level of a read voltage may be determined according to a distribution pattern of the memory cells. Accordingly, as a distribution of the memory cells changes, an optimum or, alternatively, desirable voltage level of a read voltage needed to read data from the nonvolatile memory device may change.

Figures 19D, 20:
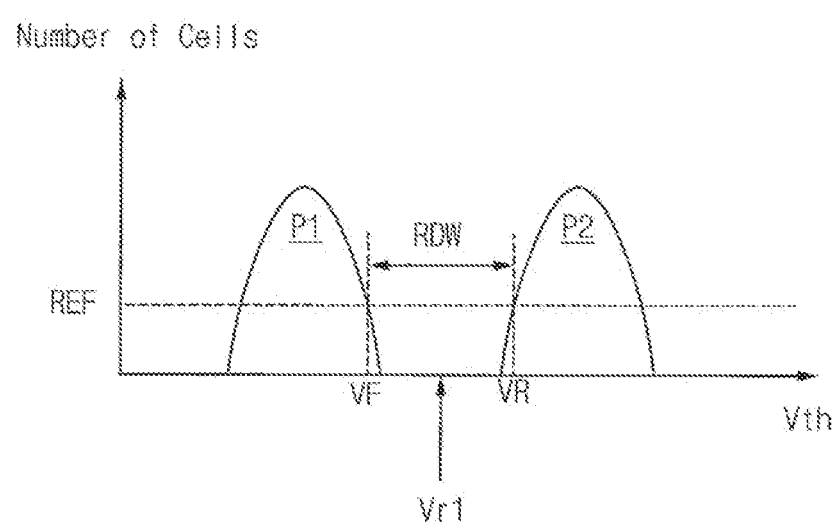
FIG. 19D illustrates a table for explaining bit mapping for programming memory cells according to example embodiments.
FIG. 20 is a graph showing enlarged first program states and second program states of the threshold voltage distribution of FIG. 19A.

FIG. 19D illustrates a table for explaining bit mapping for programming memory cells according to example embodiments.

For convenience of explanation, the example embodiment illustrated in FIG. 19D assumes a case where a memory cell is a QLC. However, in other example embodiments, the memory cell may be a different type other than a QLC.

Referring to FIG. 19D, when memory cells are QLCs, each of the memory cells may store at least significant bit (LSB), an extra significant bit (ESB), an upper significant bit (USB), and a most significant bit (MSB). Further referring to FIG. 15, LSBs stored in memory cells in a first row from among the memory cells connected to the word-line WL1 may form a first page, and MSBs stored therein may form a fourth page. USBs stored in the memory cells in the first row from among the memory cells connected to the word-line WL1 may form a third page, and ESB stored therein may form a second page.

FIG. 20 is a graph showing enlarged first and second program states P1 and P2 of FIG. 19A.

Referring to FIG. 20, a read window RDW between the first program state P1 and the second program state P2 may be defined as a difference between a fall voltage VF corresponding to the first program state P1 and a rise voltage VR corresponding to the second program state P2. Here, the fall voltage VF may represent a threshold voltage where the number of "off" cells corresponds to a reference number REF, based on an "off" cell count result for memory cells programmed to the first program state P1. The rise voltage VR may represent a threshold voltage where the number of "off" cells corresponds to the reference number REF, based on an "off" cell count result for memory cells programmed to the second program state P2. A read voltage Vr2 for determining the second program state P2 should have a voltage level within the read window RWD, and in order to decrease a read error, the read window RWD should be sufficiently widely secured.

Figure 21:
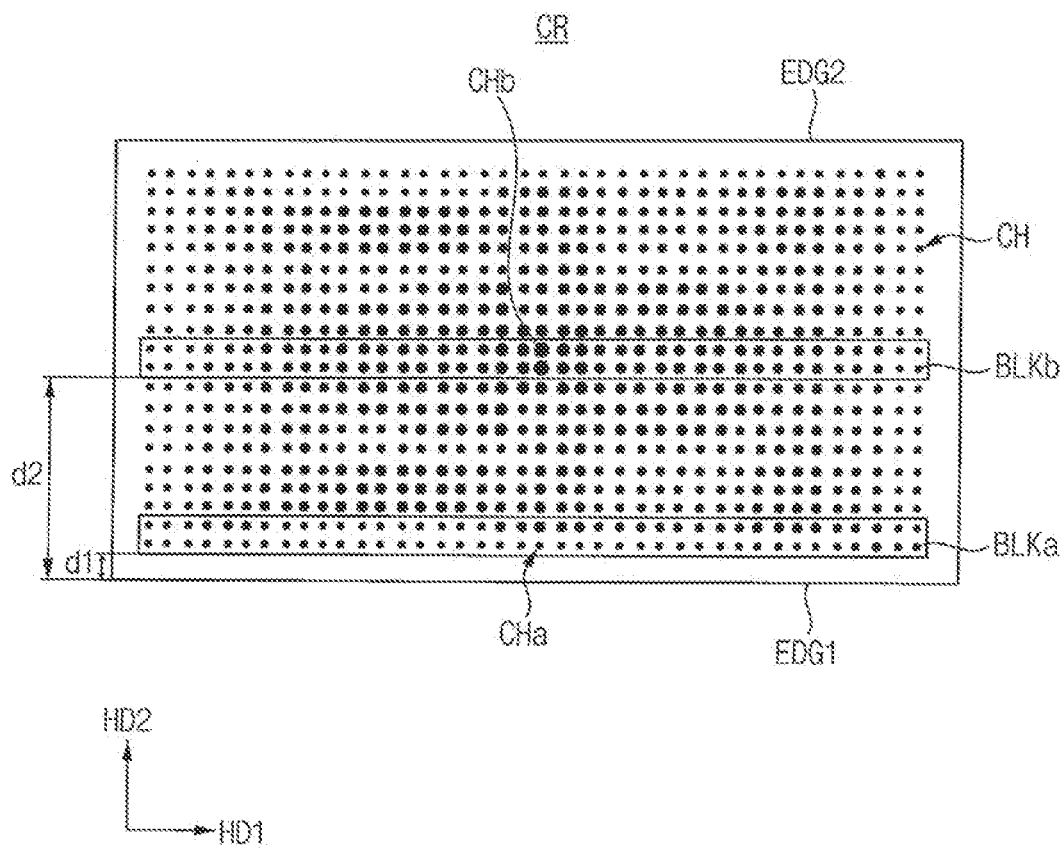
FIG. 21 illustrates a cell region in which the memory cell array of FIG. 12 is formed according to example embodiments.

FIG. 21 illustrates a cell region in which the memory cell array of FIG. 12 is formed according to example embodiments.

Referring to FIG. 21, a cell region CR includes a plurality of channel holes CH.

A channel hole size, for example, a channel hole diameter, may be varied according to positions within the cell region CR. For example, channel holes CH adjacent to a first edge EDG1 or a second edge EDG2 have a low peripheral density, and thus may have a different diameter from diameters of other channel holes CH that are not adjacent to the first edge EDG1 or the second edge EDG2. A memory block BLKa may be adjacent to the second edge EDG2, and may be spaced apart from the second edge EDG2 by a first distance d1. A memory block BLKb may not be adjacent to the first edge EDG1 or the second edge EDG2, and be in a center of the cell region CR, and may be spaced apart from the second edge EDG2 by a second distance d2. The second distance d2 may be greater than the first distance d1. A first diameter D1_C of a first channel hole CHa included in the memory block BLKa may be smaller than a second diameter D2_C of a second channel hole CHb included in the memory block BLKb.

Figure 22A:
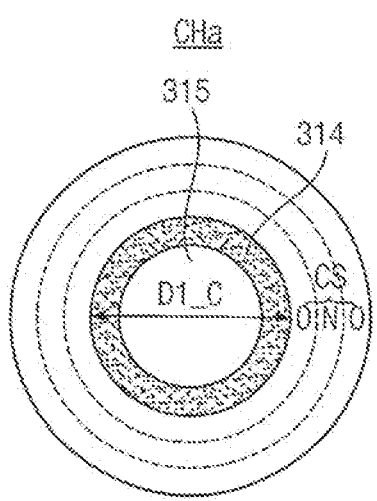
FIGS. 22A and 22B illustrate cross-sections of strings of the memory blocks of the memory cell array of FIG. 21, respectively.
Figure 22B:
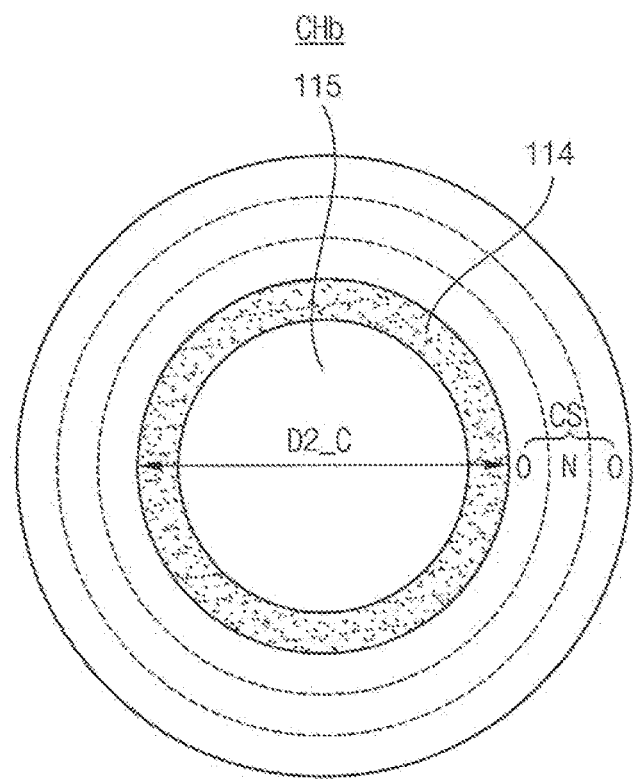

FIGS. 22A and 22B illustrate cross-sections of strings of the memory blocks BLKa and BLKb of FIG. 21, respectively.

Referring to FIG. 22A, a pillar including a channel layer 314 and an internal layer 315 may be formed in the first channel hole CHa included in the memory block BLKa, and a charge storage layer CS may be formed around the first channel hole CHa, and the charge storage layer CS may have an (oxide-nitride-oxide) ONO structure.

Referring to FIG. 22B, a pillar including a channel layer 314 and an internal layer 315 may be formed in the second channel hole CHb included in the memory block BLKb, and a charge storage layer CS may be formed around the second channel hole CHb, and the charge storage layer CS may have an ONO structure.

In an example embodiment, a thickness of the charge storage layer CS (i.e., a width in a radial direction) included in the memory block BLKb may be different from a thickness of the charge storage layer CS (i.e., a width in the radial direction) included in the memory block BLKa. Characteristics of memory cells may vary due to the difference in the channel hole diameters. For example, in a NAND flash nonvolatile memory device having a gate all around structure in which a gate electrode is disposed around a circumference of a channel hole, if a channel hole diameter is reduced, the magnitude of an electric field formed between a gate electrode and a channel region 314 is increased. Thus, program and erase speeds of a memory cell having a relatively small channel hole diameter like the first channel hole CHa may be higher than those of a memory cell having a relatively large channel hole diameter like the second channel hole CHb.

Referring back to FIG. 21, a memory block (e.g., BLKa, BLKb) is formed in the cell region CR to include all memory cells corresponding to one page in the first horizontal direction HD1, that is, in a word-line direction, and to include some strings in the second horizontal direction HD2, that is, in a bit-line direction. Thus, each memory block extends in the first horizontal direction HD1, and channel hole sizes, that is, channel hole diameters may differ in units of memory blocks. Thus, in the example illustrated in FIG. 21, program and erase speeds of memory cells included in the memory block BLKa may be higher than program and erase speeds of memory cells included in the memory block BLKb.

Figure 23:
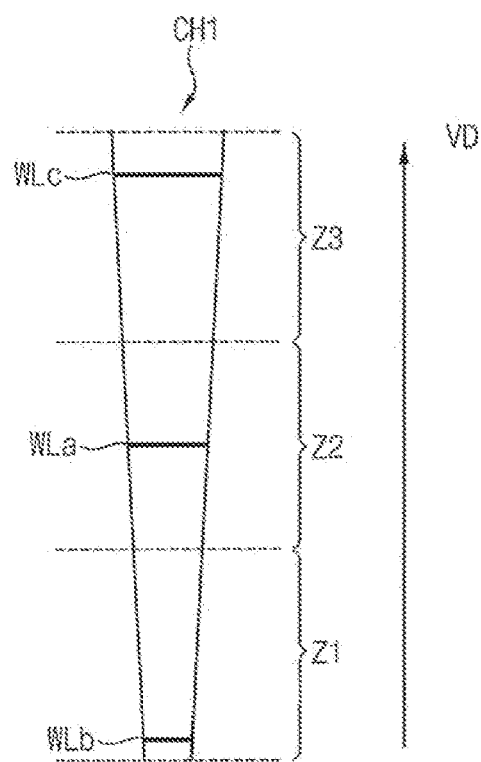
FIG. 23 illustrates an example of a vertical structure of a channel hole of a string in FIG. 21.

FIG. 23 illustrates an example of a vertical structure of a channel hole CH in FIG. 21.

Referring to FIG. 23, a channel hole CH1 corresponding to a string included in a nonvolatile memory device 400a is illustrated. As described above, the channel hole CH1 is formed by etching portions of gate electrodes and insulation layers stacked on a substrate, and thus, the channel hole CH1 may be a tapered etching profile where a diameter of the channel hole CH1 becomes smaller as a distance from the substrate decreases. Thus, a diameter of the channel hole CH1 may be smaller towards the substrate.

In an example embodiment, the channel hole CH1 may be divided into three zones according to channel hole diameters. For example, a zone in which a channel hole diameter is smaller than a first value may be referred to as a first zone Z1, and a zone in which a channel hole diameter is equal to or greater than the first value and smaller than a second value may be referred to as a second zone Z2, and a zone in which a channel hole diameter is equal to or greater than the second value and smaller than a third value may be referred to as a third zone Z3. Therefore, a characteristic of memory cells included in the channel hole CH1 may be different according to positions along the vertical direction VD.

A word-line WLb is provided in the first zone Z1, a word-line WLa is provided in the second zone Z2, and a word-line WLc is provided in the third zone Z3. Because the word-line WLb is adjacent to a lower edge of the channel hole CH1, the word-line WLb is adjacent to a ground selection line or the substrate, there is a probability of a bridge occurring between the word-line WLb and the channel. When the bridge occurs between the word-line WLb and the channel, a current leakage may occur through the bridge and program/read operation and erase operation may operate abnormally in the word-line WLb due to the bridge.

Because the word-line WLc is adjacent to an upper edge of the channel hole CH1, the word-line WLc is adjacent to a string selection line or the substrate, there is a probability of a bridge occurring between the word-line WLc and the channel.

An error occurrence probability of pages coupled to the word-line WLc which is adjacent to an upper edge of the channel hole CH1 or coupled to the word-line WLb which is adjacent to the lower edge of the channel hole CH1 may be greater than an error occurrence probability of pages coupled to the word-line WLa which is disposed at or near a center region of the channel hole CH1.

FIGS. 20 through 23 are for explaining that an error attribute of the target page may be different based on a location of the target word-line and an error occurrence probability of the target page may be different based on the error attribute.

Referring back to FIG. 3, the processor 310 in the storage controller 300 according to example embodiments, may apply different location indices to the plurality of NAND strings, respectively. In addition, the processor 310 may apply the same location index to at least two NAND strings sharing a same channel hole from among the plurality of channel holes, from among the plurality of NAND strings. In addition, the processor 310 may apply individual location indices to the plurality of memory blocks, respectively. In addition, the processor 310 may apply the location index to at least one word-line or a portion of word-lines including the inner cells and outer cells having difference of error occurrence probability.

Figure 24:
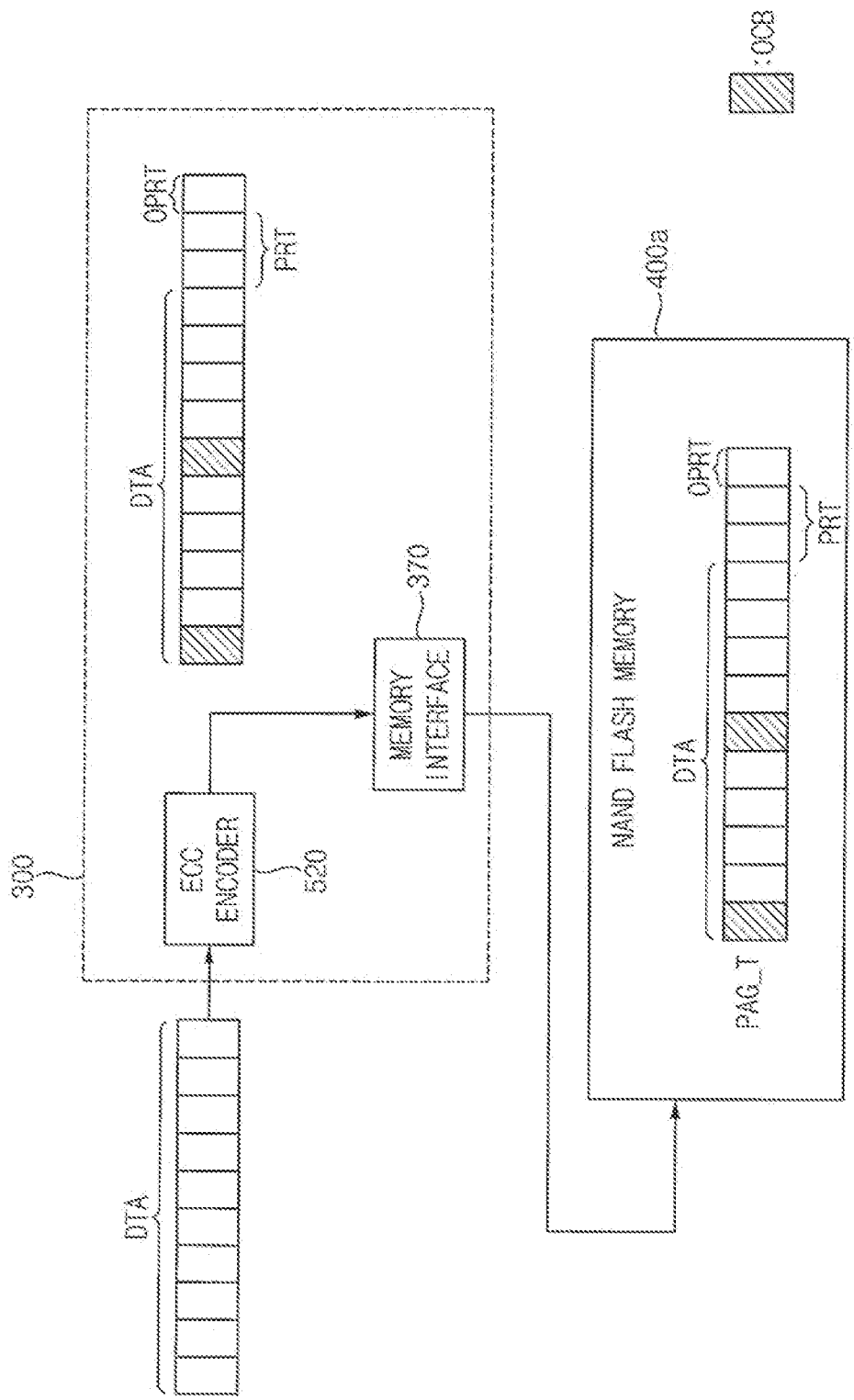
FIG. 24 illustrates a write operation of the storage controller of FIG. 4 according to example embodiments.

FIG. 24 illustrates a write operation of the storage controller 300 of FIG. 4 according to example embodiments.

Referring to FIG. 24, in a write operation on a target page PAG_T of the nonvolatile memory device 400a, the ECC encoder 420 in the storage controller 300 may perform a first ECC encoding operation on user data DTA including outer cell bits OCB to generate parity bits PRT and may perform a second ECC encoding operation on an outer ECC sector including outer cell bits OCB to generate outer parity bits OPRT. The storage controller 300 may transmit the user data DTA, the parity bits PRT and the outer parity bits OPRT to the nonvolatile memory device 400a through the memory interface 370. The nonvolatile memory device 400a may store (program) the user data DTA, the parity bits PRT and the outer parity bits OPRT in the target page PAG_T.

Figure 25:
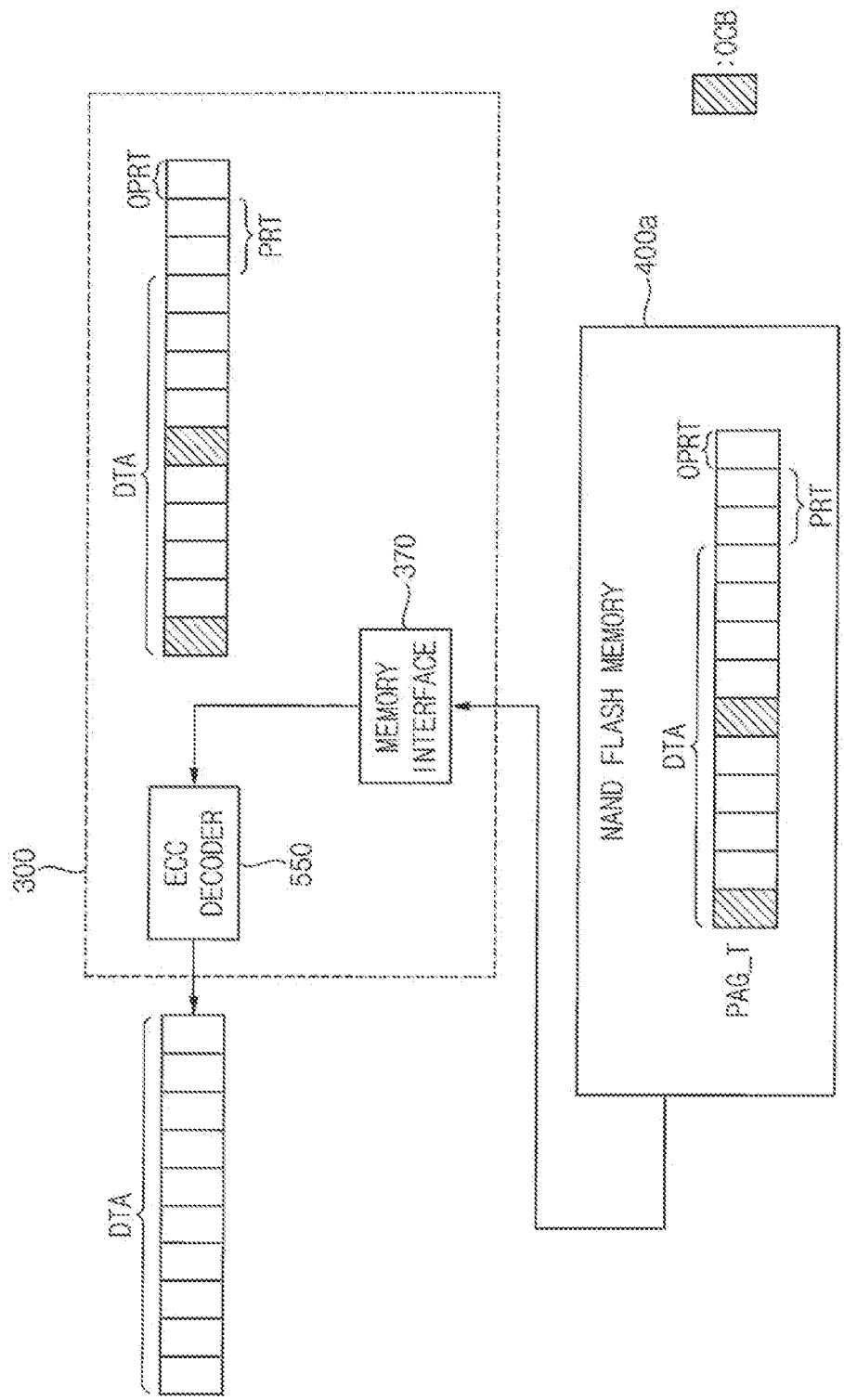
FIG. 25 illustrates a read operation of the storage controller of FIG. 4 according to example embodiments.

FIG. 25 illustrates a read operation of the storage controller 300 of FIG. 4 according to example embodiments.

Referring to FIG. 25, in a read operation on a target page PAG_T of the nonvolatile memory device 400a, the storage controller 300 may receive the user data DTA, the parity bits PRT and the outer parity bits OPRT read from the target page PAG_T through the memory interface 370 and the memory interface 370 may provide the user data DTA, the parity bits PRT and the outer parity bits OPRT to the ECC decoder 550. The ECC decoder 550 may perform a first ECC decoding operation on the user data DTA including outer cell bits OCB to generate the parity bits PRT. When at least one uncorrectable error is detected in the user data DTA based on a result of the first ECC decoding operation, the ECC decoder 550 may perform a second ECC decoding operation on the outer ECC sector including outer cell bits OCB based on the outer parity bits OPRT to correct errors which are not correctable by the first ECC decoding operation.

Figure 26:
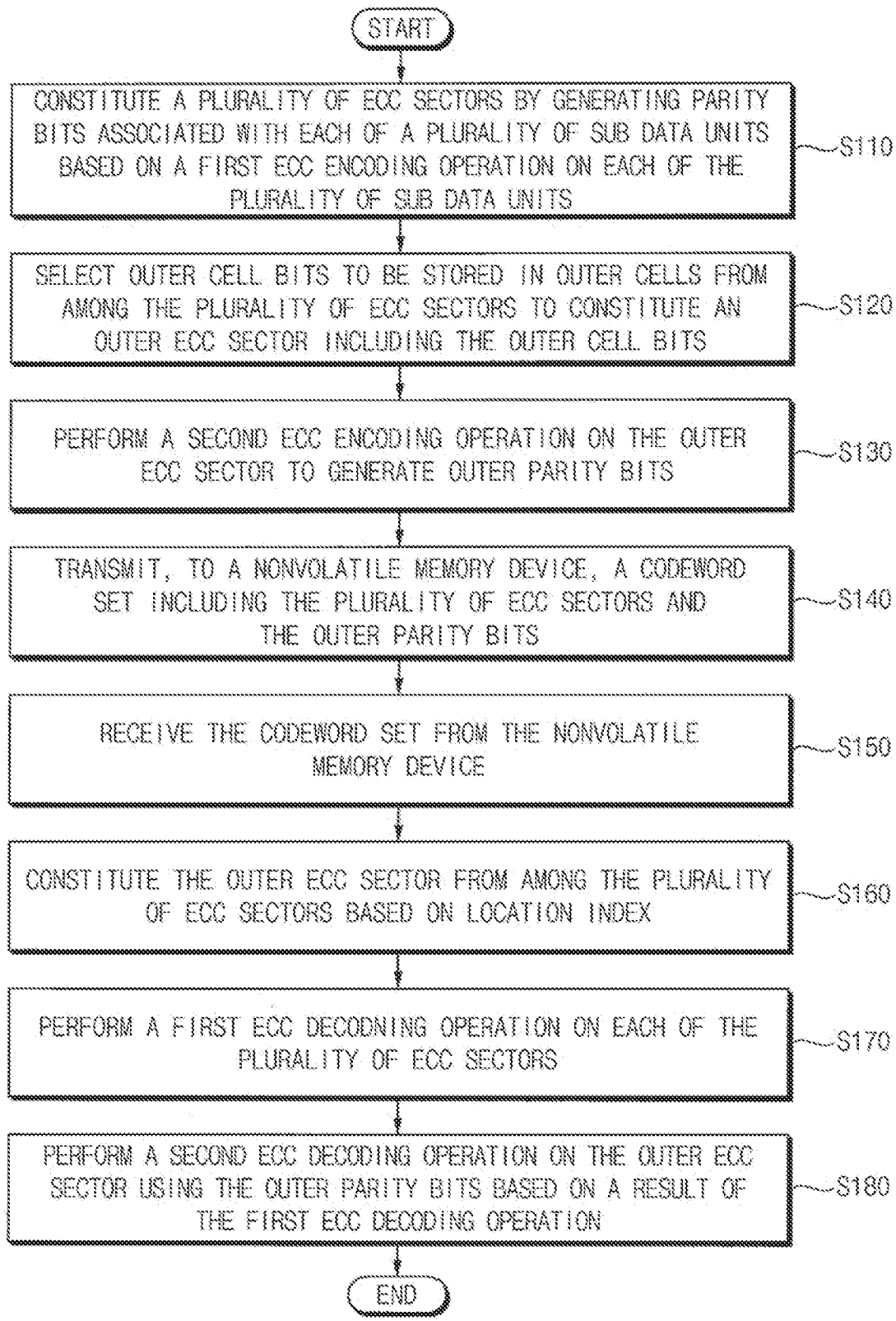
FIG. 26 is a flow chart illustrating a method of operating a storage device according to example embodiments.

FIG. 26 is a flow chart illustrating a method of operating a storage device 200 according to example embodiments.

Referring to FIGS. 1 through 26, there is provided a method of operating a storage device 200 including a nonvolatile memory device 400a which includes a memory cell array and a storage controller 300 to control the nonvolatile memory device 400a, where the memory cell array includes a plurality of word-lines stacked on a substrate, a plurality of memory cells provided in a plurality of channel holes extending in a vertical direction with respect to the substrate and a word-line cut region extending in a first horizontal direction and dividing the plurality of word-lines into a plurality of memory blocks.

According to the method, an ECC encoder 520 in the storage controller 300, in a write operation on target memory cells in a target page coupled to a target word-line from among the plurality of word-lines, performs a first encoding operation on each of a plurality of sub data units SDUi in user data DTA to generate a plurality of ECC sectors ECCSi based on the plurality of sub data units SDUi and parity bits PRTi generated based on the first ECC decoding operation and associated with each of the plurality of sub data units SDUi (operation S110).

The ECC encoder 520 selects outer cell bits OCB to be stored in outer cells from among the target memory cells, from among the plurality of ECC sectors ECCSi to constitute an outer ECC sector OECCS including the outer cell bits OCB (operation S120) based on a location index LIDX grouping the plurality of memory cells coupled to each of the plurality of word-lines into the outer cells and inner cells according to a distance from the word-line cut region. The ECC encoder 520 generates the outer ECC sector OECCS based on the outer cell bits OCB.

The ECC encoder 520 performs a second ECC encoding operation on the outer ECC sector OECCS to generate outer parity bits OPRT (operation S130).

A memory interface 370 in the storage controller 300 transmits, to the nonvolatile memory device 400a, a codeword set SCW including the plurality of ECC sectors ECCSi and the outer parity bits OPRT (operation S140).

The storage controller 300, in a read operation on the target page, receives a codeword set SCW from the nonvolatile memory device 400a (operation S150). The codeword set SCW includes the plurality of ECC sectors ECCSi and the outer parity bits OPRT from the nonvolatile memory device 400a.

A data selector 580 may constitute (or generate) the outer ECC sector OECCS from the plurality of ECC sectors ECCSi based on the location index LIDX (operation S160).

An ECC decoder 550 in the storage controller 300 performs a first ECC decoding operation on each of the plurality of ECC sectors ECCSi (operation S170).

The ECC decoder 550 performs a second ECC decoding operation on the outer ECC sector OECCS using the outer parity bits OPRT, based on a result of the first ECC decoding operation (operation S180) and may correct at least one uncorrectable error that is not correctable by the first ECC decoding operation when the at least one uncorrectable error is detected in at least one of the plurality of ECC sectors ECCSi by the first ECC decoding operation.

Figure 27:
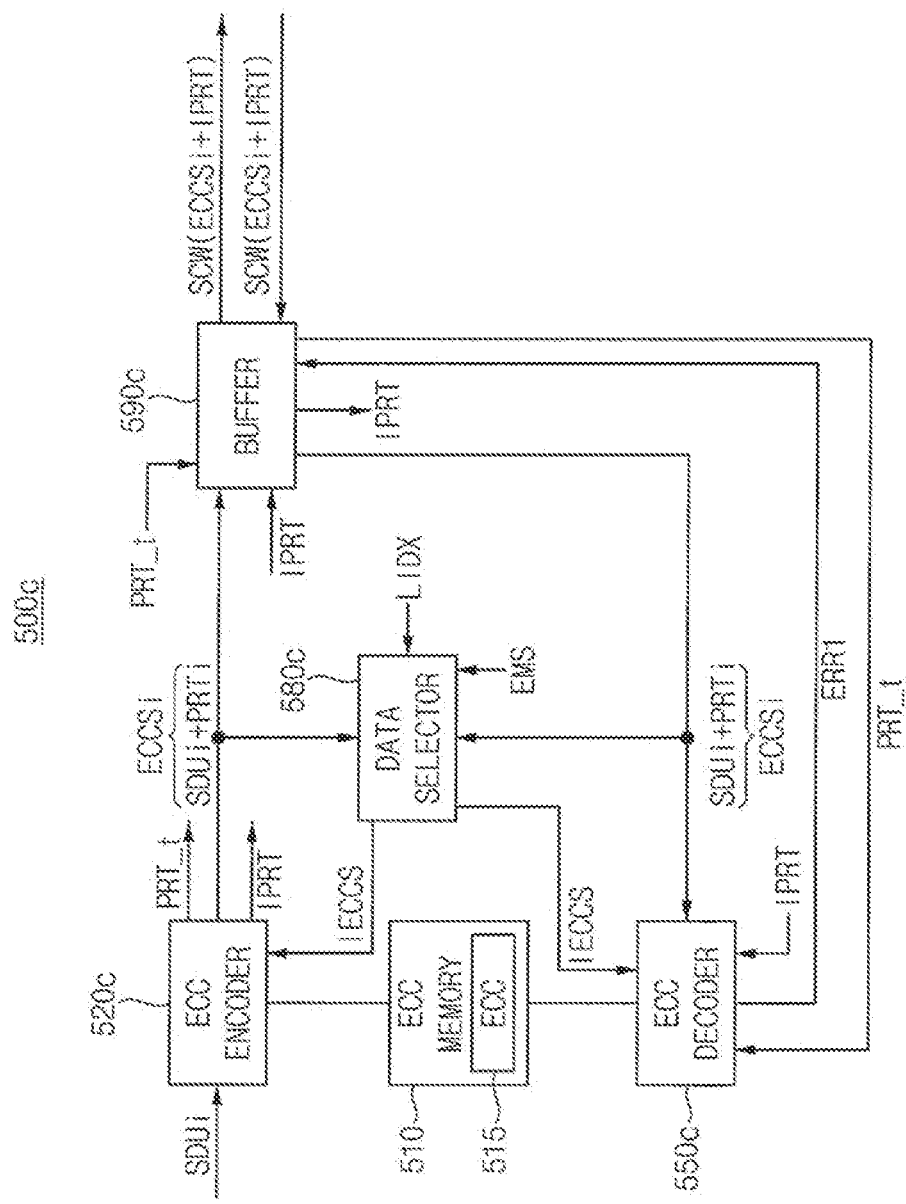
FIG. 27 is a block diagram illustrating an example of an ECC engine in the storage controller of FIG. 4 according to example embodiments.

FIG. 27 is a block diagram illustrating an example of an ECC engine 500 in the storage controller 300 of FIG. 4 according to example embodiments.

Referring to FIG. 27, the ECC engine may be an ECC engine 500c. The ECC engine 500c may include an ECC memory 510 that stores an ECC 515, an ECC encoder 520c, an ECC decoder 550c, a data selector 580c and a buffer 590c.

The ECC encoder 520c is connected to the ECC memory 510. The ECC encoder 520c, in a write operation on target memory cells in a target page coupled to a target word-line, may perform a first ECC encoding operation on each of a plurality sub data units SDUi in user data to generate parity bits PRTi associated with each of the sub data units SDUi by using the ECC 515 and generate a plurality of ECC sectors ECCSi based on the plurality of sub data units SDUi and the parity bits PRTi, and may provide the plurality of ECC sectors ECCSi to the data selector 580c and the buffer 590c. Each of the ECC sectors ECCSi may include a respective one of the sub data units SDUi and a respective one of the parity bits PRTi. In some example embodiments, the respective one of the parity bits PRTi may itself include plural parity bits. In addition, the ECC encoder 520c may perform an ECC encoding on all of the plurality of sub data units SDUi to generate total parity bits PRT_t and may provide the total parity bits PRT_t to the buffer 590c.

The data selector 580c, based on the error correction mode signal EMS and the location index LIDX, may select a portion of inner cell bits from among inner cell bits in each of the sub data units SDUi to constitute an inner ECC sector IECCS to provide the inner ECC sector IECCS to the ECC encoder 520c in the second error correction mode.

The ECC encoder 520c may perform a second ECC encoding operation on the inner ECC sector IECCS to generate inner parity bits IPRT and may provide the inner parity bits IPRT to the buffer 590c.

The buffer 590c may provide the nonvolatile memory device 400a with a codeword set SCW including the inner parity bits IPRT and the ECC sectors ECCSi including the sub data units SDUi and the parity bits PRTi through the memory interface 370.

The buffer 590c, in a read operation on the target memory cells, may receive the codeword set SCW including the inner parity bits IPRT and the ECC sectors ECCSi including the sub data units SDUi and the parity bits PRTi through the memory interface 370 from the nonvolatile memory device 400a, may provide the ECC sectors ECCSi to the ECC decoder 550c and may provide the ECC sectors ECCSi to the data selector 580c.

The data selector 580c, based on the error correction mode signal EMS and the location index LIDX, may select the inner cell bits from among inner cell bits in each of sub data units SDUi to constitute the inner ECC sector IECCS to provide the inner ECC sector IECCS to the ECC encoder 520c in the second error correction mode.

The ECC decoder 550c is connected to the ECC memory 510. The ECC decoder 550c, in a read operation on the target memory cells, may perform a first ECC decoding operation on the inner ECC sector IECCS based in the inner parity bits IPRT by using the ECC 515 to correct a correctable error in the inner ECC sector IECCS, may perform a second ECC decoding operation on each of the plurality of ECC sectors ECCSi by using the ECC 515 to correct a correctable error in each of the plurality of ECC sectors ECCSi. By performing the first ECC decoding operation on the inner ECC sector IECCS whose error occurrence probability is relatively smaller than an error occurrence probability of each of the plurality of ECC sectors ECCSi, prior to the second ECC decoding operation, and by performing the second ECC decoding operation on the plurality of ECC sectors ECCSi on which a result of the first ECC decoding operation is reflected, an error correction capability may be enhanced.

In response to detecting at least one uncorrectable error in at least one of the plurality of ECC sectors ECCSi according to a result of the second ECC decoding operation, the ECC decoder 550c may provide the buffer 580c with an error flag ERR1 indicating that at least one uncorrectable error is detected in at least one of plurality of ECC sectors ECCSi based on a result of the second ECC decoding operation.

The buffer 590c may provide the ECC decoder 550c with the total parity bits PRT_t associated with all of the plurality of ECC sectors ECCSi, in response to the error flag ERR1.

The ECC decoder 550c may perform a third ECC decoding operation on all of the plurality of ECC sectors ECCSi based on the total parity bits PRT_t to correct a correctable error in at least a portion of the sub data units SDUi.

A unit of the first ECC decoding operation may be the same as a unit of the second ECC decoding operation. A unit of the third ECC decoding operation may be greater than the unit of the second ECC decoding operation.

Figure 28:
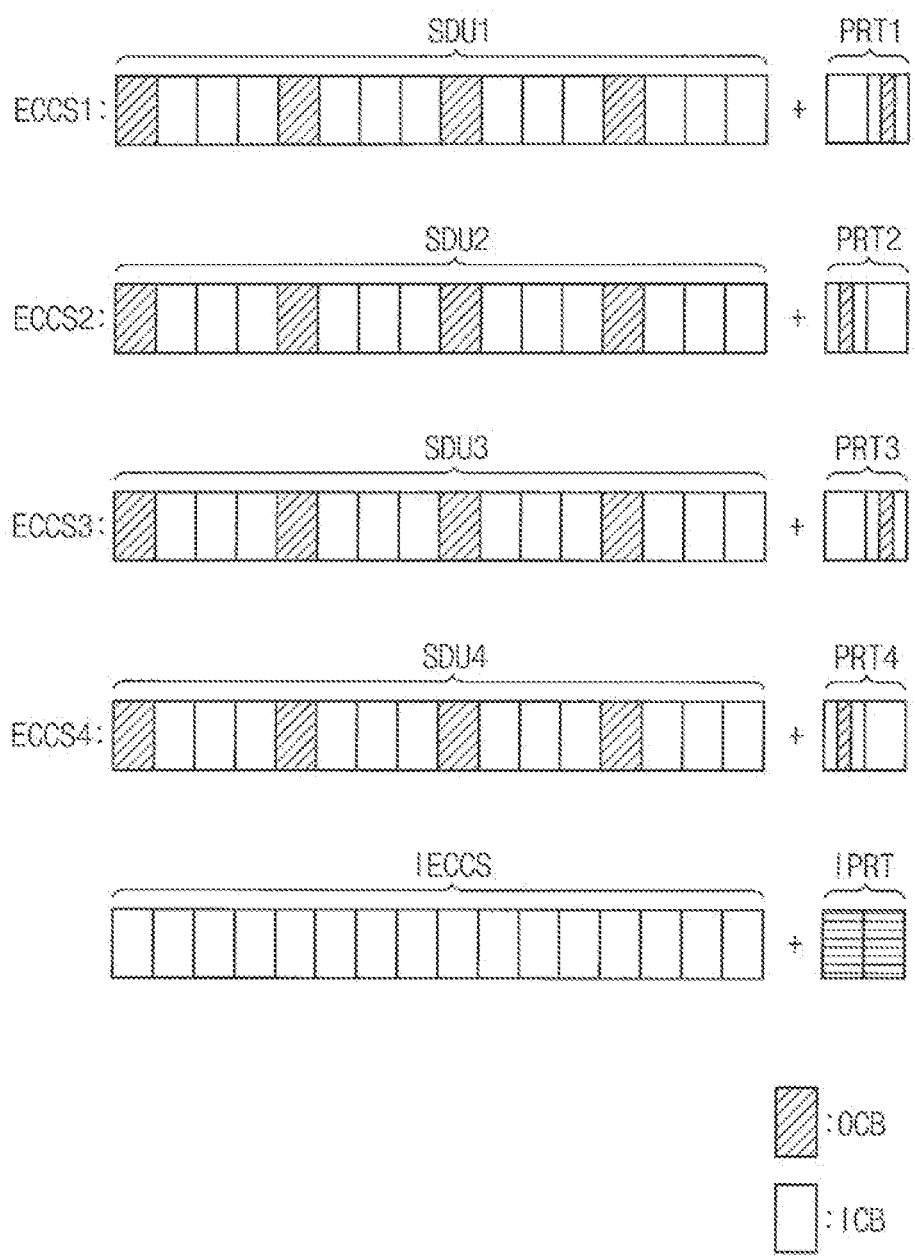
FIG. 28 illustrates an example operation of an ECC encoder of the ECC engine in FIG. 27 according to example embodiments.

FIG. 28 illustrates an example operation of the ECC encoder 520c in FIG. 27 according to example embodiments.

In FIG. 28, it is assumed that the user data includes a first sub data unit SDU1, a second sub data unit SDU2, a third sub data unit SDU3, and a fourth sub data unit SDU4. Each of the first, second, third and fourth sub data units SDU1, SDU2, SDU3 and SDU4 may include inner cell bits ICB and outer cell bits OCB.

Referring to FIGS. 27 and 28, the ECC encoder 520c, using the ECC 515, may perform a first ECC encoding operation on the first sub data unit SDU1 to generate first parity bits PRT1 and may constitute a first ECC sector ECCS1 including the first sub data unit SDU1 and the first parity bits PRT1.

The ECC encoder 520c, using the ECC 515, may perform a first ECC encoding operation on the second sub data unit SDU2 to generate second parity bits PRT2 and may constitute a second ECC sector ECCS2 including the second sub data unit SDU2 and the second parity bits PRT2.

The ECC encoder 520c, using the ECC 515, may perform a first ECC encoding operation on the third sub data unit SDU3 to generate third parity bits PRT3 and may constitute a third ECC sector ECCS3 including the third sub data unit SDU3 and the third parity bits PRT3.

The ECC encoder 520c, using the ECC 515, may perform a first ECC encoding operation on the fourth sub data unit SDU4 to generate fourth parity bits PRT4 and may constitute a fourth ECC sector ECCS4 including the fourth sub data unit SDU4 and the fourth parity bits PRT4.

The ECC encoder 520c may perform the first ECC encoding operation on the first, second, third and fourth sub data units SDU1, SDU2, SDU3 and SDU4 sequentially or in parallel.

The ECC encoder 520c may select a portion of the inner cell bits ICB in each of the first through fourth sub data units SDU1, SDU2, SDU3 and SDU4 to constitute an inner ECC sector IECCS based on the inner cell bits ICB and may perform a second ECC operation on the inner ECC sector IECCS to generate the inner parity bits IPRT.

Each of the first through fourth parity bits PRT1, PRT2, PRT3 and PRT4 may include inner cell bits and outer cell bits.

Figure 29:
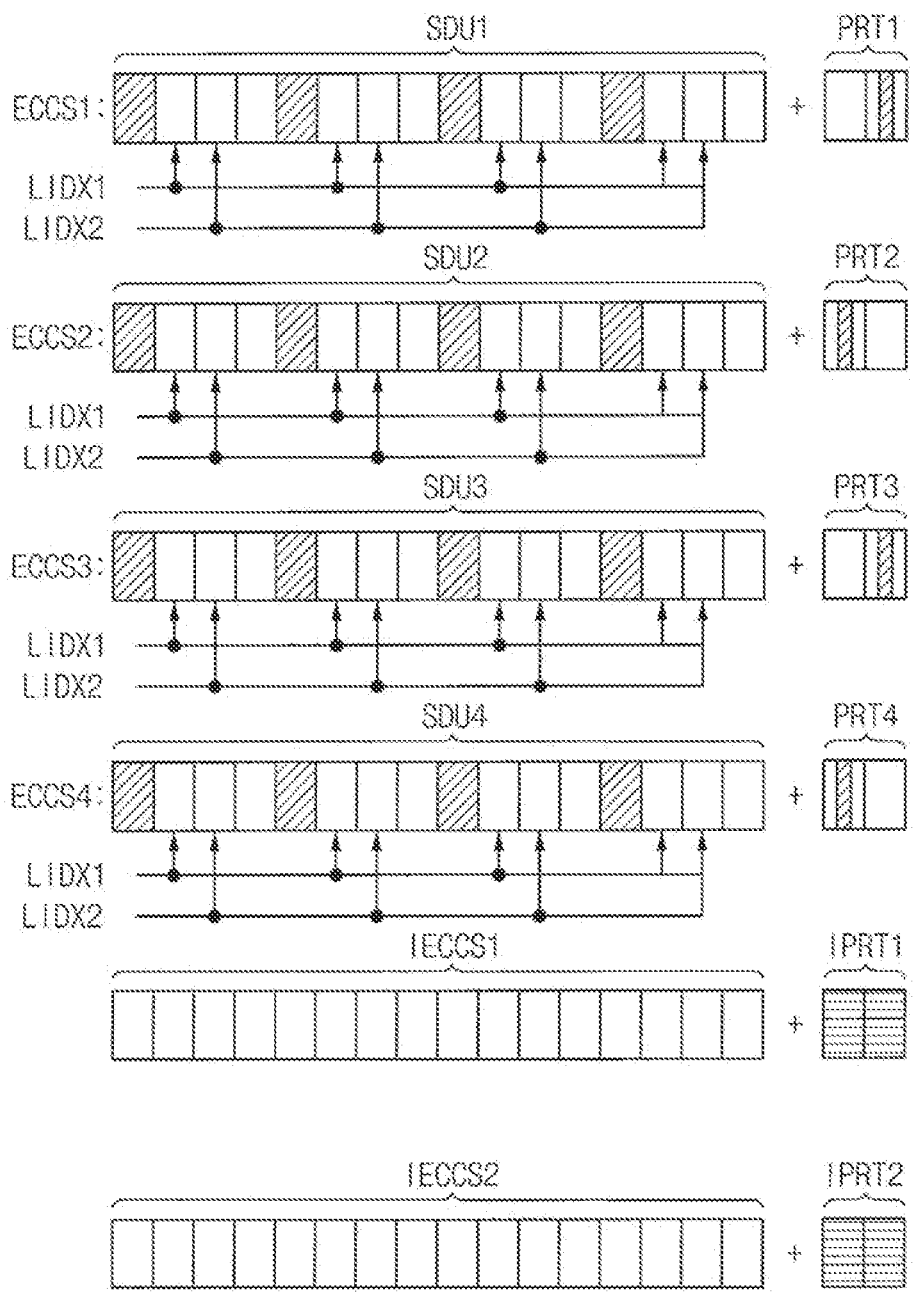
FIG. 29 illustrates an example operation of the ECC encoder of the ECC engine in FIG. 27 according to example embodiments.

FIG. 29 illustrates an example operation of the ECC encoder 520c in FIG. 27 according to example embodiments.

In FIG. 29, descriptions repeated with FIG. 28 will be omitted.

Referring to FIGS. 27 and 29, the ECC encoder 520c may constitute (or, generate) a first inner ECC sector IECCS1 based on the inner cell bits ICB associated with a first location index LIDX1 of each of the first through fourth sub data units SDU1, SDU2, SDU3 and SDU4, and may perform a second ECC encoding operation on the first inner ECC sector IECCS1 to generate first inner parity bits IPRT1.

The ECC encoder 520c may constitute (or, generate) a second inner ECC sector IECCS2 based on the inner cell bits ICB associated with a second location index LIDX2 of each of the first through fourth sub data units SDU1, SDU2, SDU3 and SDU4, and may perform a second ECC encoding operation on the second inner ECC sector IECCS2 to generate second inner parity bits IPRT2.

Figure 30:
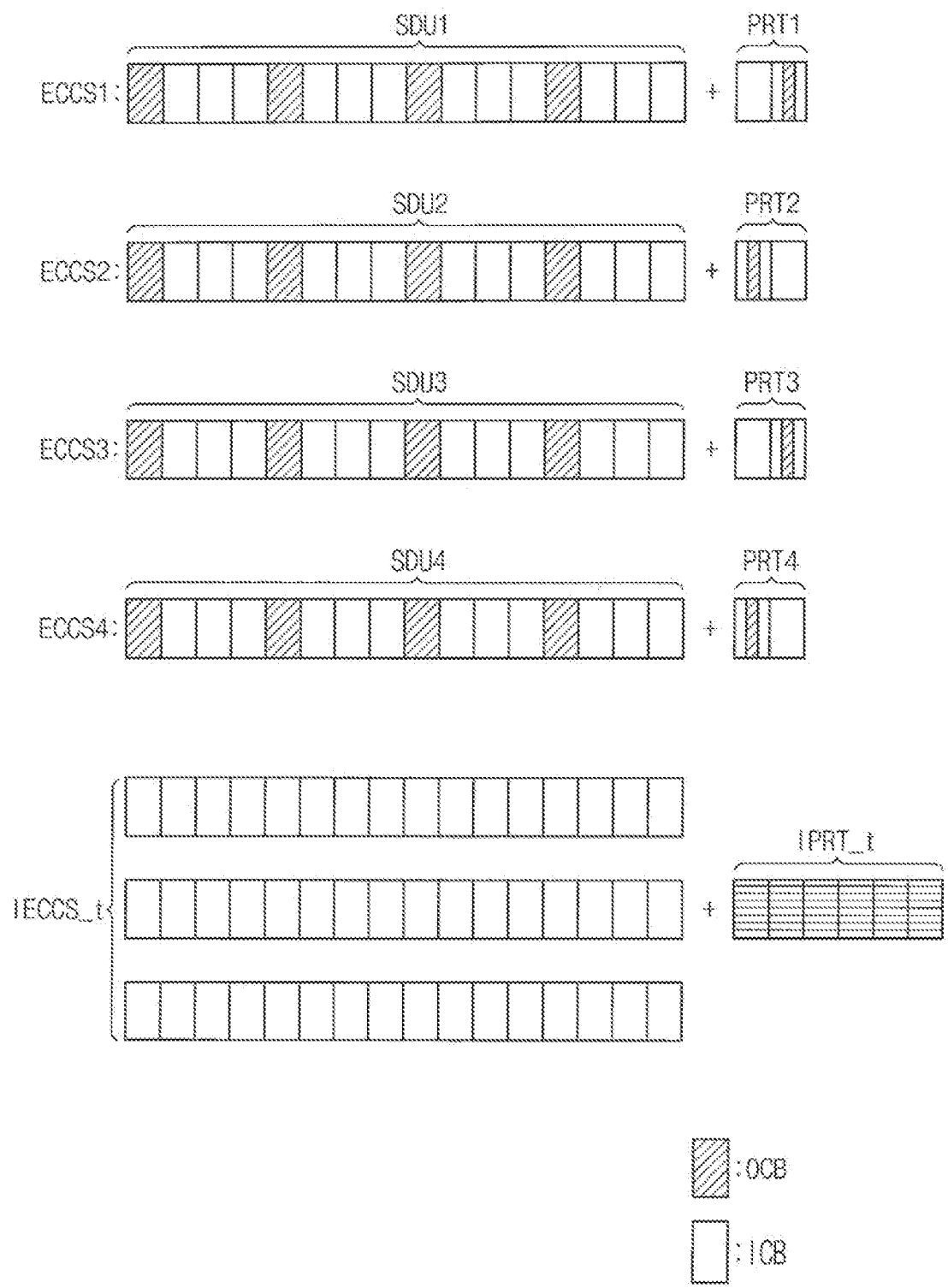
FIG. 30 illustrates an example operation of the ECC encoder of the ECC engine in FIG. 27 according to example embodiments.

FIG. 30 illustrates an example operation of the ECC encoder 520c in FIG. 27 according to example embodiments.

In FIG. 30, descriptions repeated with FIG. 28 will be omitted.

Referring to FIGS. 27 and 30, the ECC encoder 520c may constitute (or, generate) a total inner ECC sector IECCS_t based on all of the inner cell bits ICB in each of the first through fourth sub data units SDU1, SDU2, SDU3 and SDU4, and may perform an ECC encoding operation on the total inner ECC sector IECCS_t to generate the total inner parity bits IPRT_t.

Figure 31:
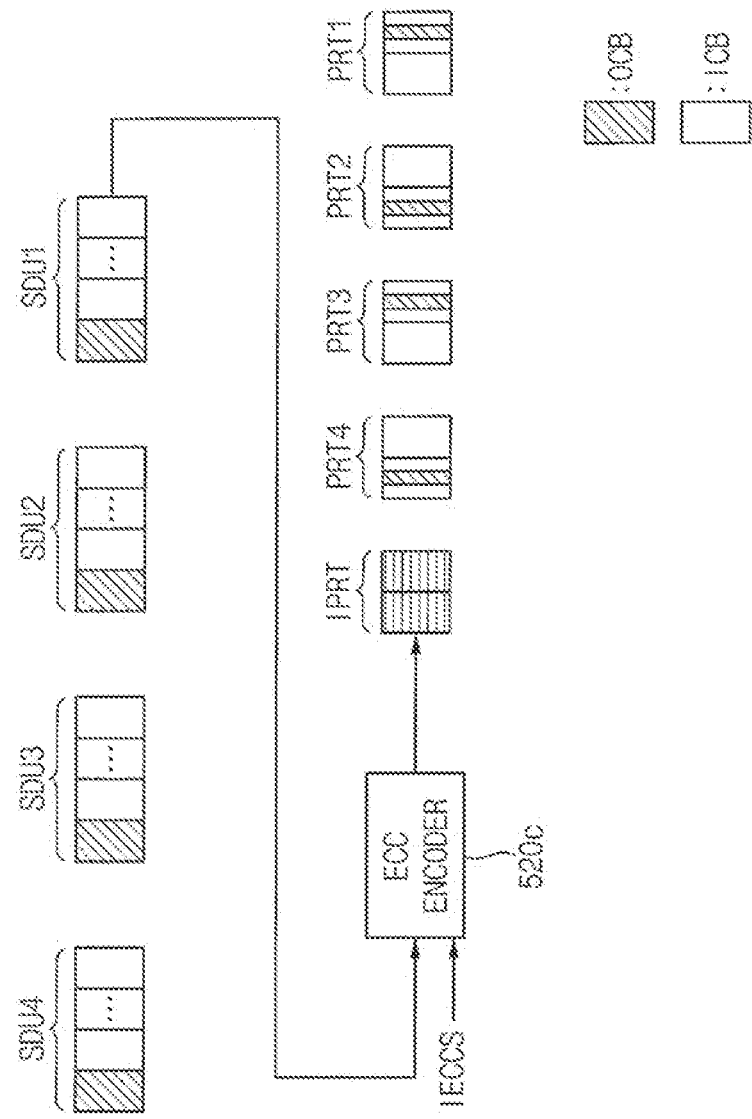
FIG. 31 illustrates an example in which the ECC encoder of the ECC engine in FIG. 27 performs the first ECC encoding operation on a plurality of sub data units sequentially.

FIG. 31 illustrates an example in which the ECC encoder 520c in FIG. 27 performs the first ECC encoding operation on the plurality of sub data units sequentially.

Referring to FIG. 31, the ECC encoder 520c may perform the first ECC encoding operation on each of the first through fourth sub data units SDU1, SDU2, SDU3 and SDU4 including the inner cell bits ICB respectively, to generate the first through fourth parity bits PRT1, PRT2, PRT3 and PRT4 sequentially. In addition, the ECC encoder 520c may constitute the inner ECC sector IECCS based on the inner cell bits ICB in each of the first through fourth sub data units SDU1, SDU2, SDU3 and SDU4 and may perform the second ECC operation on the inner ECC sector IECCS to generate the inner parity bits IPRT.

Figure 32:
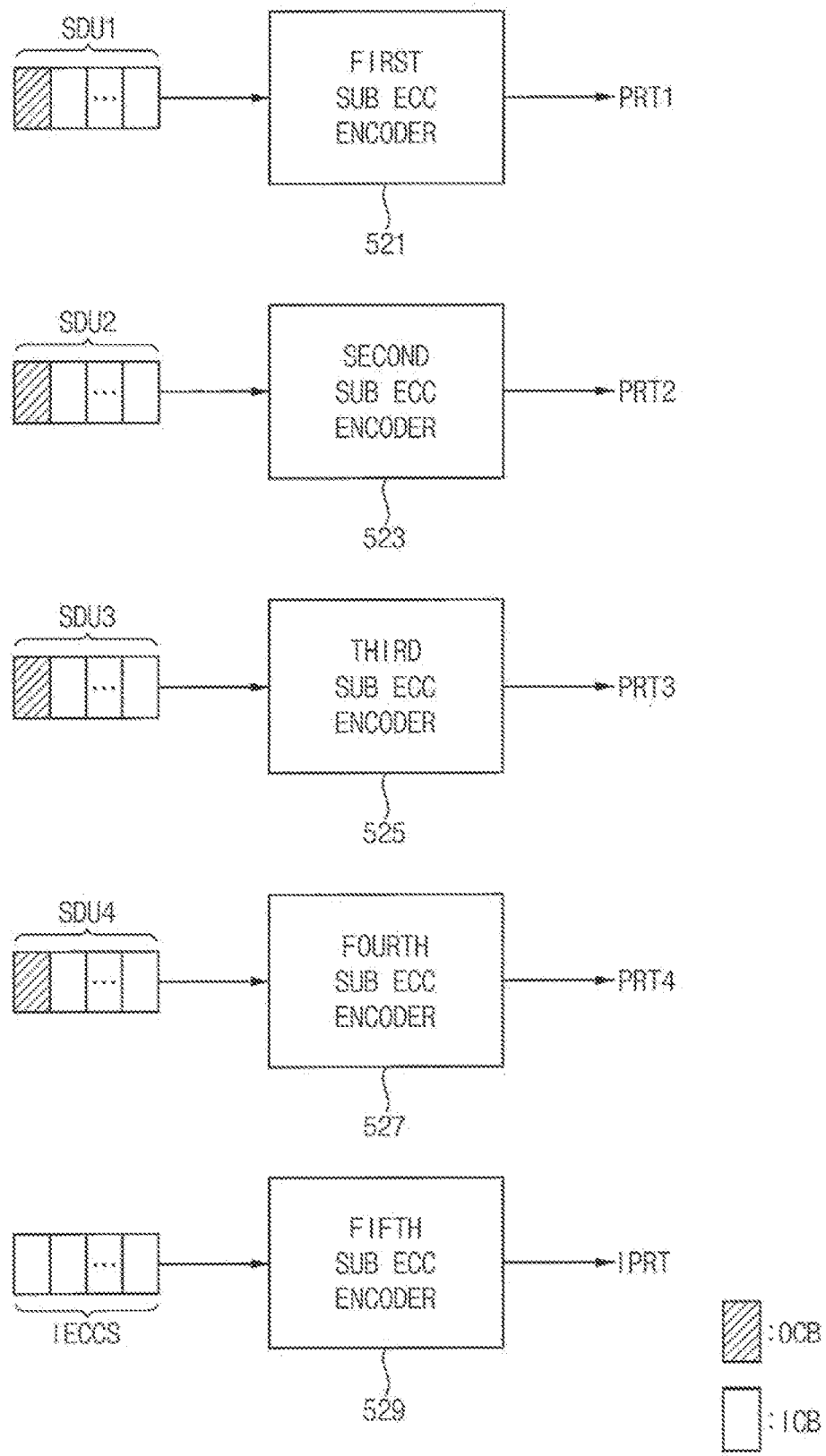
FIG. 32 illustrates an example in which the ECC encoder of the ECC engine in FIG. 27 performs the first ECC encoding operation on the plurality of sub data units in parallel.

FIG. 32 illustrates an example in which the ECC encoder 520c in FIG. 27 performs the first ECC encoding operation on the plurality of sub data units in parallel.

Referring to FIG. 32, the ECC encoder 520 may be an ECC encoder 520ca. The ECC encoder 520ca may include a first sub ECC encoder 521, a second sub ECC encoder 523, a third sub ECC encoder 525, a fourth sub ECC encoder 527, and a fifth sub ECC encoder 529.

Each of the first through fifth sub ECC encoders 521, 523, 525, 527 and 529 may be connected to the ECC 515 in FIG. 27. Each of the first through fourth sub ECC encoders 521, 523, 525 and 527 may perform the first ECC encoding operation on a respective one of the first through fourth sub data units SDU1, SDU2, SDU3 and SDU4 including the inner cell bits ICB respectively, in parallel to generate the first through fourth parity bits PRT1, PRT2, PRT3 and PRT4 in parallel. The fifth sub ECC encoder 529 may perform the second ECC encoding operation on the inner ECC sector IECCS including the inner cell bits ICB in each of the first through fourth sub data units SDU1, SDU2, SDU3 and SDU4 in parallel with the first ECC encoding operation to generate the inner parity bits IPRT.

Figure 33:
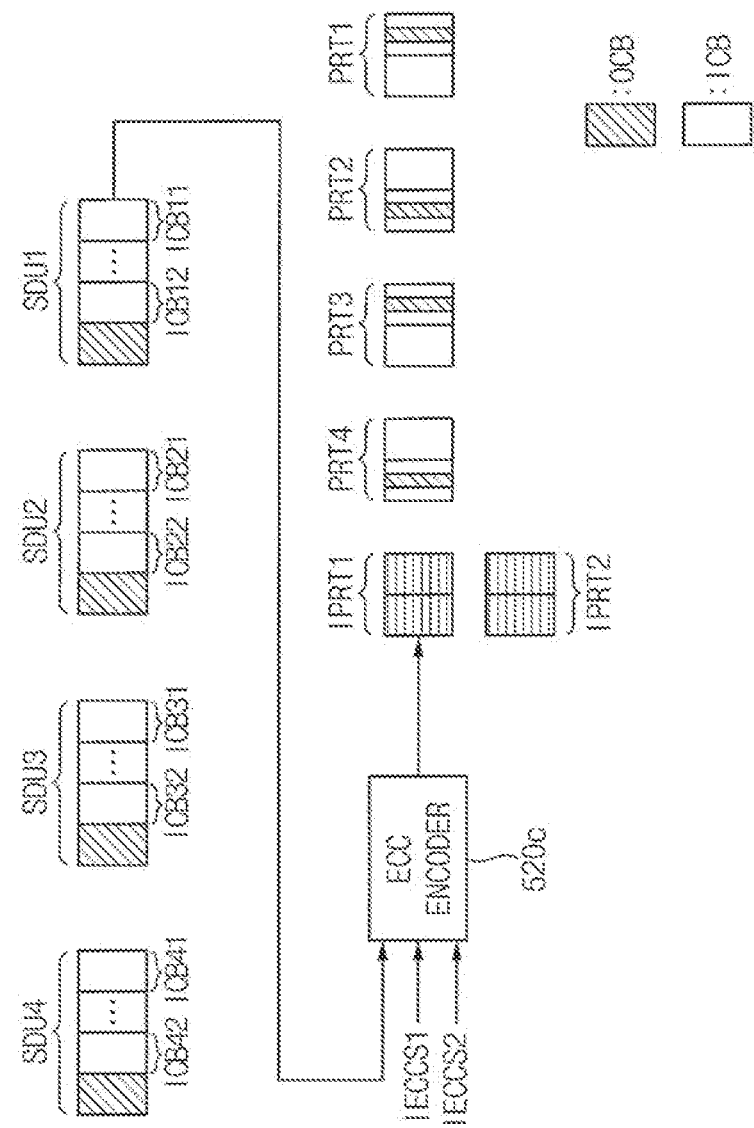
FIG. 33 illustrates an example in which the ECC encoder of the ECC engine in FIG. 27 performs the first ECC encoding operation on the plurality of sub data units sequentially.

FIG. 33 illustrates an example in which the ECC encoder 520c in FIG. 27 performs the first ECC encoding operation on the plurality of sub data units sequentially.

Referring to FIG. 33, the ECC encoder 520c may perform the first ECC encoding operation on each of the first through fourth sub data units SDU1, SDU2, SDU3 and SDU4 including the inner cell bits ICB respectively, to generate the first through fourth parity bits PRT1, PRT2, PRT3 and PRT4 sequentially. The first sub data unit SDU1 may at least include inner cell bits ICB11 and ICB12, the second sub data unit SDU2 may at least include inner cell bits ICB21 and ICB22, the third sub data unit SDU3 may at least include inner cell bits ICB31 and ICB32 and the fourth sub data unit SDU4 may at least include inner cell bits ICB41 and ICB42.

In addition, the ECC encoder 520c may generate a first inner ECC sector IECCS1 based on the inner cell bits ICB11, ICB21, ICB31 and ICB41 in the first through fourth sub data units SDU1, SDU2, SDU3 and SDU4 and may perform a second ECC decoding operation on the first inner ECC sector IECCS1 to generate the first inner parity bits IPRT1. The ECC encoder 520c may generate a second inner ECC sector IECCS2 based on the inner cell bits ICB12, ICB22, ICB32 and ICB42 in the first through fourth sub data units SDU1, SDU2, SDU3 and SDU4 and may perform a second ECC decoding operation on the second inner ECC sector IECCS2 to generate the second inner parity bits IPRT2.

In some example embodiments, the ECC encoder 520c may perform the second ECC encoding operation at least two times.

Figure 34:
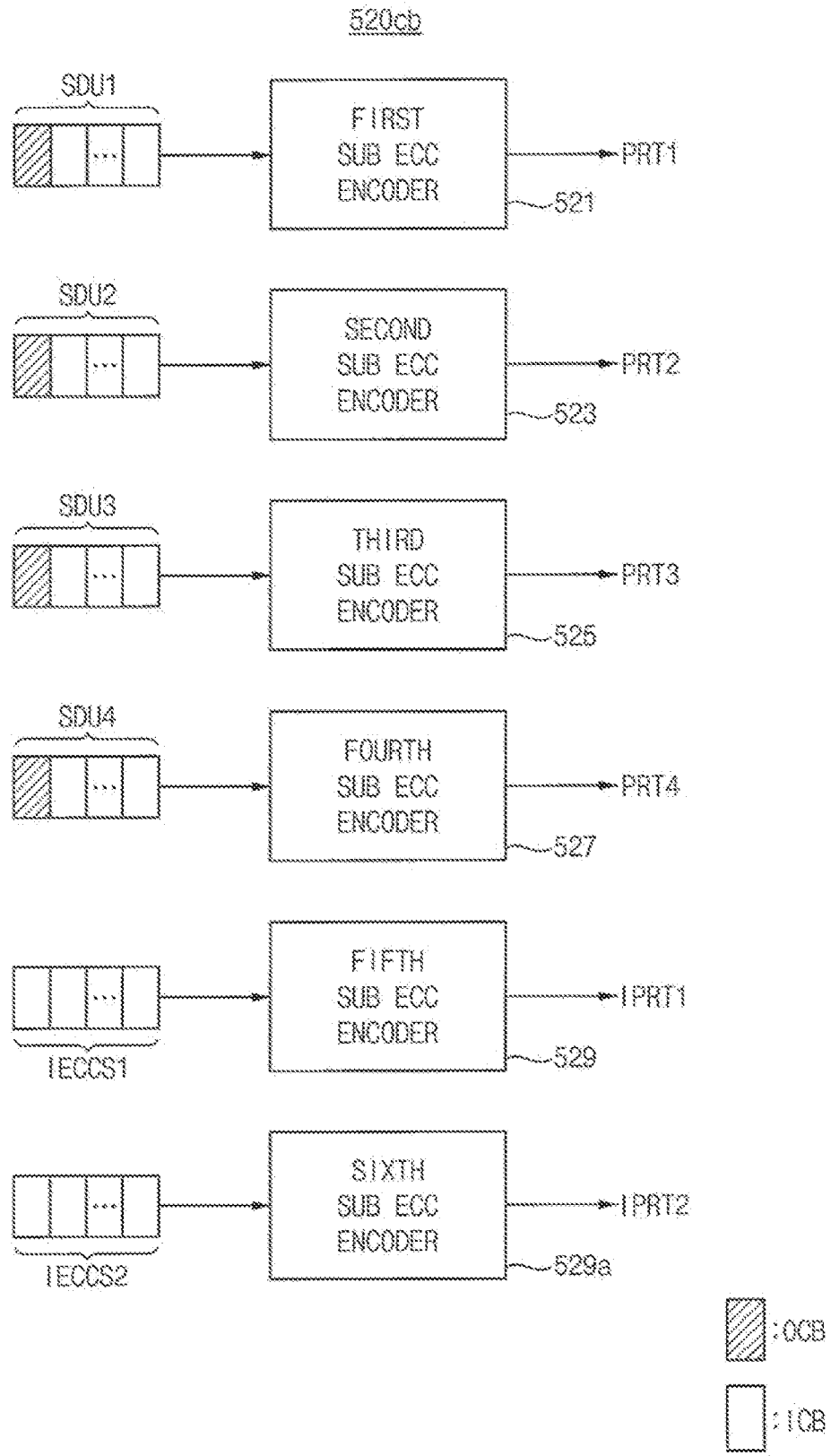
FIG. 34 illustrates an example in which the ECC encoder of the ECC engine in FIG. 27 performs the first ECC encoding operation on the plurality of sub data units and a second ECC encoding operation on inner ECC sectors in parallel.

FIG. 34 illustrates an example in which the ECC encoder 520c in FIG. 27 performs the first ECC encoding operation on the plurality of sub data units and the second ECC encoding operation on the inner ECC sectors in parallel.

Referring to FIG. 32, the ECC encoder 520c may be an ECC encoder 520cb. The ECC encoder 520cb may include a first sub ECC encoder 521, a second sub ECC encoder 523, a third sub ECC encoder 525, a fourth sub ECC encoder 527, a fifth sub ECC encoder 529, and a sixth sub ECC encoder 529a.

Each of the first through sixth sub ECC encoders 521, 523, 525, 527, 529 and 529a may be connected to the ECC 515 in FIG. 27. Each of the first through fourth sub ECC encoders 521, 523, 525 and 527 may perform the first ECC encoding operation on a respective one of the first through fourth sub data units SDU1, SDU2, SDU3 and SDU4 including the inner cell bits ICB respectively, in parallel to generate the first through fourth parity bits PRT1, PRT2, PRT3 and PRT4 in parallel.

The fifth sub ECC encoder 529 may perform the second ECC encoding operation on the first inner ECC sector IECCS1 including the first inner cell bits in the first through fourth sub data units SDU1, SDU2, SDU3 and SDU4 in parallel with the first ECC encoding operation to generate the first inner parity bits IPRT1. The sixth sub ECC encoder 529a may perform the second ECC encoding operation on the second inner ECC sector IECCS2 including the second inner cell bits in the first through fourth sub data units SDU1, SDU2, SDU3 and SDU4 in parallel with the first ECC encoding operation to generate the second inner parity bits IPRT2.

Figure 35:
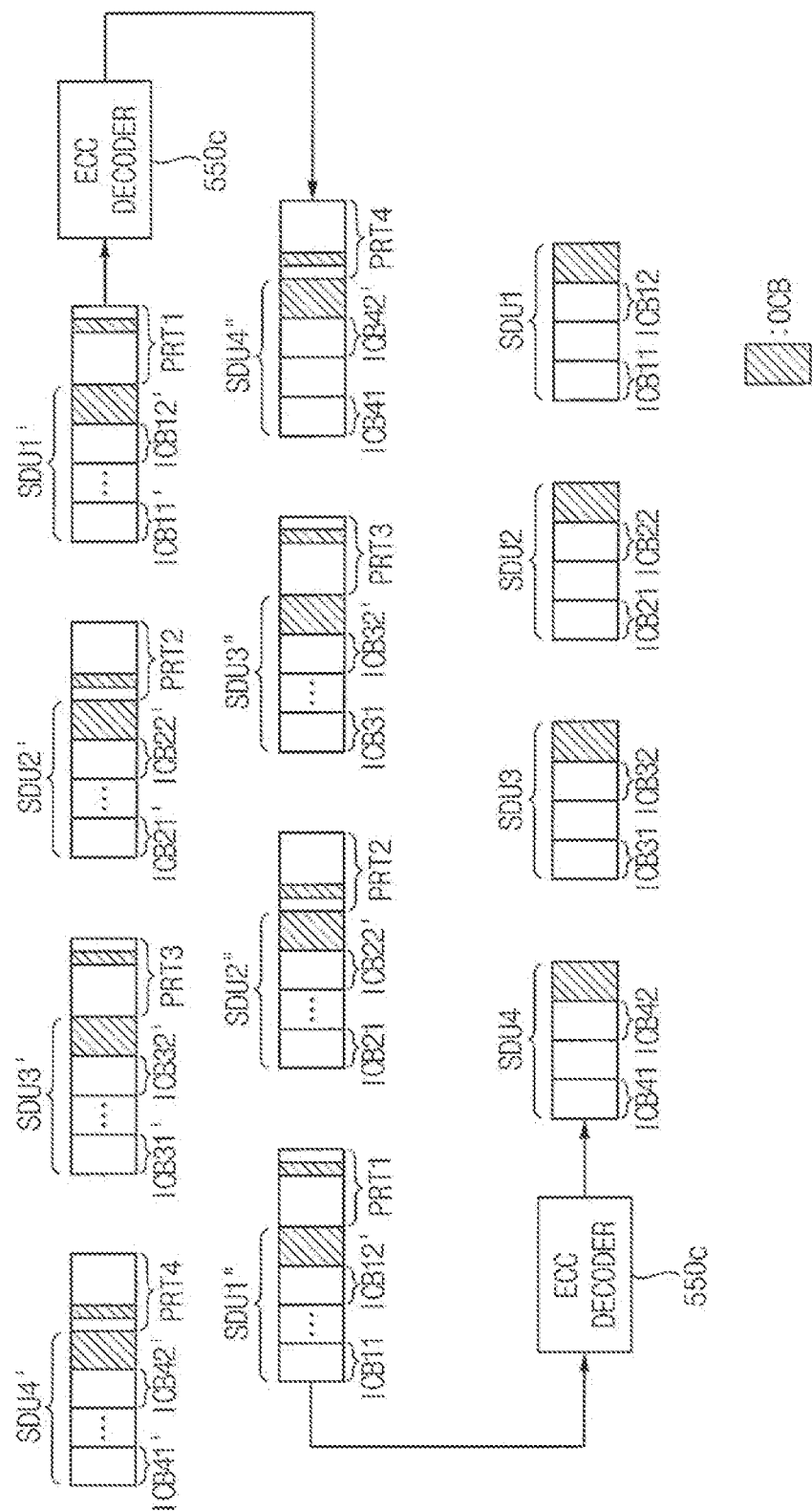
FIG. 35 illustrates an example operation of an ECC decoder of the ECC engine in FIG. 27 according to example embodiments.

FIG. 35 illustrates an example operation of the ECC decoder 520c in FIG. 27 according to example embodiments.

Referring to FIGS. 27 and 35, the ECC decoder 550c, using the ECC 515, may perform a first ECC decoding operation on the inner ECC sector associated with the first through fourth sub data units SDU1', SDU2', SDU3' and SDU4' which are read from the target page of the nonvolatile memory device 400a, based in the inner parity bits IPRT to correct a correctable error in the inner cell bits in each of the first through fourth sub data units SDU1', SDU2', SDU3' and SDU4' and may output first through fourth sub data units SDU1", SDU2", SDU3" and SDU4".

The first sub data unit SDU1' may include inner cell bits ICB11' and ICB12' corresponding to errors, the second sub data unit SDU2' may include inner cell bits ICB21' and ICB22' corresponding to errors, the third sub data unit SDU3' may include inner cell bits ICB31' and ICB32' corresponding to errors and the fourth sub data unit SDU4' may include inner cell bits ICB41' and ICB42' corresponding to errors.

After performing the first ECC decoding operation, the first sub data unit SDU1" may include a corrected inner cell bit ICB11 and an uncorrected inner cell bit ICB12', the second sub data unit SDU2" may include a corrected inner cell bit ICB21 and an uncorrected inner cell bit ICB22', the third sub data unit SDU3" may include a corrected inner cell bit ICB31 and an uncorrected inner cell bit ICB32' and the fourth sub data unit SDU4" may include a corrected inner cell bit ICB41 and an uncorrected inner cell bit ICB42'.

The ECC decoder 550c may perform a second ECC decoding operation on each of the first through fourth sub data units SDU1", SDU2", SDU3" and SDU4" based on a respective one of the first through fourth parity bits PRT1, PRT2, PRT3 and PRT4 to correct a correctable error in the inner cell bits in each of the first through fourth sub data units SDU1", SDU2", SDU3' and SDU4" and may output first through fourth sub data units SDU1, SDU2, SDU3 and SDU4.

Figure 36:
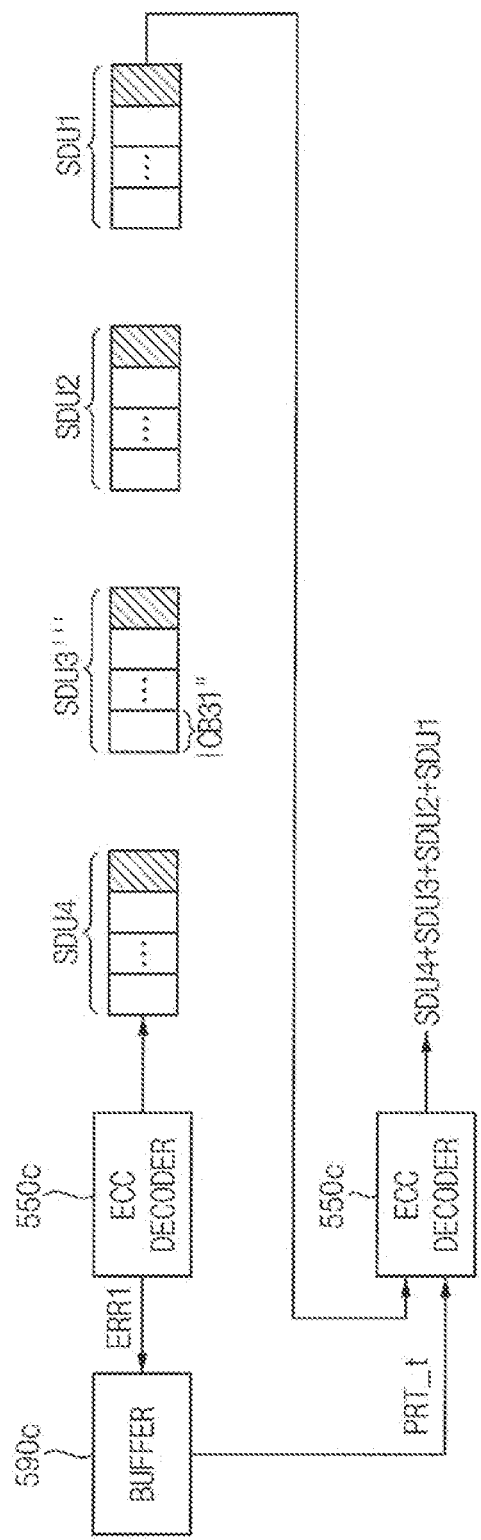
FIG. 36 illustrates an example in which the ECC decoder of the ECC engine in FIG. 27 performs a third ECC decoding operation.

FIG. 36 illustrates an example in which the ECC decoder 520c in FIG. 27 performs a third ECC decoding operation.

Referring to FIGS. 27 and 36, in response to detecting an uncorrectable error ICB31'" in a third sub data unit SDU3'" according to a result of the second ECC decoding operation, the ECC decoder 550c may provide the buffer 580c with the error flag ERR1 indicating that the uncorrectable error ICB31'" is detected in the third sub data unit SDU3'" and the buffer 590c may provide the ECC decoder 550c with the total parity bits PRT_t obtained by performing an ECC decoding operation on all of the first through fourth sub data units SDU1, SDU2, SDU3 and SDU4.

The ECC decoder 550c may perform a third ECC decoding operation on all of the first through fourth sub data units SDU1, SDU2, SDU3'" and SDU4 based on the total parity bits PRT_t to correct the uncorrectable error ICB31'" in the third sub data unit SDU3'" and may output the first through fourth sub data units SDU1, SDU2, SDU3 and SDU4.

Figure 37:
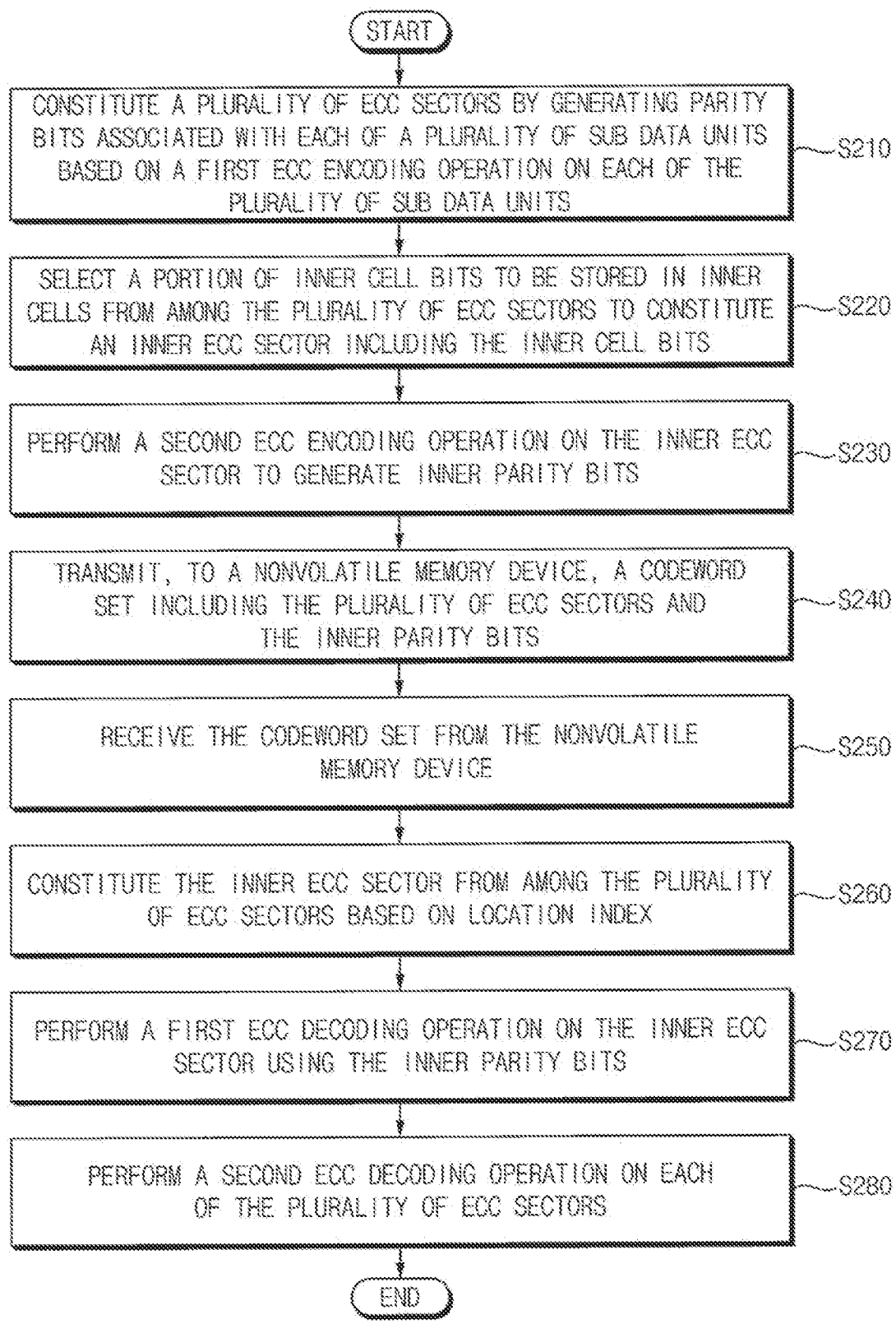
FIG. 37 is a flow chart illustrating a method of operating a storage device according to example embodiments.

FIG. 37 is a flow chart illustrating a method of operating a storage device 200 according to example embodiments.

Referring to FIGS. 3 and 27 through 37, there is provided a method of operating a storage device 200 including a nonvolatile memory device 400a which includes a memory cell array and a storage controller 300 to control the nonvolatile memory device 400a, where the memory cell array includes a plurality of word-lines stacked on a substrate, a plurality of memory cells provided in a plurality of channel holes extending in a vertical direction with respect to the substrate and a word-line cut region extending in a first horizontal direction and dividing the plurality of word-lines into a plurality of memory blocks.

According to the method, an ECC encoder 520c in the storage controller 300, in a write operation on target memory cells in a target page coupled to a target word-line from among the plurality of word-lines, performs a first encoding operation on each of a plurality of sub data units SDUi in a user data DTA to generate a plurality of ECC sectors ECCSi based on the plurality of sub data units SDUi and parity bits PRTi generated based on the first ECC decoding operation and associated with each of the plurality of sub data units SDUi (operation S210).

The ECC encoder 520c selects a portion of inner cell bits ICB to be stored in inner cells from among the target memory cells, from among the plurality of ECC sectors ECCSi to constitute an inner ECC sector IECCS including at least a portion of the outer cell bits ICB (operation S220) based on a location index LIDX grouping the plurality of memory cells coupled to each of the plurality of word-lines into the inner cells and outer cells according to a distance from the word-line cut region.

The ECC encoder 520c performs a second ECC encoding operation on the inner ECC sector IECCS to generate inner parity bits IPRT (operation S230).

A memory interface 370 in the storage controller 300 transmits, to the nonvolatile memory device 400a, a codeword set SCW including the plurality of ECC sectors ECCSi and the inner parity bits IPRT (operation S240).

The storage controller 300, in a read operation on the target page, receives a codeword set SCW including the plurality of ECC sectors ECCSi and the inner parity bits IPRT from the nonvolatile memory device 400a (operation S250).

A data selector 580c may constitute (or generate) the inner ECC sector IECCS from the plurality of ECC sectors ECCSi based on the location index LIDX (operation S260).

An ECC decoder 550c in the storage controller 300 performs a first ECC decoding operation on the inner ECC sector ECCSi based on the inner parity bits IPRT (operation S270) to correct correctable errors in the inner ECC sector ECCSi.

The ECC decoder 550c performs a second ECC decoding operation on each of the plurality of ECC sectors ECCSi (operation S280) on which a result of the first ECC decoding operation is reflected to correct an correctable error in each of the plurality of ECC sectors ECCSi.

Accordingly, in the storage device and a method of operating the storage device according to example embodiments, the storage controller groups memory cells in a target page into outer cells and inner cells based on a relative distance from a word-line cut region, and the ECC engine, in a first error correction mode, performs a first ECC encoding operation and a first ECC decoding operation on each of a plurality of sub data units in a user data, generates an outer ECC sector including outer cell bits to be stored in (or read from) the outer cells whose error occurrence probability is relatively high and performs a second ECC encoding operation and a second ECC decoding operation on the outer ECC sector to correct an error by the second ECC decoding operation, which is not correctable by the first ECC decoding operation.

In addition, the ECC engine, in a second error correction mode, generates an inner ECC sector including inner cell bits to be stored in (or read from) the inner cells whose error occurrence probability is relatively low and performs a first ECC decoding operation in the inner ECC sector and performs a second ECC decoding operation on each of the plurality of sub data units correct an error in each of the sub data units. Therefore, the ECC engine may enhance an error correction capability. In addition, because the ECC engine uses the same ECC in the first ECC encoding operation and the second ECC encoding operation and uses the same ECC in the first ECC decoding operation and the second ECC decoding operation, the ECC engine may not increase an occupied area.

Figure 38:
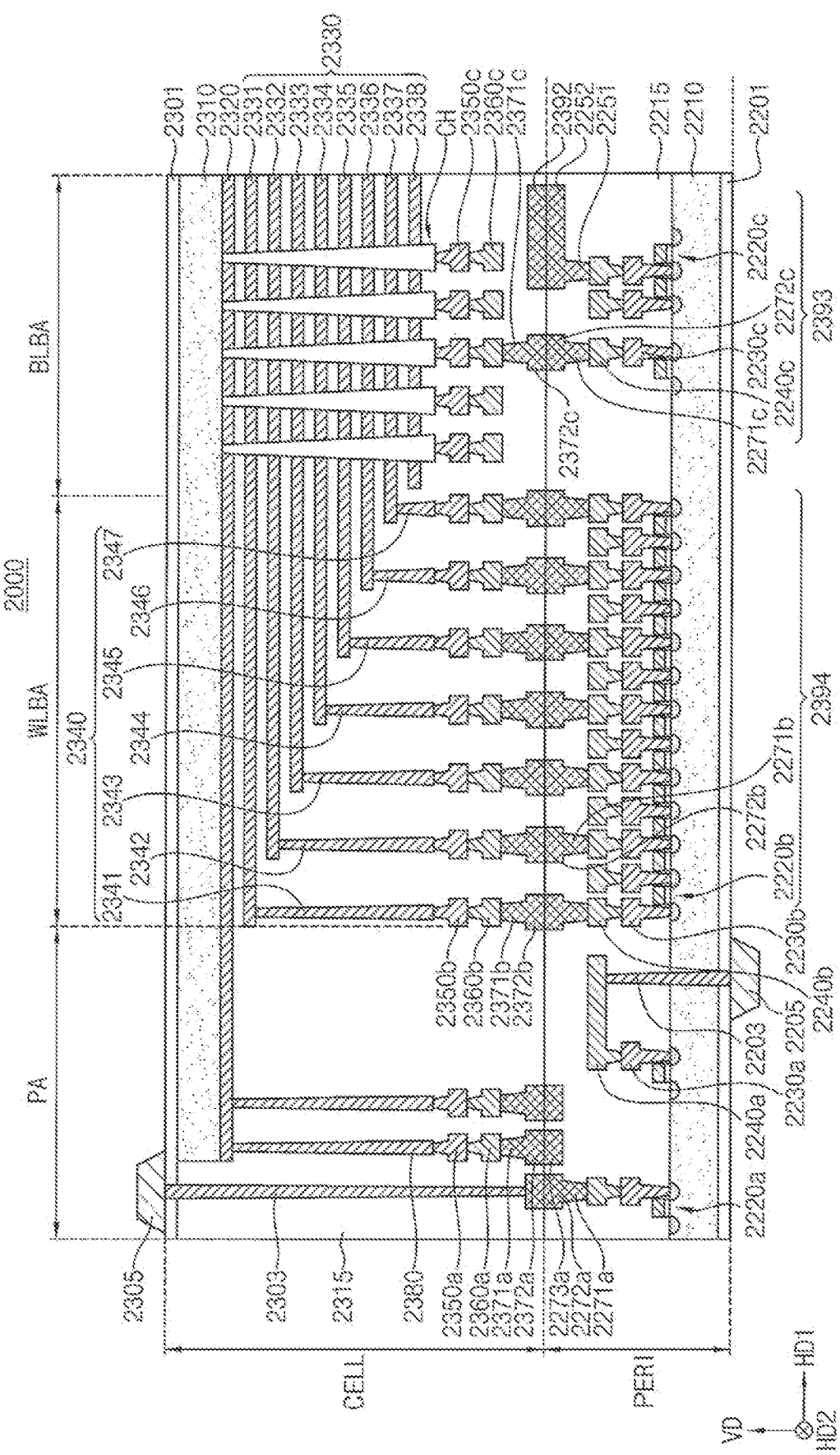
FIG. 38 is a cross-sectional view of a nonvolatile memory device according to example embodiments.

FIG. 38 is a cross-sectional view of a nonvolatile memory device according to example embodiments.

Referring to FIG. 38, a nonvolatile memory device 2000 (the nonvolatile memory device 2000 may be also referred to as a memory device) may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an example embodiment illustrated in FIG. 38, although only the first metal layers 2230a, 2230b, and 2230c and the second metal layers 2240a, 2240b, and 2240c are shown and described, the example embodiment is not limited thereto, and in some example embodiments, one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230*a*, 2230*b*, and 2230*c*, and the second metal layers 2240*a*, 2240*b*, and 2240*c*. The interlayer insulating layer 2215 may include an insulating material such as silicon oxide, silicon nitride, or the like.

Lower bonding metals 2271*b* and 2272*b* may be formed on the second metal layer 2240*b* in the word-line bonding area WLBA. In the word-line bonding area WLBA, the lower bonding metals 2271*b* and 2272*b* in the peripheral circuit region PERI may be electrically bonded to upper bonding metals 2371*b* and 2372*b* of the cell region CELL. The lower bonding metals 2271*b* and 2272*b* and the upper bonding metals 2371*b* and 2372*b* may be formed of aluminum, copper, tungsten, or the like. Further, the upper bonding metals 2371*b* and 2372*b* in the cell region CELL may be referred as first metal pads and the lower bonding metals 2271*b* and 2272*b* in the peripheral circuit region PERI may be referred as second metal pads.

The cell region CELL may include at least one memory block. The least one memory block may include a first region and a second region. The first region may store compensation data set and may correspond to SLC block. The cell region CELL may include a second substrate 2310 and a common source line 2320. On the second substrate 2310, a plurality of word-lines 2331, 2332, 2333, 2334, 2335, 2336, 2337, and 2338 (i.e., 2330) may be stacked in a vertical direction VD (e.g., a Z-axis direction), perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the vertical direction VD, perpendicular to the upper surface of the second substrate 2310, and pass through the plurality of word-lines 2330, the at least one string selection line, and the at least one ground selection line. The channel structure CH may include a data storage layer, a channel layer, a buried insulating layer, and the like, and the channel layer may be electrically connected to a first metal layer 2350*c* and a second metal layer 2360*c*. For example, the first metal layer 2350*c* may be a bit-line contact, and the second metal layer 2360*c* may be a bit-line. In an example embodiment, the bit-line 2360*c* may extend in a second horizontal direction HD2 (e.g., a Y-axis direction), parallel to the upper surface of the second substrate 2310.

In the example embodiment illustrated in FIG. 38, an area in which the channel structure CH, the bit-line 2360*c*, and the like are disposed may be defined as the bit-line bonding area BLBA. In the bit-line bonding area BLBA, the bit-line 2360*c* may be electrically connected to the circuit elements 2220*c* providing a page buffer 2393 in the peripheral circuit region PERI. The bit-line 2360*c* may be connected to upper bonding metals 2371*c* and 2372*c* in the cell region CELL, and the upper bonding metals 2371*c* and 2372*c* may be connected to lower bonding metals 2271*c* and 2272*c* connected to the circuit elements 2220*c* of the page buffer 2393.

In the word-line bonding area WLBA, the plurality of word-lines 2330 may extend in a first horizontal direction HD1 (e.g., an X-axis direction), parallel to the upper surface of the second substrate 2310 and perpendicular to the second horizontal direction HD2, and may be connected to a plurality of cell contact plugs 2341, 2342, 2343, 2344, 2345, 2346, and 2347 (i.e., 2340). The plurality of word-lines 2330 and the plurality of cell contact plugs 2340 may be connected to each other in pads provided by at least a portion of the plurality of word-lines 2330 extending in different lengths in the first horizontal direction HD1. A first metal layer 2350*b* and a second metal layer 2360*b* may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371*b* and 2372*b* of the cell region CELL and the lower bonding metals 2271*b* and 2272*b* of the peripheral circuit region PERI in the word-line bonding area WLBA.

The plurality of cell contact plugs 2340 may be electrically connected to the circuit elements 2220*b* forming an address decoder 2394 in the peripheral circuit region PERI. In an example embodiment, operating voltages of the circuit elements 2220*b* forming the address decoder 2394 may be different than operating voltages of the circuit elements 2220*c* forming the page buffer circuit 2393. For example, operating voltages of the circuit elements 2220*c* forming the page buffer circuit 2393 may be greater than operating voltages of the circuit elements 2220*b* forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350*a* and a second metal layer 2360*a* may be stacked on an upper portion of the common source line contact plug 2380, sequentially. For example, an area in which the common source line contact plug 2380, the first metal layer 2350*a*, and the second metal layer 2360*a* are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220*a*, 2220*b*, and 2220*c* disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310 and a second input/output pad 2305 may be disposed on the upper insulating layer 2301. The second input/output pad 2305 may be connected to at least one of the plurality of circuit elements 2220*a*, 2220*b*, and 2220*c* disposed in the peripheral circuit region PERI through a second input/output contact plug 2303. In the example embodiment, the second input/output pad 2305 is electrically connected to a circuit element 2220*a*.

According to various example embodiments, the second substrate 2310 and the common source line 2320 may not be disposed in an area in which the second input/output contact plug 2303 is disposed. Also, the second input/output pad 2305 may not overlap the word-lines 2330 in the vertical direction VD. The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to various example embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 200 may include both the first input/output pad 2205 and the second input/output pad 2305.

A metal pattern provided on an uppermost metal layer may be provided as a dummy pattern or the uppermost metal layer may be absent, in each of the external pad bonding area PA and the bit-line bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the external pad bonding area PA, the memory device 2000 may include lower bonding metals 2271a and 2271b connected to the lower metal pattern 2273a. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL. Similarly, in the external pad bonding area PA, an upper bonding metal 2371a may be formed and may be electrically connected to the upper metal pattern 2372a.

The lower bonding metals 2271b and 2272b may be formed on the second metal layer 2240b in the word-line bonding area WLBA. In the word-line bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bit-line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In some example embodiments, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The word-line voltages may be applied to at least one memory block in the cell region CELL through the lower bonding metals 2271b and 2272b in the peripheral circuit region PERI and upper bonding metals 2371b and 2372b of the cell region CELL.

Figure 39:
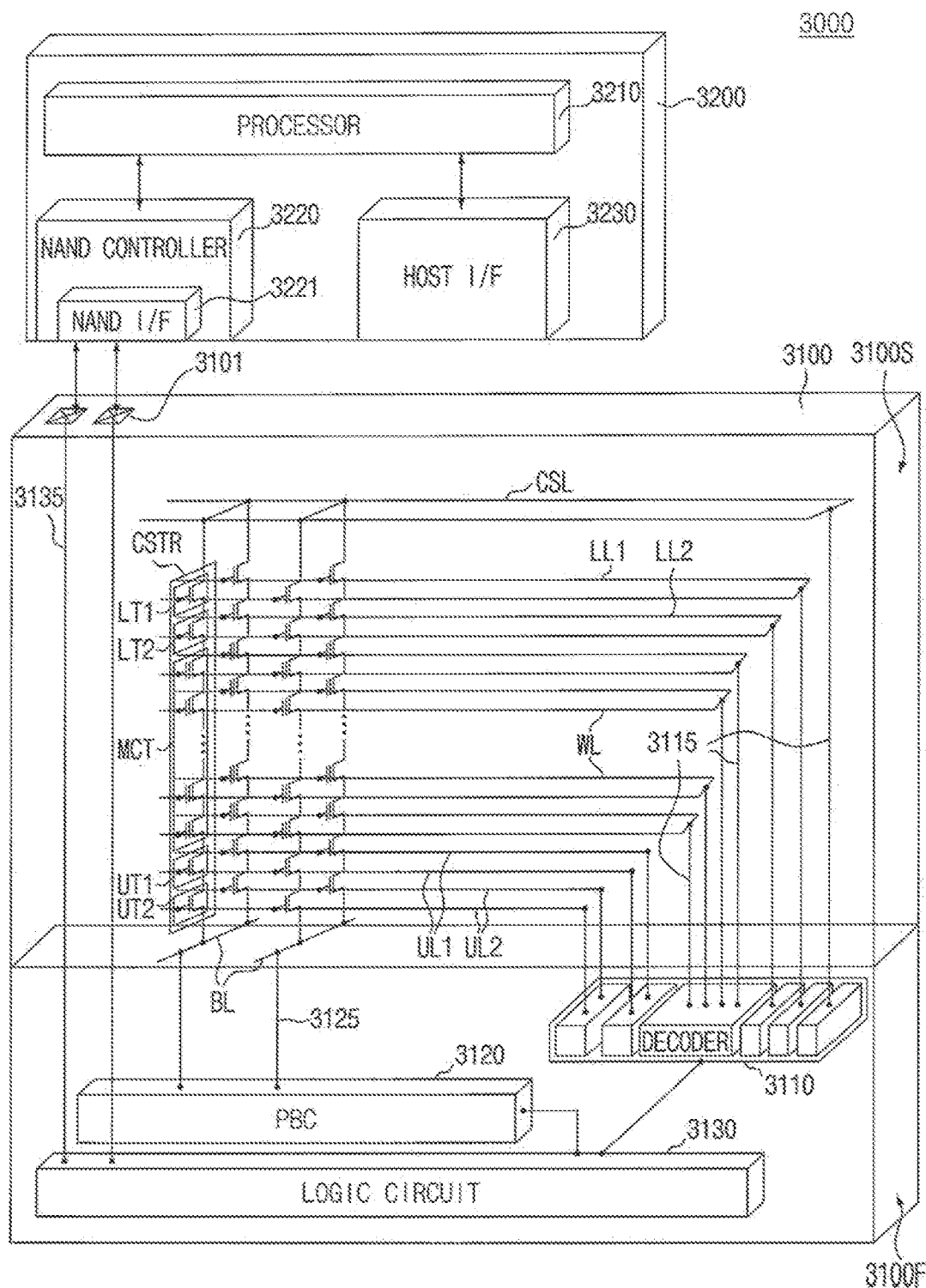
FIG. 39 is a block diagram illustrating an electronic system including a semiconductor device according to example embodiments.

FIG. 39 is a block diagram illustrating an electronic system including a semiconductor device according to example embodiments.

Referring to FIG. 39, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB), a computing system, a medical device, or a communication device that may include one or a plurality of semiconductor devices 3100.

In some embodiments, the semiconductor device 3100 may be a nonvolatile memory device, for example, a nonvolatile memory device 400a that is illustrated with reference to FIGS. 11 through 23. The semiconductor device 3100 may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may be a memory cell structure including a bit-line BL, a common source line CSL, word-lines WL, first and second upper gate lines UL1 and UL2, first and second lower gate lines LL1 and LL2, and memory cell strings CSTR between the bit line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In various example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In various example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 1115 extending to the second structure 3110S in the first structure 3100F. The bit-lines BL may be electrically connected to the page buffer circuit 3120 through second connection wirings 3125 extending to the second structure 3100S in the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S in the first structure 3100F.

The controller 3200 may include a processor 3210, a NAND controller 3220, and a host interface 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When control command is received from the outside host through the host interface 3230, the processor 3210 may control the semiconductor device 3100 in response to the control command.

A nonvolatile memory device or a storage device according to example embodiments may be packaged using various package types or package configurations.

The present disclosure may be applied to various electronic devices including a nonvolatile memory device. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of various example embodiments and is not to be construed as limiting thereof. Although a few example embodiments have been described, those skilled in the art will readily appreciate that many modifications are possible in the example embodiments without materially departing from their novel teachings and advantages. Accordingly, all such modifications are intended to be included within the scope of the appended claims.

What is claimed is:

1. A storage device comprising:
   a nonvolatile memory device including a memory cell array that includes a plurality of word-lines stacked on a substrate, wherein a plurality of memory cells that are provided in a plurality of channel holes extend in a vertical direction with respect to the substrate, and word-line cut regions extend in a first horizontal direction and divide the plurality of word-lines into a plurality of memory blocks; and
   a storage controller configured to control the nonvolatile memory device,
   wherein the storage controller includes an error correction code (ECC) engine, a data selector, and a memory interface,
   wherein the ECC engine includes an ECC encoder, and the ECC encoder, in a write operation on target memory cells in a target page coupled to a target word-line from among the plurality of word-lines, is configured to:
      ECC encode each of a plurality of sub data units in user data, each of the plurality of sub data units including outer cell bits and inner cell bits, the ECC encoding generating parity bits associated with each of the plurality of sub data units, and
      generate a plurality of ECC sectors, each including a respective one of the plurality of sub data units and the parity bits corresponding to the respective one of the plurality of sub data units,
   wherein the data selector is configured to, in the write operation, select the outer cell bits of each of the plurality of sub data units based on an error correction mode signal and a location index of each of the target memory cells that indicates a distance of the target memory cell from the target word-line to constitute an outer ECC sector that includes the outer cell bits, and provide the outer ECC sector to the ECC engine,
   wherein the ECC engine is configured to ECC encode the outer ECC sector to generate outer parity bits, and
   wherein the memory interface is configured to transmit the plurality of ECC sectors and the outer parity bits together as a codeword set to the nonvolatile memory device.

2. The storage device of claim 1, wherein,
   the storage controller is configured to group the target memory cells coupled to the target word-line into outer cells and into inner cells from among the target memory cells of the target page based on the location index of each of the target memory cells, a distance between each outer cell and a word-line cut region being less than a distance between each inner cell and the word-line cut region,
   an ECC sector corresponds to a unit of the ECC encoding,
   the error correction mode signal is associated with selecting the outer cell bits and with selecting inner cell bits to be stored in the inner cells, and
   the ECC encoder is configured to ECC encode the plurality of sub data units and to ECC encode the outer ECC sector using a same ECC.

3. The storage device of claim 1, wherein the ECC encoder is configured to ECC encode the plurality of sub data units and to ECC encode the outer ECC sector in parallel.

4. The storage device of claim 1, wherein the storage controller further comprises an ECC decoder,
   wherein, in a read operation on the target memory cells in the target page, the ECC decoder is configured to:
      receive the codeword set including the plurality of ECC sectors and the outer parity bits from the nonvolatile memory device,
      constitute the outer ECC sector from among the plurality of ECC sectors based on the location index,
      perform a first ECC decoding operation on each of the plurality of ECC sectors, and
      selectively perform a second ECC decoding operation on the outer ECC sector using the outer parity bits, based on a result of the first ECC decoding operation, and
   wherein the storage controller is configured to group the target memory cells coupled to the target word-line into outer cells and inner cells based on the location index of each of the target memory cells, a distance between each outer cell and a word-line cut region being less than a distance between each inner cell and the word-line cut region.

5. The storage device of claim 4, wherein:
the outer ECC sector includes data bits and parity bits read from the outer cells, and
the ECC decoder is configured to perform the first ECC decoding operation on the plurality of ECC sectors sequentially and configured to perform the second ECC decoding operation on the outer ECC sector using the outer parity bits in response to detecting at least one uncorrectable error in at least one of the plurality of ECC sectors.

6. The storage device of claim 4, wherein:
the data selector, in the read operation, is further configured to select the outer ECC sector from among the plurality of ECC sectors based on an error flag from the ECC decoder to provide the outer ECC sector to the ECC decoder, and
the error flag indicates that at least one uncorrectable error is detected in at least one of the plurality of ECC sectors based on the result of the first ECC decoding operation.

7. A storage device comprising:
a nonvolatile memory device including a memory cell array that includes a plurality of word-lines stacked on a substrate, wherein a plurality of memory cells that are provided in a plurality of channel holes extend in a vertical direction with respect to the substrate, and word-line cut regions extend in a first horizontal direction and divide the plurality of word-lines into a plurality of memory blocks; and
a storage controller configured to control the nonvolatile memory device,
wherein the storage controller includes an error correction code (ECC) engine and a memory interface,
wherein the ECC engine includes an ECC encoder and a data selector, and the data selector, in a write operation on target memory cells in a target page coupled to a target word-line from among the plurality of word-lines, is configured to:
select outer cell bits from a plurality of sub data units in a user data, each of the plurality of sub data units including outer cell bits and inner cell bits, the outer cell bits being selected based on an error correction mode signal and a location index of each of the target memory cells that indicates a distance of the target memory cell from the target word-line, to constitute an outer ECC sector including the outer cell bits, and to provide the outer ECC sector to the ECC encoder; and
wherein the ECC encoder, in the write operation, is configured to:
ECC encode the outer cell bits of the outer ECC sector to generate outer parity bits; and
ECC encode each of the plurality of sub data units to generate parity bits associated with each of the plurality of sub data units and generate a plurality of ECC sectors, each including a respective one of the plurality of sub data units and the parity bits corresponding to the respective one of the plurality of sub data units;
wherein the memory interface is configured to transmit the plurality of ECC sectors and the outer parity bits together in a codeword set to the nonvolatile memory device, and
wherein the storage controller is configured to group the plurality of memory cells in the target page that are coupled to each of the plurality of word-lines into outer cells and inner cells according to a distance from a word-line cut region based on the location index of each of the plurality of memory cells.

8. The storage device of claim 7, wherein:
an ECC sector corresponds to a unit of the ECC encoding,
a distance between each outer cell and the word-line cut region is less than a distance between each inner cell and the word-line cut region,
the error correction mode signal is associated with selecting the outer cell bits, and selecting the inner cell bits to be stored in the inner cells, and
the ECC encoder is configured to ECC encode the outer cell bits and to ECC encode the plurality of sub data units using a same ECC.

9. The storage device of claim 7, wherein the ECC engine further includes an ECC decoder and, in a read operation on the target memory cells in the target page, the ECC decoder is configured to:
receive the codeword set including the plurality of ECC sectors and the outer parity bits from the nonvolatile memory device,
constitute the outer ECC sector from among the plurality of ECC sectors based on the location index,
perform a first ECC decoding operation on each of the plurality of ECC sectors, and
perform a second ECC decoding operation on the outer ECC sector using the outer parity bits.

10. The storage device of claim 9, wherein:
the ECC decoder is configured to perform the first ECC decoding operation on the plurality of ECC sectors sequentially, and
the ECC decoder is configured to perform the first ECC decoding operation and the second ECC decoding operation using a same ECC.

11. The storage device of claim 9,
wherein the data selector, in the read operation, is further configured to select the outer ECC sector from among the plurality of ECC sectors based the location index and to provide the outer ECC sector to the ECC decoder.

12. A storage device comprising:
a nonvolatile memory device including a memory cell array that includes a plurality of word-lines stacked on a substrate, wherein a plurality of memory cells that are provided in a plurality of channel holes extend in a vertical direction with respect to the substrate, and word-line cut regions extend in a first horizontal direction and divide the plurality of word-lines into a plurality of memory blocks; and
a storage controller configured to control the nonvolatile memory device,
wherein the storage controller includes an error correction code (ECC) engine, a data selector, and a memory interface,
wherein the ECC engine includes an ECC encoder and, the ECC encoder, in a write operation on target memory cells in a target page coupled to a target word-line from among the plurality of word-lines, is configured to:
ECC encode each of a plurality of sub data units in user data to generate parity bits associated with each of the plurality of sub data units, each of the plurality of sub data units including outer cell bits and inner cell bits, and generate a plurality of ECC sectors, each including a respective one of the plurality of sub data units and the parity bits corresponding to the respective one of the plurality of sub data units;

wherein the data selector is configured to, in the write operation, select inner cell bits, from each of the plurality of sub data units based on an error correction mode signal and a location index of each of the target memory cells that indicates a relative distance of the target memory cell from the target word-line, to constitute an inner ECC sector including the inner cell bits, and provide the inner ECC sector to the ECC engine;

wherein the ECC engine is configured to ECC encode the inner ECC sector to generate inner parity bits; and wherein the memory interface is configured to transmit the plurality of ECC sectors and the inner parity bits together as a codeword set to the nonvolatile memory device.

13. The storage device of claim 12, wherein:

the location index is for grouping the plurality of memory cells coupled to each of the plurality of word-lines in the target page into inner cells and outer cells according to the relative distance from a word-line cut region, an ECC sector corresponds to a unit of the ECC encoding, a distance between each inner cell and the word-line cut region is greater than a distance between each outer cell and the word-line cut region, the error correction mode signal is associated with selecting the inner cell bits, and with selecting the outer cell bits to be stored in the outer cells, an error occurrence probability of the inner cell bits is less than an error occurrence probability of the outer cell bits, and the ECC encoder is configured to ECC encode the plurality of sub data units and to ECC encode the inner ECC sector using a same ECC.

14. The storage device of claim 12, wherein the data selector is configured to:
select first inner cell bits associated a first location index from among inner cells to constitute a first inner ECC sector, and
select second inner cell bits associated a second location index from among the inner cells to constitute a second inner ECC sector, and wherein the ECC encoder is configured to:
ECC encode the first inner ECC sector to generate first inner parity bits, and
ECC encode the second inner ECC sector to generate second inner parity bits.

15. The storage device of claim 14, wherein the ECC encoder is configured to perform sequentially the ECC encoding on each of the plurality of sub data units and the ECC encoding on each of the first inner ECC sector and the second inner ECC sector.

16. The storage device of claim 14, wherein the ECC encoder is configured to ECC encode the plurality of sub data units and to ECC encode the first inner ECC sector and the second inner ECC sector in parallel.

17. The storage device of claim 12, wherein the ECC engine further includes:

an ECC decoder and, in a read operation on the target memory cells in the target page, the ECC decoder is configured to:
receive the codeword set including the plurality of ECC sectors and the inner parity bits from the nonvolatile memory device,
constitute the inner ECC sector from among the plurality of ECC sectors based on the location index,
perform a first ECC decoding operation on the inner ECC sector based on the inner parity bits to correct a correctable error in the inner ECC sector, and
perform a second ECC decoding operation on each of the plurality of ECC sectors to correct a correctable error in each of the plurality of ECC sectors, wherein the location index is for grouping the plurality of memory cells coupled to each of the plurality of word-lines into inner cells and outer cells according to the relative distance from a word-line cut region, and wherein an error occurrence probability of the inner cell bits is less than an error occurrence probability of the outer cell bits.

18. The storage device of claim 12, wherein the ECC engine further includes:

an ECC decoder and, in a read operation on the target memory cells in the target page, the ECC decoder is configured to:
receive the codeword set including the plurality of ECC sectors and the inner parity bits from the nonvolatile memory device,
constitute the inner ECC sector from among the plurality of ECC sectors based on the location index,
perform a first ECC decoding operation on the inner ECC sector based on the inner parity bits to correct a correctable error in the inner ECC sector, and
perform a second ECC decoding operation on a portion of the plurality of ECC sectors to correct at least one correctable error in the portion of the plurality of ECC sectors, wherein the ECC decoder is configured to perform a third ECC decoding operation on all of the plurality of ECC sectors in response to detecting at least one uncorrectable error in the portion of the plurality of ECC sectors, wherein the location index is for grouping the plurality of memory cells coupled to each of the plurality of word-lines into inner cells and outer cells according to the relative distance from a word-line cut region, and wherein an error occurrence probability of the inner cell bits is less than an error occurrence probability of the outer cell bits.

19. The storage device of claim 18, wherein:

a unit of the first ECC decoding operation is the same as a unit of the second ECC decoding operation, and a unit of the third ECC decoding operation is greater than the unit of the second ECC decoding operation.

* * * * *